United States Patent
Dagher

(10) Patent No.: US 10,145,925 B2
(45) Date of Patent: Dec. 4, 2018

(54) MRI WITH RECONSTRUCTION OF MR PHASE IMAGE

(71) Applicant: The Arizona Board of Regents on Behalf of the University of Arizona, Tucson, AZ (US)

(72) Inventor: Joseph Dagher, Tucson, AZ (US)

(73) Assignee: THE ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 204 days.

(21) Appl. No.: 15/309,337

(22) PCT Filed: May 7, 2015

(86) PCT No.: PCT/US2015/029778
§ 371 (c)(1),
(2) Date: Nov. 7, 2016

(87) PCT Pub. No.: WO2015/171949
PCT Pub. Date: Nov. 12, 2015

(65) Prior Publication Data
US 2017/0059682 A1   Mar. 2, 2017

Related U.S. Application Data

(60) Provisional application No. 61/990,622, filed on May 8, 2014, provisional application No. 62/060,482, filed
(Continued)

(51) Int. Cl.
*G01R 33/563* (2006.01)
*G01R 33/24* (2006.01)
(Continued)

(52) U.S. Cl.
CPC ..... *G01R 33/56316* (2013.01); *G01R 33/243* (2013.01); *G01R 33/4804* (2013.01);
(Continued)

(58) Field of Classification Search
CPC .......... G06K 7/10465; G06K 7/10356; G06K 7/10336; G06K 7/10346; G01N 27/72
(Continued)

(56) References Cited

U.S. PATENT DOCUMENTS

| 4,720,679 A | 1/1988 | Patrick et al. |
| 5,218,299 A | 6/1993 | Dunkel |

(Continued)

FOREIGN PATENT DOCUMENTS

| WO | WO 2004102173 A2 | 11/2004 |
| WO | WO 2012129585 A1 | 10/2012 |

(Continued)

OTHER PUBLICATIONS

International Search Report and Written Opinion as dated Apr. 10, 2014 for International Application No. PCT/US2013/074085, 5 pages.

(Continued)

*Primary Examiner* — Giovanni Astacio-Oquendo
(74) *Attorney, Agent, or Firm* — Quarles & Brady LLP

(57) ABSTRACT

A method for magnetic resonance (MR) phase imaging of a subject includes: (i) for each channel of a multi-channel MRI scanner, acquiring MR measurements at a plurality of voxels of the subject using a pulse sequence that reduces MR measurement phase error; and (ii) for each voxel, determining reconstructed MR phase from the MR measurements of each channel to form an MR phase image of the subject. The step of determining reconstructed MR phase may be performed for each of the voxels independently.

22 Claims, 36 Drawing Sheets

Related U.S. Application Data on Oct. 6, 2014, provisional application No. 62/155,381, filed on Apr. 30, 2015.

(51) Int. Cl.
  *G01R 33/48* (2006.01)
  *G01R 33/56* (2006.01)
  *G01R 33/561* (2006.01)
  *G01R 33/565* (2006.01)

(52) U.S. Cl.
  CPC ......... *G01R 33/56* (2013.01); *G01R 33/5608* (2013.01); *G01R 33/5611* (2013.01); *G01R 33/56366* (2013.01); *G01R 33/56545* (2013.01)

(58) Field of Classification Search
  USPC ............... 324/200, 207.3, 244, 253, 254
  See application file for complete search history.

(56) References Cited

U.S. PATENT DOCUMENTS

| | | | | |
|---|---|---|---|---|
| 9,991,716 | B2* | 6/2018 | Cutright | G05B 19/048 |
| 9,992,855 | B2* | 6/2018 | Larroux | H05G 1/58 |
| 2010/0283463 | A1 | 11/2010 | Lu et al. | |
| 2014/0375318 | A1 | 12/2014 | Dagher et al. | |
| 2015/0362570 | A1* | 12/2015 | Sakakura | A61B 5/055 324/319 |
| 2015/0369896 | A1 | 12/2015 | Dagher et al. | |
| 2016/0025830 | A1* | 1/2016 | Roland | A61B 5/4312 324/309 |
| 2016/0089029 | A1* | 3/2016 | Biber | A61B 5/004 600/422 |
| 2017/0319097 | A1* | 11/2017 | Amthor | A61B 5/055 |

FOREIGN PATENT DOCUMENTS

| | | |
|---|---|---|
| WO | 2013110062 A1 | 7/2013 |
| WO | 2014093320 A1 | 6/2014 |

OTHER PUBLICATIONS

Rodriguez et al., Phase Ambiguity Correction and Visualization Techniques for Complex-Valued ICA of Group fMRI Data, Pattern Reconit, Jun. 2012 145(6): 2050-2063, abstract, introduction, 29 pages.

Dagher, et al., A Framework for MR Phase Reconstruction From Multi-Channel RF Coils, Proc. Intl. Soc. Mag. Reson. Med., 2014, 22:3263.

Dagher, et al., High Resolution, Large Dynamic Range Field Map Estimation, Magnetic Resonance in Medicine, 2014, 71(1):105-117.

Dagher, et al., MAGPI: A Framework for Maximum Likelihood MR Phase Imaging Using Multiple Receive Coils, Magnetic Resonance in Medicine, 2016, 75(3):1218-1231.

Lotz, et al., Cardiovascular Flow Measurement with Phase-Contrast MR Imaging: Basic Facts and Implementation, RadioGraphics, 2002, 22:651-671.

Nguyen, et al., Joint Estimation and Correction of Geometric Distortions for EPI Functional MRI Using Harmonic Retrieval, IEEE Transactions on Medical Imaging, 2009, 28(3):423-434.

Schweser, et al., Quantitative Imaging of Intrinsic Magnetic Tissue Properties Using MRI Signal Phase: An Approach to In Vivo Brain Iron Metabolism?, NeuroImage, 2011, 54:2789-2807.

Schweser, et al., Quantitative Susceptibility Mapping for Investigating Subtle Susceptibility Variations in the Human Brain, NeuroImage, 2012, 62:2083-2100.

PCT International Search Report, PCT/US2015/029778, dated Aug. 20, 2015.

PCT Written Opinion, PCT/US2015/029778, dated Aug. 20, 2015.

\* cited by examiner

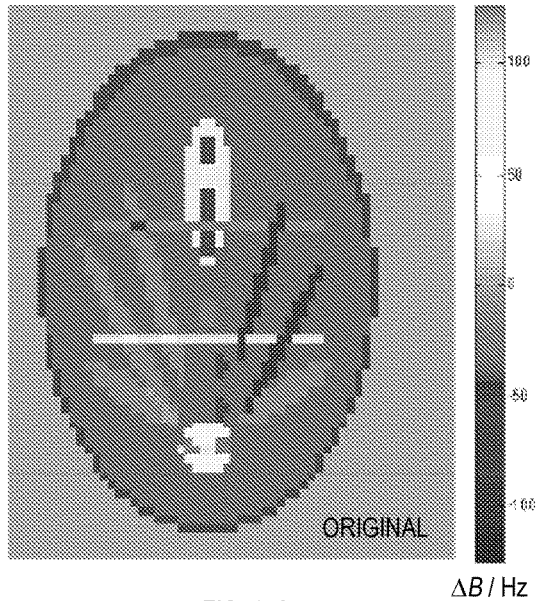
FIG. 15A
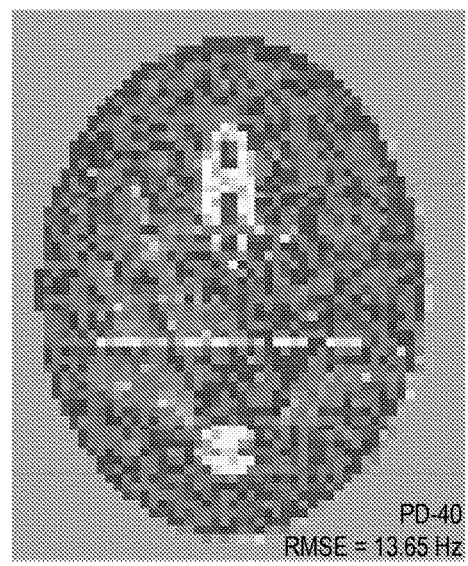
FIG. 15B
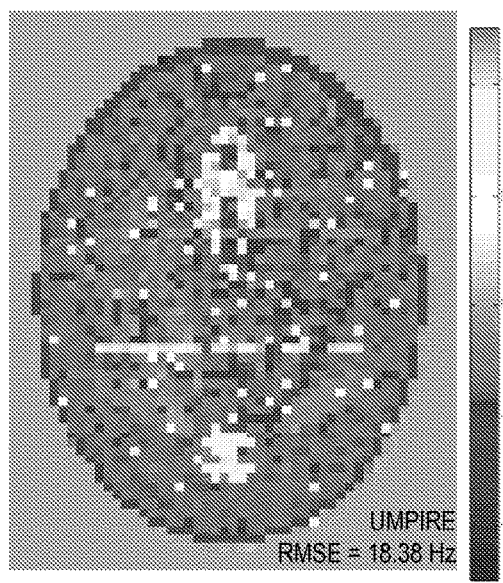
FIG. 15C
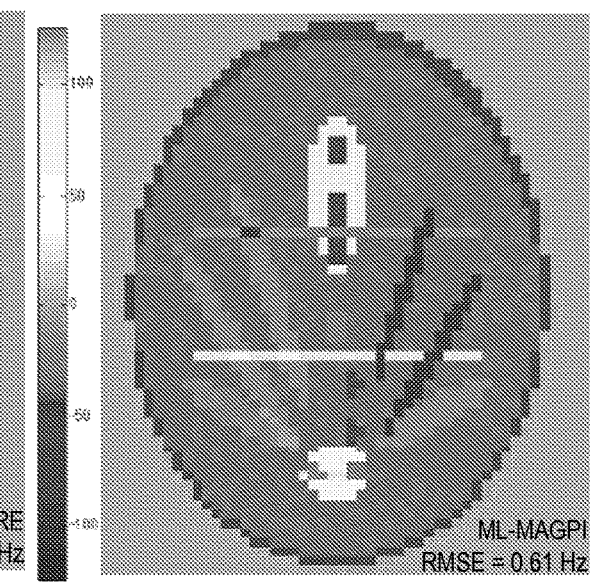
FIG. 15D
FIG. 15

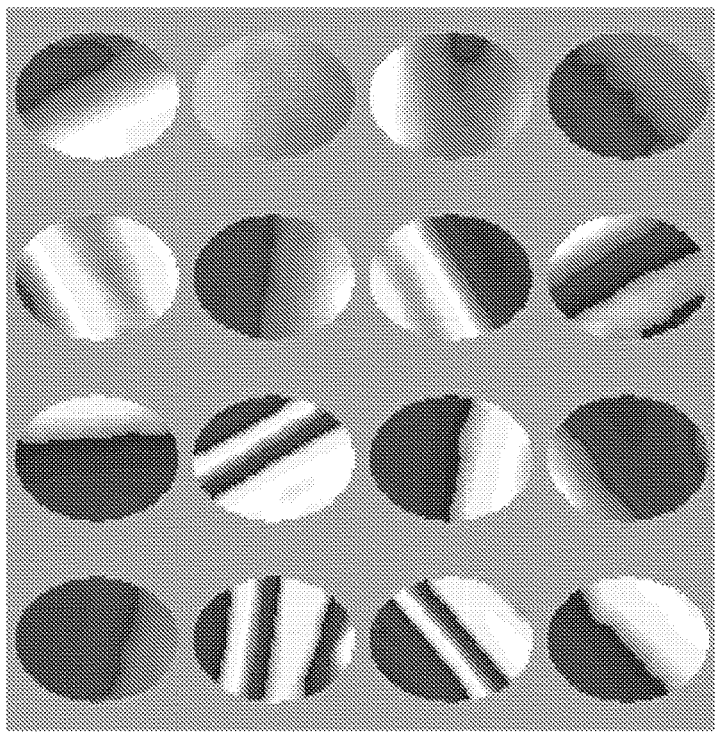
FIG. 16A
$\phi_{0,c}$ RADIANS
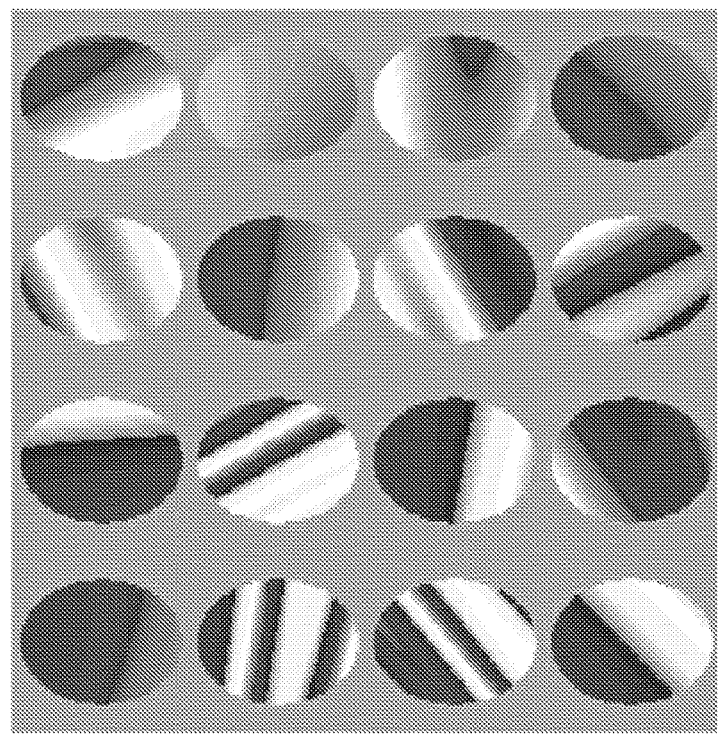
FIG. 16B
ML-MAGPI $\hat{\phi}_{0,c}$
FIG. 16

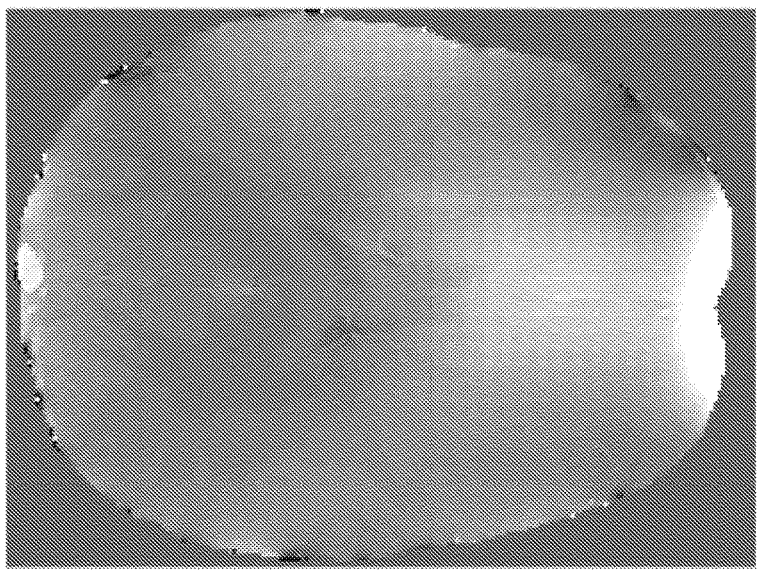
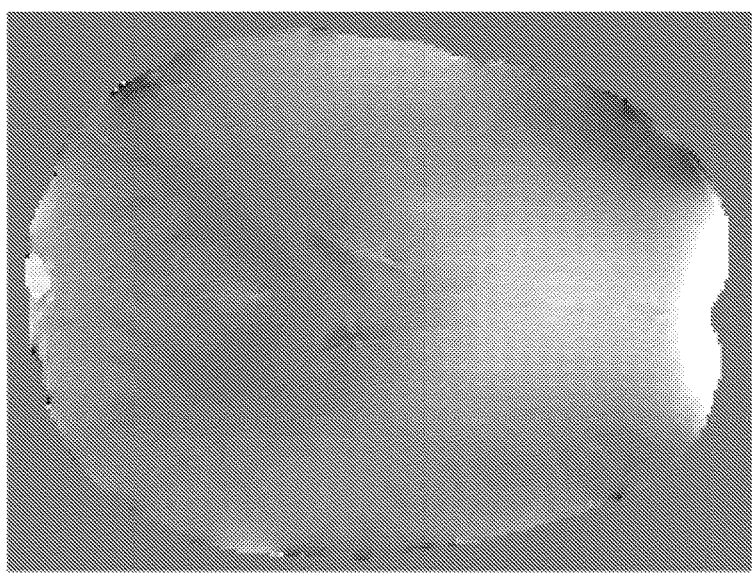
FIG. 23

MRI WITH RECONSTRUCTION OF MR PHASE IMAGE

CROSS-REFERENCE TO RELATED APPLICATIONS

This application is a 371 application of PCT/US2015/029778 filed May 7, 2015, which claims the benefit of priority of U.S. Patent Application Ser. No. 61/990,622, file May 8, 2014, U.S. Patent Application Ser. No. 62/060,482, filed Oct. 6, 2014, and U.S. Patent Application Ser. No. 62/155,381, filed Apr. 30, 2015, all of which are incorporated by reference herein in their entireties.

U.S. GOVERNMENT RIGHTS

This invention was made with government support under Grant No. K25 EB018355 awarded by NIH. The government has certain rights in the invention.

BACKGROUND

Quantitation using the magnitude of the reconstructed magnetic resonance (MR) image is the predominant practice in various clinical applications. Recently, the phase of the MR signal has demonstrated its promise in expanding the quantitative capability of magnetic resonance imaging (MRI). For example, the phase signal has been directly linked with Electro-Magnetic (EM) properties of tissues (such as susceptibility and conductivity), tissue temperature, venous oxygenation, blood velocity, and tissue elasticity, among others, as described in References [1-6] listed herein before the Claims section. The MR phase has also been extensively used for "fieldmap estimation" in the neuroimaging community to calculate and correct for the inhomogeneity of the static field, as described in Refs. [7-11]. Reference [7], "Highresolution, large dynamic range field map estimation," *Magnetic Resonance in Medicine.* 2014 January; 71(1):105-17, by Dagher and Bilgin is incorporated herein by reference in its entirety.

Combining MR phase images from multiple receiver coils is a challenging problem, complicated by MR phase measurement errors that hinder accurate determination of MR signal phase. These MR phase measurement errors are introduced by phase wrapping, noise and the unknown phase-offset between the receiver coils of the MRI scanner. Various techniques have been proposed to mitigate the effect of these MR phase measurement errors but most of the existing methods require additional reference scans and/or use ad-hoc post-processing techniques that do not guarantee optimality.

SUMMARY

In an embodiment, a method for MR phase imaging of a subject is disclosed. The method includes: (i) for each channel of a multi-channel MRI scanner, acquiring MR measurements at a plurality of voxels of the subject using a pulse sequence that reduces MR measurement phase error; and (ii) for each of the voxels, determining reconstructed MR phase from the MR measurements of each channel to form an MR phase image of the subject. The step of determining reconstructed MR phase may be performed for each of the voxels independently.

In an embodiment, an MRI system for forming a magnetic resonance (MR) phase image of a subject is disclosed. The MRI system includes a plurality of receiver channels for acquiring MR measurements, at least one magnet for generating a magnetic field at the subject, at least one transmitter for producing a radio frequency (RF) signal that excites nuclear magnetic resonances within a plurality of voxels of the subject, a processor, and a non-volatile memory. The non-volatile memory incudes pulse sequence parameters that reduce MR measurement phase error, and machine-readable instructions. When executed by the processor, the machine-readable instructions (i) acquire, for each of the receiver channels, the MR measurements at the voxels according to the pulse sequence parameters, and (ii) determine, for each of the voxels, a reconstructed MR phase from the MR measurements of each of the receiver channels to form the MR phase image. In an embodiment, the MRI system also includes a pulse programmer for determining the RF signal according to the pulse sequence parameters.

BRIEF DESCRIPTION OF THE FIGURES

FIGS. 15A-D show exemplary tissue frequency maps computed with different MR phase estimators.

FIGS. 16A and 16B show exemplary channel dependent phase offsets of the simulated data set of FIG. 15A and corresponding ML-MAGPI estimates.

FIGS. 23A and 23B show exemplary tissue frequency ΔB (x, y) obtained with the monopolar echoes and bipolar echoes, resulting from the method of FIG. 22.

DETAILED DESCRIPTION

Figure 1:
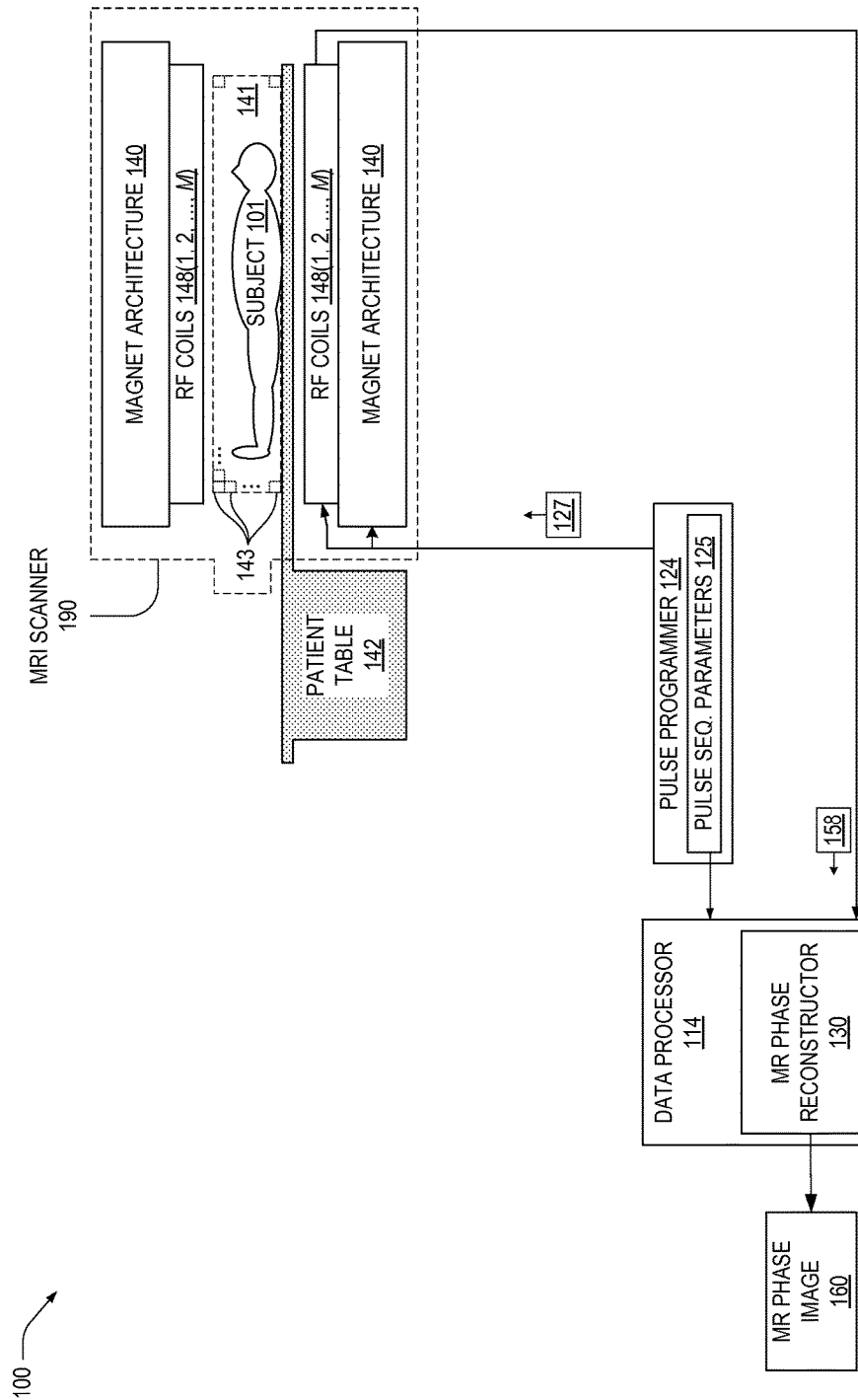
FIG. 1 is a functional block diagram of one MRI system, in an embodiment.

FIG. 1 is a functional block diagram of one exemplary magnetic resonance imaging (MRI) system 100 for forming an MR phase image 160 of a subject 101. System 100 measures an MR signal that includes magnitude and a phase. The phase includes a tissue phase that is proportional to the tissue frequency ΔB (x, y) associated with subject 101 at measurement location (x, y). The tissue frequency term ΔB (x, y) accounts for all deviations in the main magnetic field at location (x, y) due to the presence of subject 101. System 100 forms MR phase image 160 of the tissue phase or the tissue frequency.

System 100 includes an MRI scanner 190 and utilizes a pulse sequence that minimizes or reduces phase error in MR phase image 160. MRI scanner 190 includes a magnet architecture 140 and a plurality of RF coils 148(1, . . ., M). Subject 101 lies on a patient table 142 such that at least a part of subject 101 is within an imaging volume 141 that is subdivided into a plurality of voxels 143. For clarity of illustration, not all voxels 143 of imaging volume 141 are shown in FIG. 1. RF coils 148 function as receiver channels of MR signals generated within the portion of subject 101 located within imaging volume 141.

RF coils 148 may be transceivers that function as antennae capable of both (a) transmitting an RF signal to excite protons in imaging volume 141 and (b) receiving MR signals from excited protons. In an embodiment, MRI scanner 190 includes dedicated transmitter coils for transmitting RF signals, such that RF coils 148 operate as receiver coils only.

In an embodiment, each RF coil 148 functions as a separate receiver channel of MRI system 100, and is accordingly and interchangeably referred to as receiver coil 148, receiver channel 148, or channel 148. Each RF coil 148 may be at least one of a surface coil, a paired saddle coil, a bird cage coil, a Helmholtz coil pair, and other coil types known in the art.

MRI system 100 also includes a data processor 114 and a pulse programmer 124. Pulse programmer 124 applies a pulse sequence 127 to RF coils 148 and magnet architecture 140. Pulse programmer 124 includes pulse sequence parameters 125 that, at least in part, define pulse sequence 127. Pulse sequence parameters 125 may be stored to memory within pulse programmer 124. Pulse programmer 124 determines an RF signal to be transmitted by RF coils 148 (or, alternatively, dedicated transmitter coils) according to pulse sequence parameters 125. RF coils 148 transmit this RF signal to imaging volume 141 so as to excite nuclear magnetic resonances of protons in subject 101. The excited protons emit MR signals that are detected by RF coils 148. RF coils 148 may include coils in orthogonal planes such that they make in-phase (real) and quadrature (imaginary) measurements of MR signals.

Pulse sequence parameters 125 relevant to controlling RF coils 148 may include repetition time (TR) between RF pulses emitted by RF coils 148. Magnet architecture 140 produces a magnetic field at subject 101. Pulse sequence parameters 125 include parameters that define gradients of this magnetic field such as echo times ($TE_k$, where k is an echo time index). Data processor 114 receives MR signals detected by RF coils 148 as MR measurements 158. Herein, an MR measurement 158 measured on channel c, corresponding to an echo time $TE_k$, and at a voxel located at position (x, y) is also referred to as measurement $m_{k,c}(x, y)$, where c is a channel index referring to one of RF coils 148. MR measurements 158 (and hence $m_{k,c}(x, y)$) have an associated phase. Herein, MR measurements 158 and $m_{k,c}(x, y)$ may be referred to as phase measurements. Data processor 114 includes an MR phase reconstructor 130 that reconstructs MR phase image 160 from MR measurements 158.

In the prior art, phase errors of measurements $m_{k,c}(x, y)$ makes reconstruction of MR phase image from measurements $m_{k,c}(x, y)$ from multiple receiver coils (e.g., RF coils 148) a challenging task; in MRI system 100, this task is performed by MR phase reconstructor 130. While MR pulse sequences and algorithms, utilized in the prior art, typically are optimized for magnitude-domain contrast or SNR, there are fundamental challenges that make SNR-optimal MR phase acquisition and estimation more difficult than magnitude. These include phase noise, phase wrapping, and phase offset, each of which is described below.

Phase Noise and Phase Wrapping

Phase wrapping refers to the mapping of measured phase $\phi$ to a value in the range $[-\pi, \pi]$, which introduces phase errors into an MR phase image by not distinguishing between phase values that differ by a factor of $2\pi$. For example, phase wrapping maps two phases $\phi_0 = a$ and $\phi_m = a + 2\pi m$ (where m is a non-zero) integer) to the same value, even though $\phi_0$ and $\phi_m$ represent different physical quantities from an MRI quadrature measurement. The goal of phase unwrapping is to remove these phase errors.

Generally, there are three phase-imaging regimes that MR phase acquisition methods may operate in: (I) a regime dominated by phase-wrapping, with reduced levels of noise, (II) a regime dominated by noise, with minimal instances of phase-wrapping and (III) a regime where the original signal needs to be disambiguated from both phase-wrapping and noise contributions to MR phase measurement error. It is not always possible to choose which regime to operate in due to hardware constraints (e.g., minimum echo time spacing, gradient strengths, and bandwidth) or total imaging time restrictions.

Conventional single-echo acquisition methods generally operate in Regime III where post-processing is relied on in order to recover phase wrapping and noise errors. As rigorously documented in Ref. [12], prior art phase unwrapping methods are not robust in the presence of noise, are computationally expensive and often require expert-user intervention. The authors in Ref. [12] have also shown that prior art phase unwrapping is inefficient in the presence of moderately complex geometrical patterns. Furthermore, in order to mitigate the effects of noise, most prior art single-echo phase processing methods rely on aggressive spatial averaging, such as 5×5×5 median filters, also discussed in Ref. [12]. Such a simplistic approach on phase quantitation may limit spatial resolution of the resulting estimates.

Phase-Offset

A phase-offset $\phi_{0,c}(x, y)$ corresponding to each channel c varies both spatially and across the channels, due to dependence on coil position, cable lengths, and electronic delay. Phase-offset $\phi_{0,c}(x, y)$ is also known as a "receiver phase offset," for example in Ref. 12, which describes phase-offset $\phi_{0,c}(x, y)$ as a component of the MR signal phase that includes "contributions arising from the path length of the MR signal from a particular location in the object to the receiver coil in question given a finite MR wavelength."

Phase-offset $\phi_{0,c}(x, y)$ also varies with time due to drifts in frequency synthesizer and/or imperfections in the centering of k-space [15]. Combining receiver coils' complex data is thus a challenging problem where prior art solutions could be classified into two methods: A method (a) that inverts the sensitivity profiles using SNR-optimal methods for multichannel combination, and a method (b) that references the measurements to either (i) a time point, (ii) a defined region of interest, or (iii) a receiver coil.

Method (a) requires exact knowledge of the complex coil sensitivities [16] or data correlation matrices [17]. To that end, popular prior art methods utilize an additional reference scan to estimate $\phi_{0,c}(x, y)$, which assumes $\phi_{0,c}(x, y)$ to be temporally invariant over scan duration [18]. Other methods approximate relative estimates of $\phi_{0,c}(x, y)$ from the acquired complex images [19]. Severe artifacts and loss of phase information occur in areas where a good SNR is not maintained in every voxel across more than one coil. This "virtual coil" approach also assumes slowly varying $\phi_{0,c}(x, y)$ across coils, and slowly varying tissue-phase across space [19].

Method (b) also has drawbacks: (i) echo time referencing suffers from inherent SNR penalty due to noise amplification [18, 20]; (ii) referencing the phase signal to a user-defined reference region aligns the phase of the complex data in that reference region, but introduces artifacts and signal loss away from the reference region [21]; and (iii) coil referencing requires a coil with good sensitivity across the entire imaging volume.

MRI system 100, through use of pulse sequence parameters 125 and MR phase reconstructor 130, overcomes these challenges. For example, MRI system 100 may obtain MR phase image 160 without use of a reference scan. Furthermore, MR phase reconstructor 130 does not require the use of ad-hoc phase unwrapping/denoising methods, and is strictly a voxel-per-voxel approach, thus preserving the spatial resolution of MR phase image 160. In MRI system 100, disambiguation of MR phase measurement errors from (i) phase wrapping, (ii) phase-offset, and (iii) phase noise is purposefully designed into the acquisition process through pulse sequence parameters 125.

We note that Ref. [8] proposes another method for field-map estimation. As mentioned above, the work in Ref. [8] uses echo-referencing (phase difference) and a small echo step size in order to avoid phase errors from phase wrapping and phase-offset. The performance of the method disclosed in Ref. [8] is thus constrained by these phase errors, a problem which is avoided in MRI system 100.

Without departing from the scope hereof, data processor 114 and pulse programmer 124 may together form a stand-alone MRI control/processing system configured to cooperate with a third-party MRI scanner (e.g., MRI scanner 190) to determine MR phase image 160. In addition, MR phase reconstructor 130 and pulse sequence parameters 125 may be implemented as machine-readable instructions that may be stored in non-transitory memory of a third-party computer to form the MRI control/processing system.

Figure 2:
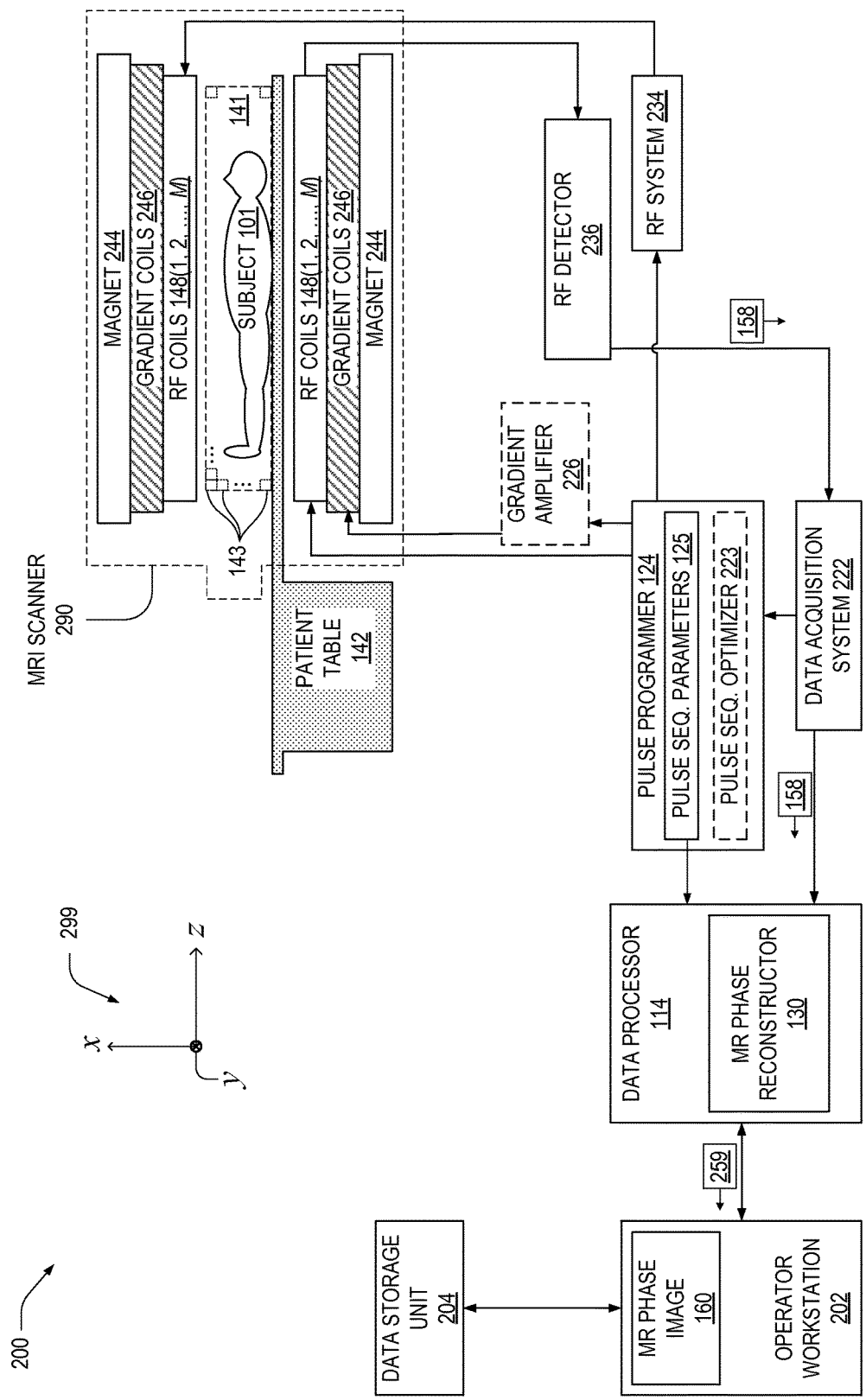
FIG. 2 is a functional block diagram of another MRI system, which is an embodiment of FIG. 1.

FIG. 2 is a functional block diagram of another exemplary MRI system 200 that forms MR phase image 160 of subject 101. MRI system 200 is an embodiment of MRI system 100. MRI system 200 includes all components of MRI system 100, implements MRI scanner 190 as an MRI scanner 290, and implements magnet architecture 140 as a magnet 244 and gradient coils 246.

MRI system 200 includes an operator workstation 202, a data storage unit 204, a data acquisition system 222, an RF system 234, RF detector 236, and gradient coils 246. MRI system 200 may further include a gradient amplifier 226. In an embodiment, pulse programmer 124 includes a pulse sequence optimizer 223 for optimizing pulse sequence parameters 125 for a given type of MR measurement. RF system 234 generates RF signals for RF coils 148 according to pulse sequence parameters 125. RF system 234 may include an RF source and an RF amplifier.

In MRI scanner 290, magnet 244 produces a primary (or main) magnetic field parallel to the z-axis of a coordinate system 299. Gradient coils 246 are capable of producing three orthogonal gradient fields capable of distorting the primary magnetic field in one or more directions spanned by axes x, y, and z. The gradient field is determined by pulse programmer 124 and electrically coupled to gradient coils 246, optionally via gradient amplifier 226. Pulse programmer 124, and pulse sequence parameters 125 therein, determine the gradient fields' spatial distribution and amplitude. Pulse sequence parameters 125 relevant to controlling gradient coils 246 may include velocity encoding (VENC) gradient parameters and motion encoding gradient parameters. Gradient amplifier 226 enables gradient coils 246 to produce sufficiently strong gradient fields to enable capture of MR images.

RF detector 236 detects MR signals received by RF coils 148 and transmits them as MR measurements 158 to data processor 114 via data acquisition system 222. In some modes of operation, data acquisition system 222 may feed back at least a portion of MR measurements 158 to pulse programmer 124 such that pulse programmer 124 may adjust gradient fields and transmitted RF signals in response to previous MR measurements.

Data processor 114 outputs MR phase image data 259 to operator workstation 202, which displays image data 259 as MR phase image 160. Operator workstation 202 may save MR phase image data 259 to data storage unit 204. Data storage unit 204 may be part of operator workstation 202.

Figure 3:
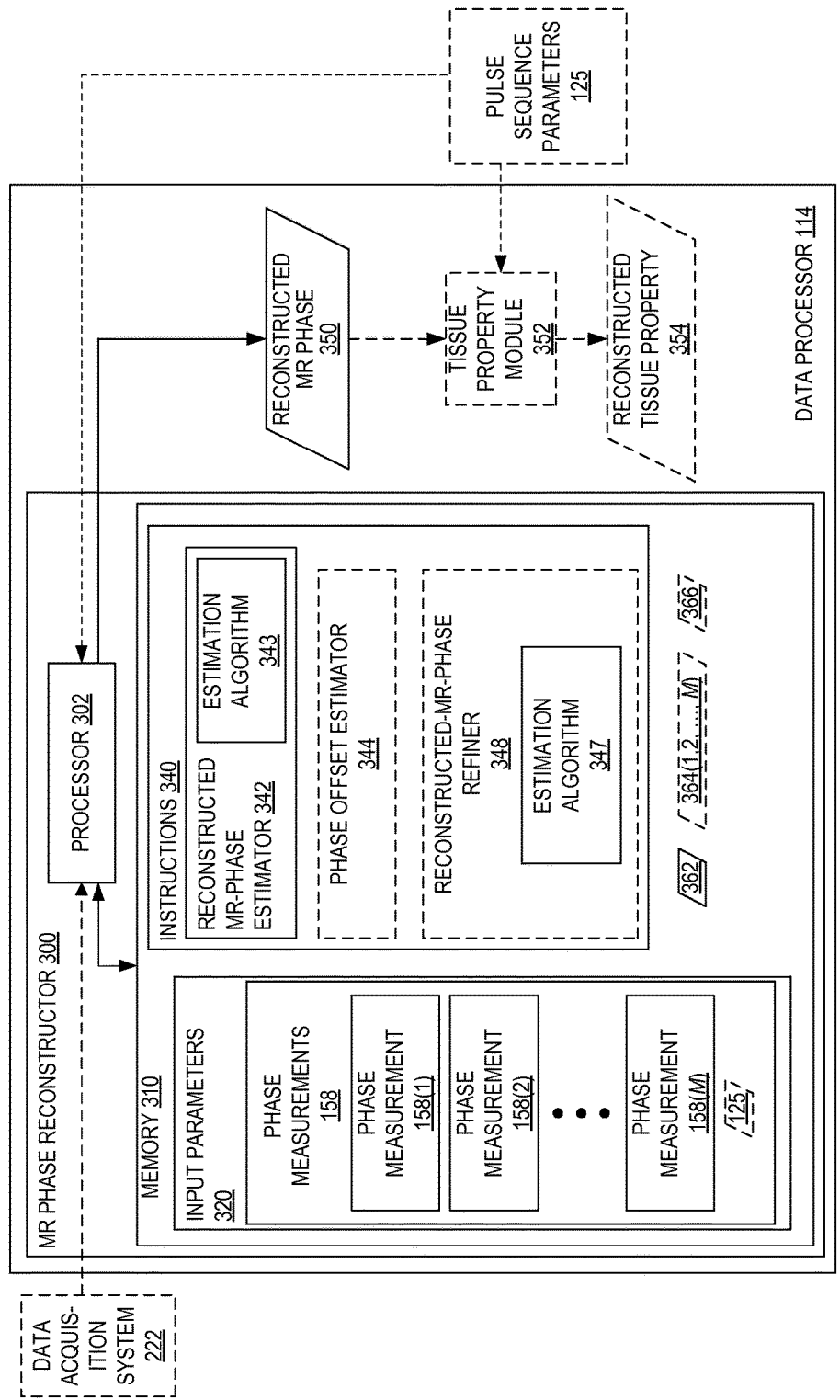
FIG. 3 is a schematic diagram showing a data processor with an MR phase reconstructor for implementation within the MRI system of FIG. 1, in an embodiment.

FIG. 3 is a schematic diagram showing data processor 114 implemented with one exemplary magnetic resonance (MR) phase reconstructor 300 for reconstructing MR phase image 160 from MR measurements 158. MR phase reconstructor 300 is an embodiment of MR phase reconstructor 130. MR-phase reconstructor 300 may be configured to operate as an adjunct system capable of being integrated with a third-party MRI scanner, such as ones commercially available.

MR-phase reconstructor 300 includes a processor 302 and memory 310. Memory 310 includes input parameters 320 and machine-readable instructions 340. Machine-readable instructions 340 may be encoded in a non-transitory portion of memory 310 and may be executed by processor 302 to implement the functionality of MR-phase reconstructor 300.

Input parameters 320 include M phase measurements 158 corresponding to M receiver channels in MRI system 100, such as RF coils 148, wherein M is an integer greater than one. In an embodiment of MR-phase reconstructor 300, input parameters 320 are received from data acquisition system 222 by data processor 114. Input parameters 320 may also include at least one of pulse sequence parameters 125, such as echo times $TE_k$. Machine-readable instructions 340 include a reconstructed MR-phase estimator 342, and optionally, a phase offset estimator 344 and a reconstructed-MR-phase refiner 348. Reconstructed MR-phase estimator 342 and optional reconstructed-MR-phase refiner 348 include an estimation algorithm 343 and an estimation algorithm 347, respectively. Each of estimation algorithms 343 and 347 may include a phase-error predictor. Examples of phase-error predictors include a maximum likelihood algorithm, a maximum consistency algorithm, a root-mean-square algorithm, a temporal regularization algorithm, other objective functions known in the art, and combinations thereof.

When executed by processor 302, reconstructed MR-phase estimator 342 determines, for each voxel 143, a reconstructed MR phase 362 from MR measurements 158. An optional phase offset estimator 344 determines, for each receiver channel 148, a channel-dependent phase offset 364 from reconstructed MR phase 362. An optional reconstructed-MR-phase refiner 348 determines, for each voxel 143 and based upon reconstructed MR phase 362 and channel-dependent phase offsets 364, a refined reconstructed MR phase 366. Processor 302 may, for each voxel 143 output reconstructed MR phase 362 or refined reconstructed MR phase 366 as reconstructed phase 350. Data processor 114 outputs reconstructed phase 350 for each voxel 143 as MR phase image data 259.

In an embodiment, data processor 114 is implemented with a tissue property module 352 that determines a reconstructed tissue property 354, at least in part based upon reconstructed phase 350 and optionally also based upon pulse sequence parameters 125. Tissue property module 352 may use MRI tissue property mapping methods known in the art and may alternatively be part of operator workstation 202. Data processor 114 may output an image of reconstructed tissue property 354 together with, or in place of, MR phase image 160.

Figure 4:
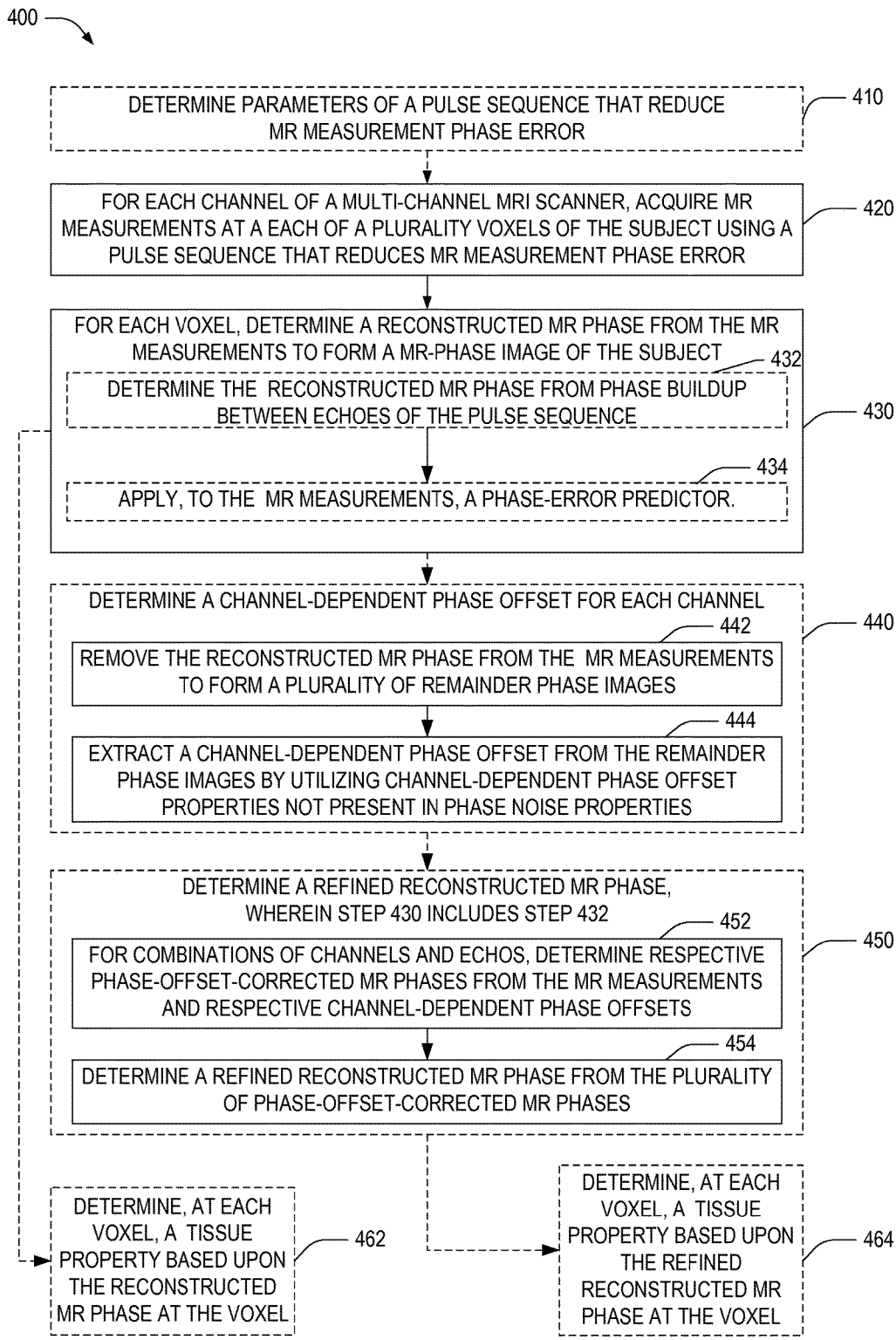
FIG. 4 is a flowchart illustrating an exemplary method for MR phase imaging of a subject.

FIG. 4 is a flowchart illustrating a method 400 for magnetic resonance (MR) phase imaging of a subject using a pulse sequence that reduces MR measurement phase error. Method 400 is performed, for example, by MRI system 100 or MRI system 200. A portion of method 400 may be implemented by MR-phase reconstructor 300.

Optionally, method 400 includes a step 410 of determining parameters of a pulse sequence that reduce MR measurement phase error. In step 410, method 400 may at least partially optimize the parameters by using a phase-error predictor. In an example of step 410, pulse sequence optimizer 223 of MRI system 200 at least partially optimizes at least one parameter of pulse sequence parameters 125 to reduce MR measurement phase error. In one embodiment, step 410 fully optimizes the pulse sequence parameters to minimize MR measurement phase error.

In step 420, method 400 acquires, for each channel of a multi-channel MRI scanner, MR measurements at a plurality of voxels of the subject using a pulse sequence that reduces MR measurement phase error, e.g., the pulse sequence determined in step 410. In an example of step 420, MRI system 100 acquires MR measurements 158 at a plurality of voxels 143 using a pulse sequence generated by pulse programmer 124.

The pulse sequence may include parameters 125, of which one or more is at least partially optimized to reduce MR measurement phase error. Parameters 125 may be partially or completely optimized as described in step 410. Parameters 125, also referred to as pulse sequence parameters and measurement acquisition parameters, may include at least one of (a) pulse sequence echo times, (b) velocity encoding gradients, and (c) motion-encoding gradients. Table 1 shows exemplary tissue properties that affect MR phase and corresponding measurement acquisition parameters that may be optimized by MRI system 100 to measure that tissue property. Tissue temperature, for example, may be derived from MR phase via the temperature dependence of proton resonance frequency (PRF), as described in Ref [4].

TABLE 1

Tissue property and corresponding measurement acquisition parameters

| tissue property | measurement acquisition parameter |
| --- | --- |
| tissue frequency ΔB (susceptibility) | echo times $TE_k$ |
| temperature | echo times $TE_k$ |
| elasticity | motion encoding gradients |
| fluid flow | VENC (velocity encoding) gradients |

In step 430, method 400 determines, for each voxel, a reconstructed MR phase from the MR measurements of each channel to form an MR phase image of the subject. Step 430 and optional subsequent steps 440 and 450 may be implemented by MR phase reconstructor 300. In an embodiment, step 430 reconstructs MR phase for each voxel independently, such that the MR phase for a given voxel is determined without using measurements from any other voxel. In an example of step 430, reconstructed MR-phase estimator 342 of MR phase reconstructor 300 determines, for each voxel 143, a reconstructed MR phase 362 from MR measurements 158 of each channel 148 to form MR phase image 160.

Step 430 may include a step 432. In step 432, method 400 determines the reconstructed MR phase from phase buildup between echoes of the pulse sequence. Step 432 may include determining the reconstructed MR phase from phase buildup between at least one echo pair, where the echo pair includes any two echoes of the pulse sequence.

In bipolar acquisitions, a pulse sequence echo is either even or odd, depending on its temporal position in the pulse sequence. That is, in an echo sequence $[TE_1, TE_2, TE_3, \ldots]$ echoes $[TE_1, TE_3, \ldots]$ are odd echoes while echoes $[TE_2, TE_4, \ldots]$ are even echoes. In step 432, method 400 may determine the reconstructed MR phase from (i) phase buildup between odd echoes, (ii) phase buildup between even echoes, or (iii) phase buildup between odd echoes and phase buildup between even echoes.

Step 430 may also include a step 434. In step 434, method 400 applies an estimation algorithm, such as estimation algorithm 343, to the MR measurements. This estimation algorithm may include a phase-error predictor. Either of both steps 432 and 434 may be performed by reconstructed MR-phase estimator 342.

Optionally, method 400 includes a step 462 of determining, at each voxel, a tissue property based upon the reconstructed MR phase at the voxel as determined in step 430. Examples of tissue properties include tissue magnetic susceptibility, blood flow in tissue, cerebrospinal fluid in tissue, tissue elasticity, tissue temperature, tissue conductivity, and tissue oxygenation.

In an example of step 462, MR phase reconstructor outputs a reconstructed MR phase 350 that is received by a tissue property module 352. Reconstructed MR phase 350 is for example reconstructed MR phase 362. To determine a reconstructed tissue property 354, tissue property module 352 uses reconstructed MR phase 350, and if applicable other parameters as known in the art. Other parameters may include a pulse sequence parameter 125, such as an echo time $TE_k$.

Step 440 is an optional step wherein method 400 determines a channel-dependent phase offset $\phi_{0,c}(x, y)$ for each channel. Step 440 includes steps 442 and 444. In step 442, method 400 removes reconstructed MR phase from the MR measurements to form a plurality of remainder phase images. In an example of step 442, phase offset estimator 344 of MR phase reconstructor 300 removes the reconstructed MR phase 362 from MR measurements 158. In step 444, method 400 extracts a channel-dependent phase offset from the remainder phase images by utilizing properties of channel-dependent phase offsets $\phi_{0,c}(x, y)$ that are independent of phase noise. For example, compared to phase noise, channel-dependent phase offsets $\phi_{0,c}(x, y)$ have smooth spatial variation (phase noise has larger high spatial frequency components) and do not depend on echo times. In an example of step 444, phase offset estimator 344 extracts channel-dependent phase offsets $364(1, 2, \ldots, M)$ for each respective channel $148(1, 2, \ldots, M)$ of MRI system 100.

Step 450 is optional and requires that step 430 includes step 432 such that the reconstructed MR phase is determined from phase buildup between echoes of the pulse sequence. In optional step 450, method 400 determines a refined reconstructed MR phase. Step 450 includes steps 452 and 454. In step 452, method 400 determines, for a plurality of combinations of channels and echoes, a respective plurality of phase-offset-corrected MR phases from the MR measurements and respective channel-dependent phase offsets. In step 454, method 400 determines a refined reconstructed MR phase from the plurality of phase-offset-corrected MR phases.

In an example of step 450, reconstructed-MR-phase refiner 348 determines a refined reconstructed MR phase 366. In an example of step 452, reconstructed-MR-phase refiner 348 determines, for a plurality of combinations of channels 148 and echoes $TE_1, TE_2, \ldots TE_k$, a respective plurality of phase-offset-corrected MR phases from MR measurements $158(1, 2, \ldots, M)$ and respective channel-dependent phase offsets $364(1, 2, \ldots, M)$. In an example of step 454, reconstructed-MR-phase refiner 348 determines refined reconstructed MR phase 366 from the plurality of phase-offset-corrected MR phases determined in step 452. In at least one of steps 452 and 454, reconstructed-MR-phase refiner uses an estimation algorithm 347, which may include a phase-error predictor.

Step 464 is an optional step of determining, at each voxel, a tissue property based upon the refined reconstructed MR phase at the voxel as determined in step 450. In one example, step 464 is performed by tissue property module 352 in a manner similar to step 462 except with reconstructed MR phase 350 being refined reconstructed MR-phase 366.

Phase-error Predictors

This disclosure has provided examples of phase-error predictors. This section describes phase-error predictors in further exemplary detail. A phase-error predictor is a function that may have input arguments that include a prescribed measurement acquisition parameter (echo times TE, for example) and tissue frequency $\Delta B$. Input arguments may also include, but are not limited to, T2*, SNR, TR, and measurements $m_{k,c}$ (a measurement 158), as described in Eq. (1) below.

A phase-error predictor returns a predicted error in an estimate of $\Delta B$ made from measurements 158 acquired at the prescribed measurement acquisition parameters. The phase-error predictor can be used in both determining pulse sequence parameters that reduce MR measurement phase error, such as in step 410 of method 400, and in determining a reconstructed MR-phase, such as in steps 430 and 450.

Examples of phase-error predictors include (PEP1) likelihood functions, (PEP2) distance measures, (PEP3) Minimum Variance Unbiased (MVU) bounds, (PEP4) consistency check or L-norm metrics, and (PEP5) non-closed-form solutions, as described below.

(PEP1) Likelihood functions include $\mathcal{L}_I(\Delta B)$ and $\mathcal{L}_{III}(\Delta B)$ as described in Eqs. (14) and (18) described below in Example 1. The argument to a likelihood function may be a measurement, as indicated by Eq. (16) of Example 1. We note that $\mathcal{L}_{k,c} = P(m_{k,c}/\Delta B) = P(\psi_{k,c}/\Delta B)$, where conditional probability $P(A_1/A_2)$ is the probability of $A_1$ given $A_2$. Also, likelihoods are the inverse of an error. That is, a phase-error predictor that predicts (estimates) a high likelihood of a particular value of $\Delta B$ at a voxel 143, corresponding to the actual tissue frequency at the voxel, indicates a low error in that frequency estimate. Phase-error predictors that include likelihood functions may be implemented in MR phase reconstructor 300 as at least a portion of either or both estimation algorithms 343 and 347.

(PEP2) Phase-error predictors may include distance measures between the ideal likelihood and the (predicted) likelihood such as $\mathbb{E}[\mathcal{D}(\mathcal{L}_{III}(\Delta B), \delta(\Delta B))]_{\Omega_k, r_k, \Delta B}$ and $\mathbb{E}[\mathcal{D}(\mathcal{L}_I(\Delta B), \delta(\Delta B))]_{\Omega_k, r_k, \Delta B}$, where each distance measure $\mathcal{D}$ is averaged over all possible measurement errors $\Omega_k$ (from noise), and $r_k$ (from phase wrapping). Herein, $\mathcal{D}(f(\Delta B), \delta(\Delta B))$ denotes a distance measure between an arbitrary function f and the Dirac delta function centered at $\Delta B$. Such distance measures are discussed in more detail in relation to Eqs. (19) and (20) below.

The likelihoods $\mathcal{L}_I(\Delta B)$ and $\mathcal{L}_{III}(\Delta B)$ may be predicted based on a worst-case voxel, as mentioned above, an average voxel, or other voxels 143 of interest. A worst-case voxel is associated with minimum $SNR_{0,c}$ and T2* of interest, ($SNR_{0,min}$ and $T2*_{min}$) as expected given a pulse sequence. Phase-error predictors that include distance measures may be used to determine pulse sequence parameters in step 410 of method 400, and may be implemented by pulse sequence optimizer 223 (FIG. 2).

(PEP3) MVU bounds associated with a given likelihood may be expressed as $\mathbb{E}[\sigma_I(\Delta B)]_{\Omega_k, r_k, \Delta B}$ and $\mathbb{E}[\sigma_{III}(\Delta B)]_{\Omega_k, r_k, \Delta B}$, where $\sigma_I(\Delta B)$ and $\sigma_{III}(\Delta B)$ (defined in Eqs. (21) and (22) below) are averaged over all possible measurement errors $\Omega_k$ (from noise) and $r_k$. Phase-error predictors $\mathbb{E}[\sigma_I(\Delta B)]_{\Omega_k, r_k, \Delta B}$ and $\mathbb{E}[\sigma_{III}(\Delta B)]_{\Omega_k, r_k, \Delta B}$ may be used to determine pulse sequence parameters in step 410 of method 400, and may be implemented by pulse sequence optimizer 223 (FIG. 2).

(PEP4) A phase-error predictor may include consistency check or L-norm metrics, such as $$\Sigma_{k_1, k_2} \Sigma_c \left\| m_{k_1, c} e^{i 2\pi \Delta B (TE_{k_2} - TE_{k_1})} - m_{k_2, c} \right\|^\alpha$$

and $\Sigma_{k=1}^K \Sigma_c \| m_{k,c} e^{-i\phi_{0,c}} e^{-i 2\pi \Delta B TE_k} - \| m_{k,c} \| \|^\beta$. Measurement $m_{k,c}(x, y)$ is described in relation to Eq. (1), below. Each exponent $\alpha$ and $\beta$ may be any number. These phase-error predictors may be minimized to search for the best frequency (in reconstruction) or best TEs (in design, by averaging over all possible frequencies and measurements).

Phase-error predictors that include consistency check or an L-norm metric may be used to determine pulse sequence parameters in step 410 of method 400, and may be implemented by pulse sequence optimizer 223 (FIG. 2). Phase-error predictors that include consistency check or an L-norm metric (e.g., an $L^1$ norm, $L^2$ norm, ..., $L^P$ norm) also may be implemented in MR phase reconstructor 300 as at least a portion of either or of both estimation algorithms 343 and 347.

(PEP5) A phase-error predictor need not have a closed-form expression. For example, a phase-error predictor may be the output of a Monte Carlo simulation that (a) generates (random) MRI measurements (at given TRs, TE, SNR, T2*, etc.), (b) reconstructs a phase estimate from the resulting simulated measurements using a phase reconstruction algorithm (such as estimation algorithms 343 or 347, Eqs. (13) and (17)), and (c) computes the error between the estimate and the actual phase. The reconstruction step of (b) may itself be a minimization (e.g., a search) step, which takes the simulated measurements from (a), and determines a $\Delta B$ estimate that minimizes a different phase-error predictor, for example, a likelihood function described in (PEP1) and (PEP4). Phase-error predictors described of PEP5 may be used to determine pulse sequence parameters in step 410 of method 400, and may be implemented by pulse sequence optimizer 223 (FIG. 2).

A first phase-error predictor, such as those described herein, may be used in acquisition design (optimization) of pulse sequence parameters used for measurement, as described for example in step 410 of method 400. An MR measurement may be acquired using these parameters, as described for example in step 420. Phases of the MR measurements may be reconstructed by at least partially minimizing or at least partially maximizing a second phase-error predictor. The second phase-error predictor may be the same type as the first error predictor, or may be a different type.

EXAMPLE 1

ML-MAGPI: A Framework for Maximum Likelihood MR Phase Imaging Using Multiple Receiver Coils In Example 1, the MR phase estimation problem is formulated rigorously using an exemplary Maximum-Likelihood (ML) approach. Example 1 discloses a framework, ML-Maximum AmbiGuity distance for Phase Imaging (ML-MAGPI) that jointly defines the acquisition-processing chain: the optimized pulse sequence is a single Multi-Echo Gradient Echo (MEGE) scan and the corresponding post-processing algorithm is a voxel-per-voxel ML estimator of the underlying tissue phase. The prefix "ML" is not meant to not limit the approach described herein to the use of maximum likelihood estimation methods, and does not exclude the use of other statistical estimators.

Example 1 includes an example of method 400, an example of pulse sequence optimizer 223, and an example of MR phase reconstructor 300.

Example 1 includes examples of the following: estimation algorithm 343, the maximum likelihood function of step 434 of method 400, determine channel-dependent phase offsets $\phi_{0,c}$ determined by phase offset estimator 344, a phase-offset corrected MR phase of step 452, and estimation algorithm 347. Example 1 also includes examples of reconstructed MR phase 362, channel-dependent phase offsets 364, estimation algorithm 347, and refined reconstructed MR phase 366.

The ML-MAGPI framework achieves substantial improvements in the phase estimate, resulting in phase signal-to-noise ratio (SNR) gains by up to an order of magnitude compared to prior art methods. The advantages of the ML-MAGPI framework include (1) ML-optimal combination of phase data from multiple receiver coils, without a reference scan, (2) ML-optimal estimation of the underlying tissue phase, without the need for spatial processing, and (3) robust dynamic estimation of channel-dependent phase-offsets.

Example 1 formulates the phase estimation problem in rigorous terms and show that our reconstructed phase image is the ML estimate of the underlying tissue phase. The ML-MAGPI framework does not require a reference scan, and does not increase the acquisition time. Furthermore, this framework does not require the use of ad-hoc phase unwrapping/denoising methods, and is strictly a voxel-per-voxel approach, thus preserving the spatial resolution of the image.

For comparison, as mentioned above, the work in Ref. [8] uses echo-referencing (phase difference) and a small echo step size in order to avoid phase errors from phase wrapping and phase-offsets. The performance of that method in Ref. [8] is thus constrained by these phase errors. The ML-MAGPI framework used in Example 1, however, is fundamentally different: phase wrapping, phase errors from phase-offset and phase noise are all purposefully designed into the acquisition process. The ML-MAGPI framework enables a range of practical advantages not achievable with other methods, as we detail below in the Discussion section.

Theory

We will consider here the theory associated with MR phase originating as a response to a Gradient-Echo (GRE) sequence produced by pulse programmer 124 of MRI system 100. A gradient echo is echo produced by reversing the direction of a magnetic field gradient to cancel out position-dependent phase shifts that have accumulated due to the magnetic field gradient. A similar analysis could be extended to other pulse sequences.

The measurement $m_{k,c}(x, y)$ obtained using a GRE at receiver channel element c (such as an RF coil 148) and echo time $TE_k$ at a voxel 143 (at position (x, y)) could be written as Eq. (1). In Equation (1), magnitude term $\rho_{k,c}(x,y)$ is the spin density at echo time $TE_k$ modulated by the sensitivity of channel c, $\phi_k(x, y)=2\pi\Delta B(x, y)TE_k$ is the underlying tissue phase value (corresponding to pulse echo time $TE_k$) and $\phi_{0,c}(x, y)$ is the spatially-varying channel-dependent phase offset of channel c [22].

$$m_{k,c}(x, y) = \rho_{k,c}(x, y) e^{i(\phi_{0,c}(x, y) + 2\pi\Delta B(x, y)TE_k)} + w(x, y) \quad (1)$$

The quantity $m_{k,c}(x, y)$ is for example, an MR measurement 158. Note that Eq. (1) employs a left-handed coordinate system. Eq. (1) may employ a right-handed coordinate system (change +i to −i) without departing from the scope hereof.

The tissue frequency term $\Delta B(x, y)$ accounts for all deviations in the main magnetic field at location (x, y) due to the presence of a subject within imaging volume 141. These deviations are due to both, inherent tissue properties (such local magnetic susceptibility changes) as well as object coil-loading effects. The noise term w(x, y) in each voxel 143 may be drawn in an independent and identically distributed manner from a complex Gaussian random variable, i.e. $w=w_R+iw_I$, where both $w_R$ and $w_I$ have a zero mean value and a standard deviation $\sigma_w$. Noise term w(x, y) may have a different statistical distribution without departing from the scope hereof.

The goal of quantitation from MR phase is to extract the term $\Delta B(x, y)$ from the measurements $m_{k,c}(x, y)$. Instead of the phase, however, we are restricted to the numerically-computed angle $\Psi_{k,c}(x, y)$ of $m_{k,c}(x, y)$ shown in Eq. (2).

$$\Psi_{k,c}(x, y) = \phi_{0,c}(x, y) + 2\pi\Delta B(x, y)TE_k + \Omega_{k,c}(x, y) + 2\pi r_{k,c}(x, y) \quad (2)$$

In Eq. (2), $\Omega_{k,c}(x, y)$ is the phase contribution of the additive noise term and $r_{k,c}(x, y)$ is a phase wrapping integer that forces the sum in Eq. (2) to be in the range $[-\pi, \pi)$. Therefore, the integer $r_{k,c}(x, y)$ is a function of both echo time index k and channel index c. Note that $\Omega_{k,c}(x, y)$ also depends on echo time and channel index. That is because the contribution of the noise w(x, y) to the phase depends on $\rho_{k,c}(x, y)$, as discussed in Ref. [7].

For the remainder of Example 1, we drop the pixel subscripts (x, y) with the understanding that the remaining analysis applies separately to each voxel 143 in imaging volume 141.

Maximum Likelihood Phase Estimation

Formally, the ML estimate of a parameter of interest $\theta$ from measurements g is obtained through maximizing the probability of obtaining g, given an underlying parameter model, namely:

$$\hat{\theta}_{ML} = \arg\max_\theta P(g/\theta), \quad (3)$$

where the conditional probability $P(g/\theta)$ is the likelihood function. The popularity of ML estimation (MLE) is mainly due to its optimality properties such as efficiency, sufficiency, consistency and invariance [23]. Other common estimators (e.g., Least Squares) do not possess such important properties. The invariance property is very important in our view. Stated formally, if $\theta$ is the true value of a parameter and $\Theta = f(\theta)$ is a function of that parameter, then the ML estimate of $\Theta$ is given by Eq. (4).

$$\hat{\Theta}_{ML} = f(\hat{\theta}_{ML}) \quad (4)$$

That is, the ML estimate of a function of a parameter is the function of its ML estimate [23, 24]. This property is important because the end goal is to extract parameters from $\Delta B$.

Herein, we are concerned with the estimation of parameter $\Delta B$ from a measurement $\psi_{k,c}$. We can show that the corresponding likelihood function $\mathcal{L}_{k,c}$ is given by Eq. (5) where $\psi_{k,c}$ is a realization (that is, a phase measurement) of the angle random variable $\Psi_{k,c}$.

$$\mathcal{L}_{k,c}(\Delta B) \triangleq pr(\Psi_{k,c}/\Delta B) = P(\Omega_{k,c} + 2\pi r_{k,c} = \psi_{k,c} - 2\pi\Delta B TE_k \phi_{0,c}) \quad (5)$$

Note that, because the phase wrapping integer $r_{k,c}$ depends on the phase noise random variable $\Omega_{k,c}$, this implies that $r_{k,c}$ is also a (discrete) random variable. Using the total probability theorem, we can write:

$$\mathcal{L}_{k,c}(\Delta B) = \Sigma_r P(r_{k,c} = r) f_{\Omega_{k,c}}(\psi_{k,c} - 2\pi\Delta B TE_k - 2\pi r - \phi_{0,c}) \quad (6)$$

where $P(r_{k,c} = r)$ is the probability of obtaining a given wrapping integer r and $f_{\Omega_{k,c}}$ is the Probability Density Function of the noise in channel c, at echo time k. Equations (5) and (6) are examples of estimation algorithm 343 and may be employed in step 430 of method 400.

We have derived both of these probabilities in closed form, with the wrapping probability given by Eq. (7), as shown in Appendix A.

$$P(r_{k,c} = r) = \frac{\sigma_{k,c}\sqrt{2}}{4\Delta B_{max}} \left[ \frac{e^{-b_2^2} - e^{-a_2^2}}{\sqrt{\pi}} - a_2 erf(a_2) + b_2 erf(b_2) - \frac{e^{-b_1^2} - e^{-a_1^2}}{\sqrt{\pi}} + a_1 erf(1) - b_1 erf(b_1) \right] \quad (7)$$

Terms $a_1$, $b_1$, $a_2$, and $b_2$ are given by Eq. (8).

$$a_1 = \frac{\left(\frac{2r-1}{2TE_k} - \Delta B_{max}\right)}{\sqrt{2}\,\sigma_{k,c}}, b_1 = \frac{\left(\frac{2r+1}{2TE_k} - \Delta B_{max}\right)}{\sqrt{2}\,\sigma_{k,c}},$$
$$a_2 = \frac{\left(\frac{2r-1}{2TE_k} + \Delta B_{max}\right)}{\sqrt{2}\,\sigma_{k,c}}, b_2 = \frac{\left(\frac{2r+1}{2TE_k} + \Delta B_{max}\right)}{\sqrt{2}\,\sigma_{k,c}} \quad (8)$$

In Eq. (8), $\sigma_{k,c}$ is the standard deviation of phase noise given in Eq. (23) (See Appendix A). The phase noise distribution could also be derived in closed form (see Ref. [7]), as expressed in Eqs. (9) and (10):

$$f_{\Omega_{k,c}}(\Omega) = \frac{\exp(-snr_{k,c}^2/2)}{2\pi} \quad (9)$$
$$\left\{1 + snr_{k,c}\sqrt{\frac{\pi}{2}}\cos\Omega\exp(snr_{k,c}^2\cos^2\Omega/2)\left[1 + erf\left(\frac{snr_{k,c}\cos\Omega}{\sqrt{2}}\right)\right]\right\}$$

$$snr_{k,c} = 0.65\ SNR_{0,c}e^{-\frac{TE_k}{T2^*}} \quad (10)$$

In Eq. (10), $SNR_{0,c}$ is the magnitude-domain SNR in channel c at TE=0. We validate these derivations in FIGS. 5-7 where we plot the likelihood function using theoretical derivations (solid line) and numerical simulations (cross markers), for various example voxels, $SNR_{0,c}$ and T2* values. We note the strong match between our theoretical predictions and the numerical simulations.

Figure 5:
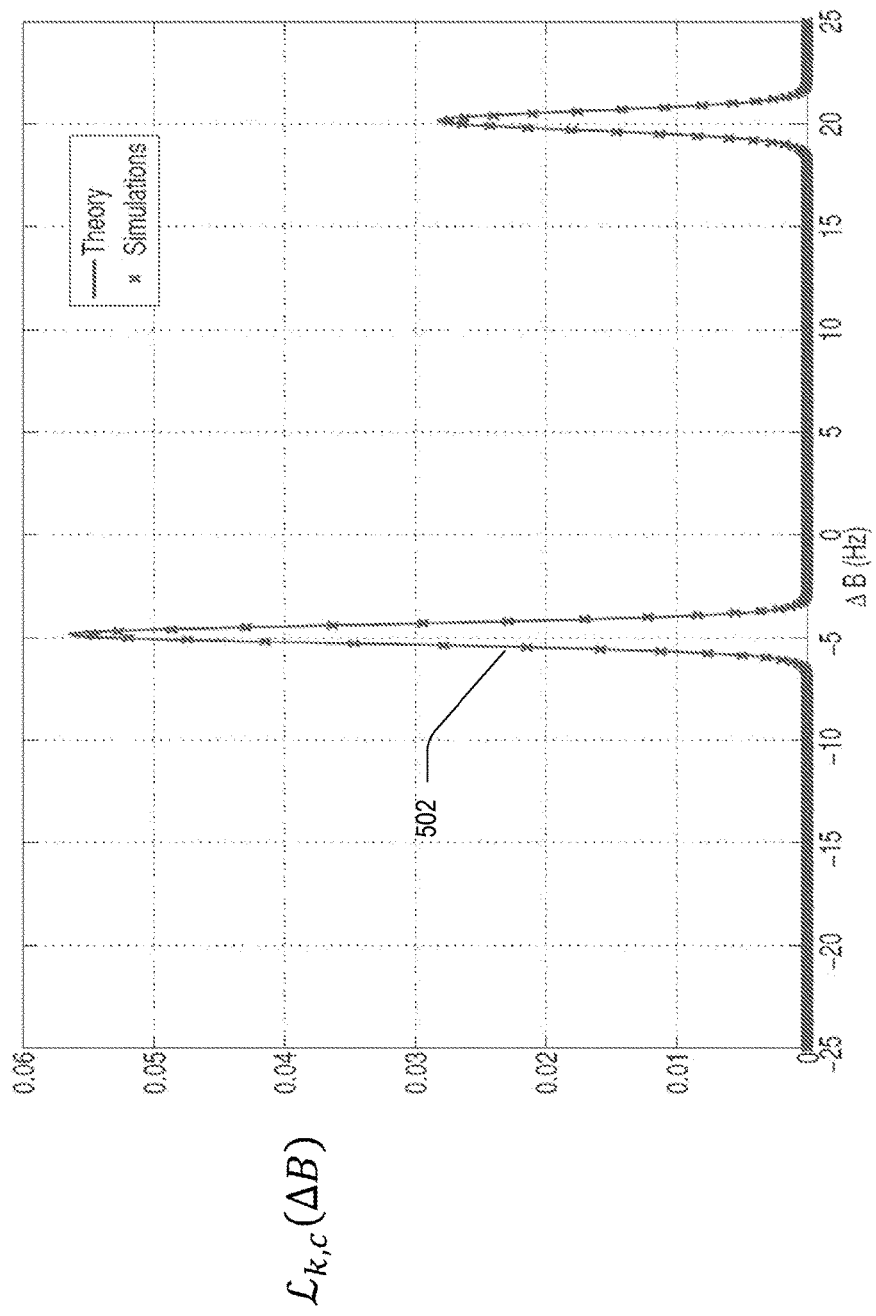
FIG. 5 shows theoretical derivation and numerical simulation of a first likelihood function as a function of tissue frequency of voxels with an actual tissue frequency $\Delta B = -5$ Hz, in an embodiment.

In FIG. 5, the maximum wrapping integer $R_{max}$=1 and the true $\Delta B_1$=−5 Hz. In FIG. 5, the likelihood function 502 is bimodal with peaks at $\Delta B_1$=−5 Hz and $\Delta B_2$=+20 Hz with respective peak likelihoods $\mathcal{L}_{k,c}(\Delta B)$ of approximately 0.057 and 0.028. The likelihood maxima at $\Delta B_1$ and $\Delta B_2$ are separated in frequency by 25 Hz, which corresponds to $$\frac{1}{2TE_k},$$

where $TE_k$ is the echo time corresponding to the measurement.

Figure 6:
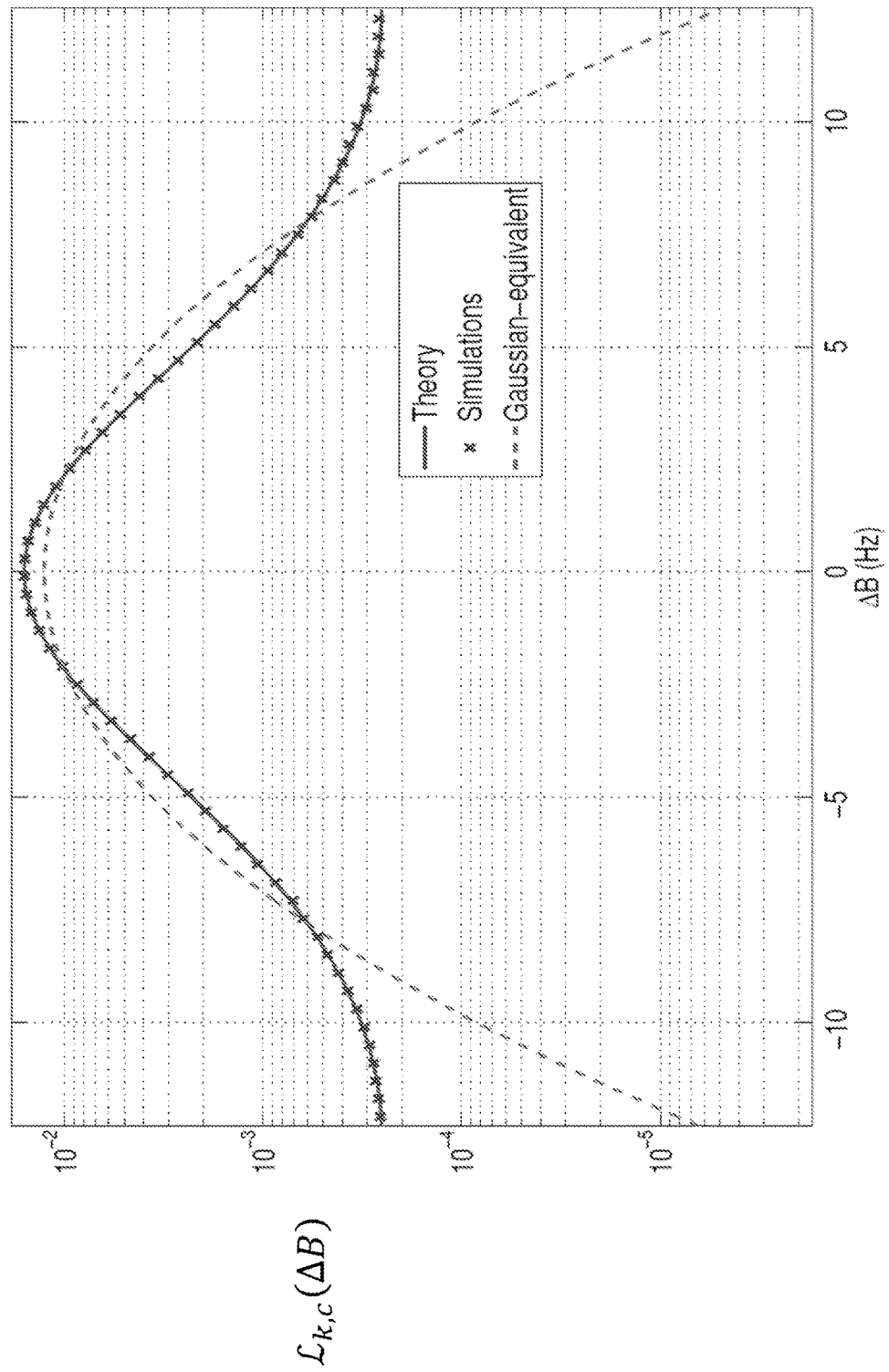
FIG. 6 shows theoretical derivation and numerical simulation of a second likelihood function showing noise distribution, and an equivalent Gaussian noise distribution, in an embodiment.
Figure 7:
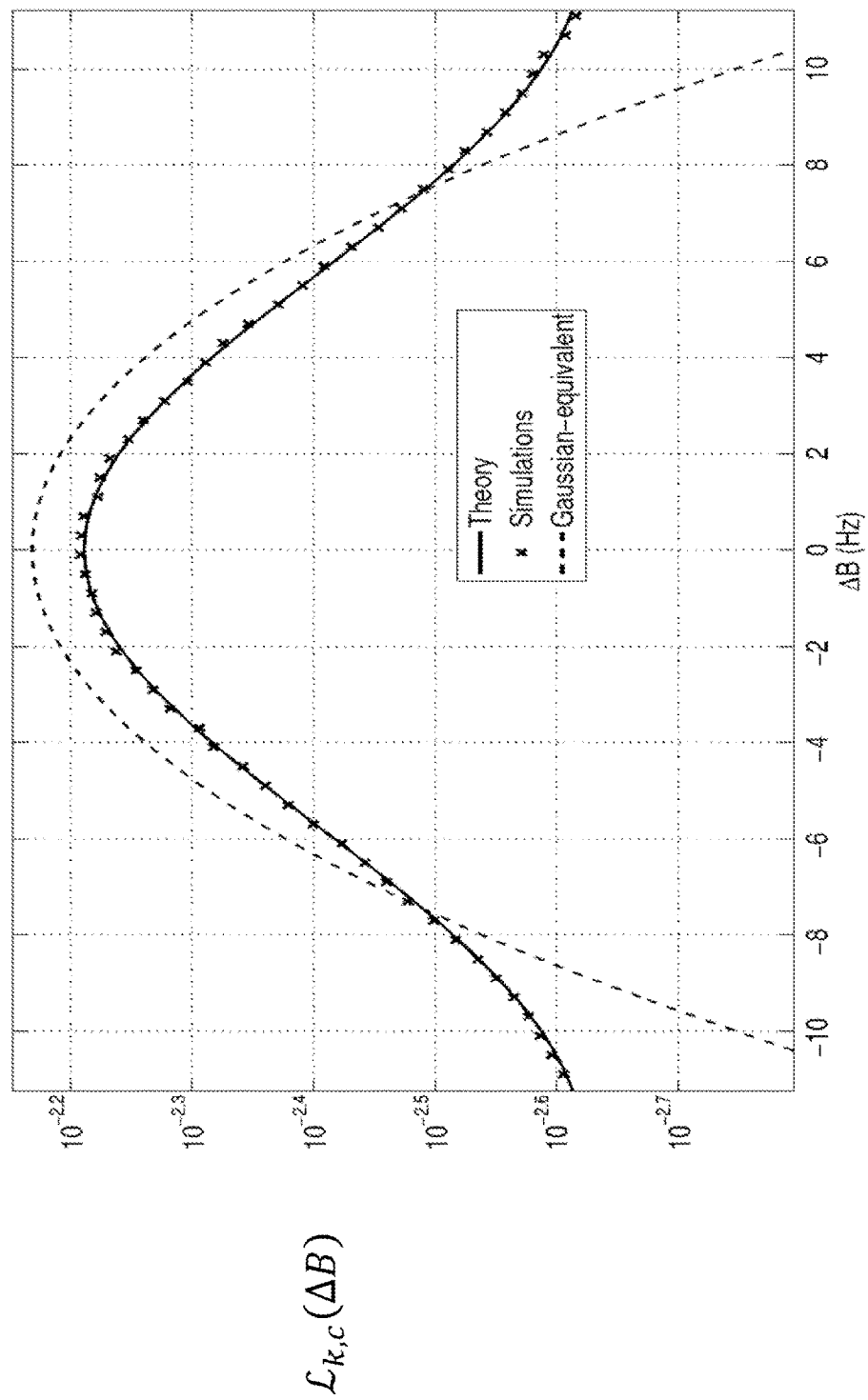
FIG. 7 shows theoretical derivation and numerical simulation of a third likelihood function showing noise distribution, and an equivalent Gaussian noise distribution, in an embodiment.

In FIG. 6 and FIG. 7, $\Delta B$=0 Hz, and $R_{max}$=0, thus the likelihood is simply the noise distribution. In each of FIGS. 6 and 7, the dashed line is a Gaussian distribution with the same mean and standard deviation as the true noise distribution. Note the divergence between the noise probability distribution (solid curve and crosses) and the Gaussian approximation.

We focus here on the dependence of the likelihood functions on $TE_k$, $\Delta B$, T2* and $SNR_{0,c}$. We plot in FIG. 8 two families of likelihood functions obtained in an example voxel 143 at two different values of $TE_k$.

Figure 8:
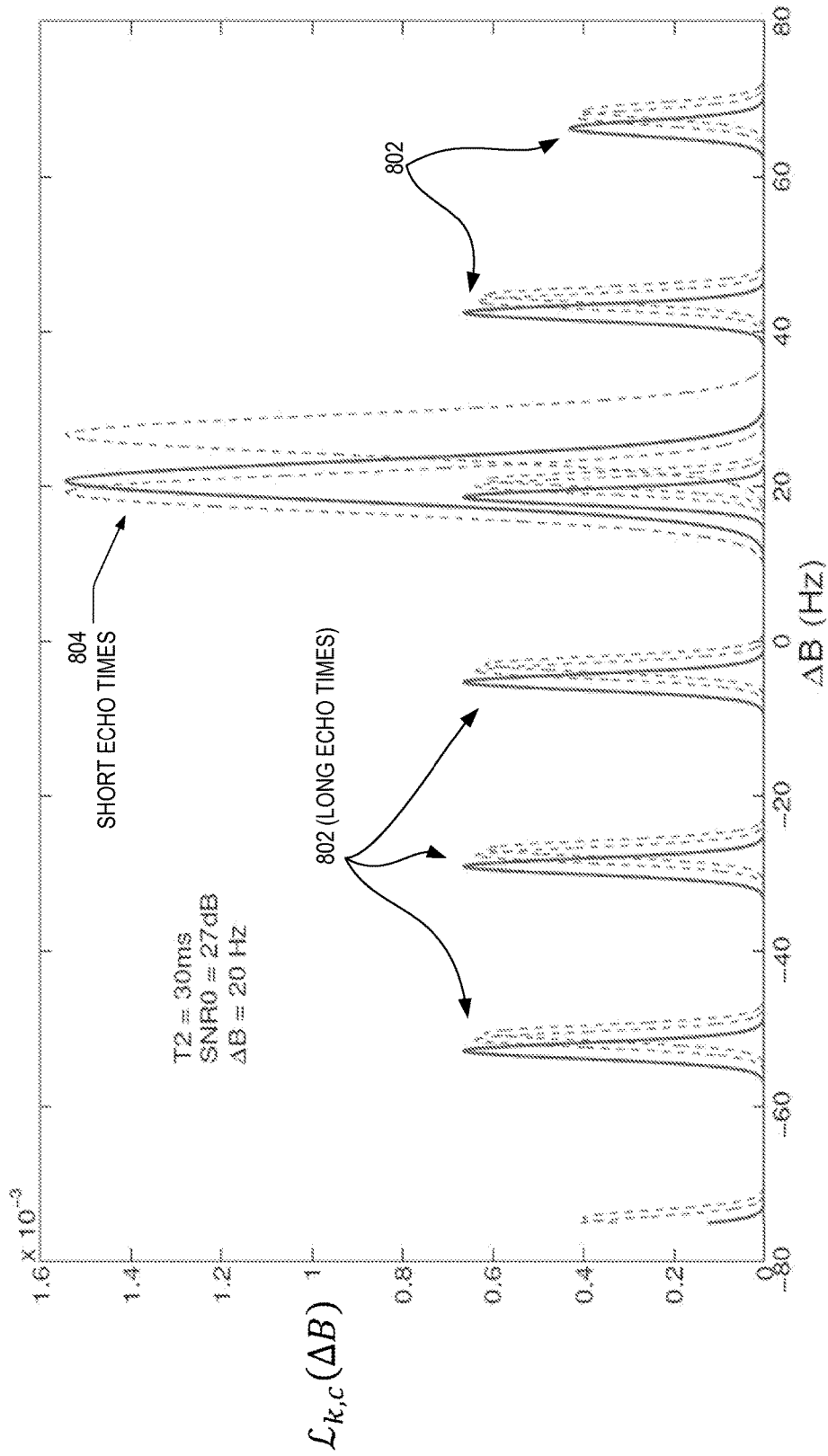
FIG. 8 illustrates exemplary likelihood functions at a voxel for two different echo times, while not accounting for channel-dependent phase offsets.

FIG. 8 illustrates example likelihood functions, with $\phi_{0,c}$=0, in a voxel 143 where $\Delta B$=20 Hz, $SNR_0$=22 (27 dB), and T2*=30 ms. Likelihood functions 804 with three taller peaks (peak likelihoods exceeding 1.5×10$^{-3}$) correspond to $\mathcal{L}_{k,c}(\Delta B)$ for different $\psi_{k,c}$ realizations (phase measurements), at relatively short echo times (TE=5 ms). Likelihood functions 802 with shorter peaks (peak likelihoods ~0.7× 10$^{-3}$) are $\mathcal{L}_{k,c}(\Delta B)$ obtained at relatively long echo times (TE=40 ms).

In FIG. 8, we ignore channel-dependent phase offsets ($\psi_{0,c}$=0, $\forall c$). Note first that, for long $TE_k$, likelihood functions 802 exhibit sharp but multiple global maxima, whereas likelihood functions 802 (short $TE_k$) yield a broad unimodal maximum. Second, we see that repeated measurements yield randomly shifted likelihoods (dashed family of lines with similar peak magnitude as original measurement shown as solid line). Measurements at the longer $TE_k$ result in a family of likelihood functions (e.g., likelihood functions 802) that are more tightly distributed, as compared to the shorter $TE_k$ (e.g., likelihood functions 804). Both of these observations show that the likelihood function are subject to the inherent trade-offs with respect to the choice of $TE_k$: long $TE_k$ induce wrapping-dominated errors, while shorter $TE_k$ induce noise-dominated errors.

Figure 9:
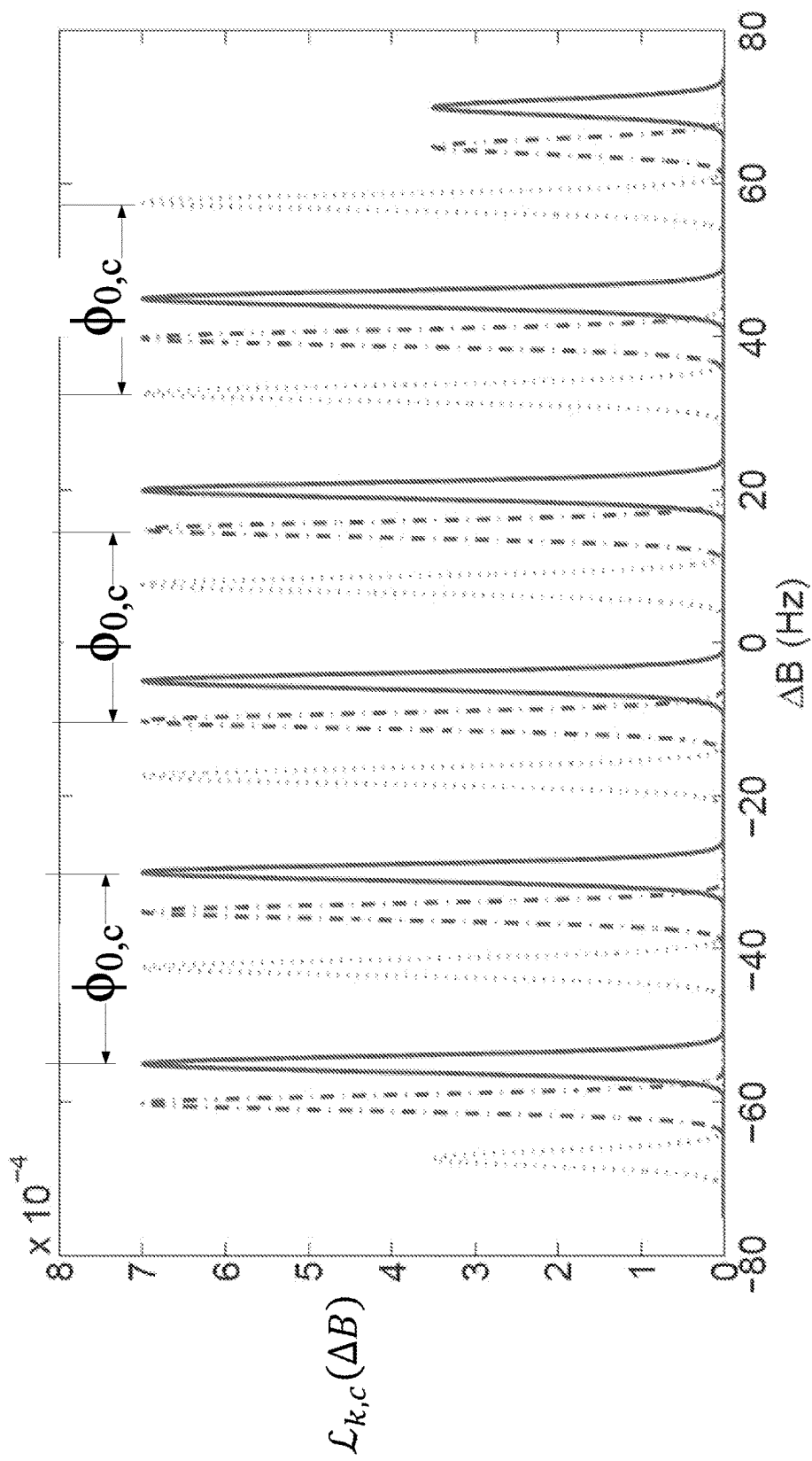
FIG. 9 illustrates exemplary likelihood functions for the same voxel as FIG. 8, corresponding to one echo time value and accounting for channel-dependent phase offsets.

We include the effects of the unknown channel-dependent phase offset $\phi_{0,c}$ in FIG. 9, which includes example $\mathcal{L}_{k,c}(\Delta B)$ curves for different channels c at the same voxel 143 as in FIG. 8 at TE=40 ms. Note that likelihoods in the same voxel are now shifted with respect to one another by an unknown amount, $\phi_{0,c}$. Note that different channels will possess substantially shifted $\mathcal{L}_{k,c}(\Delta B)$ depending on their respective $\phi_{0,c}$.

Example 1 illustrates that maximizing the tissue frequency $\Delta B$ (or corresponding phase) likelihood is made difficult by: (1) a tradeoff between multiple global maxima or, a maximum whose location is sensitive to noise and (2) the unknown channel-dependent phase offset $\phi_{0,c}$. The ML-MAGPI framework, as discussed in detail in the following, overcomes these fundamental challenges.

ML-MAGPI Framework

The ML-MAGPI framework acquires (MEGE) measurements from a collection of K echoes, and $N_c$ channels, within a single repetition time TR. The estimation step is described using the three-pass process detailed below.

Pass I: Find the most likely tissue frequency $\Delta B$ that explains the angle buildup between echoes.

Pass I is an example of step 430 of method 400 and may be implemented in MR phase reconstructor 300 as estimation algorithm 343.

Instead of searching for the most likely tissue frequency value $\Delta B$ that explains the angle measurements of a given echo/channel $\psi_{k,c}$, we look for the most likely tissue frequency value $\widehat{\Delta B}_I$ that explains the phase buildup (i.e., phase difference) between echo pairs. This tissue frequency value $\widehat{\Delta B}_I$ is an example of reconstructed MR phase 362. Formally, we can show that the angle difference between two echoes k=1 and k=2 is expressed by Eq. (11).

$$\Delta\Psi_{2:1,c} \triangleq \angle\{m_{2,c}m^*_{1,c}\} = 2\pi\Delta B\Delta TE_{2:1} + \Delta\Omega_{2:1,c} + 2\pi r_{2:1,c} \quad (11)$$

In Eq. (11), $\Delta TE_{2:1} \triangleq TE_2 - TE_1$, $\Delta\Omega_{2:1,c} \triangleq \Delta\Omega_{2,c} - \Delta\Omega_{1,c}$ and $r_{2:1,c}$ is a phase wrapping integer which forces the sum in Eq. (11) to be in the range [−π, π).

Eq. (11) as compared to Eq. (2) has two notable differences. First, the measured angle buildup does not depend on $\phi_{0,c}$. The second difference is a reduced phase SNR (due to multiplication with a smaller term, $\Delta TE_{2:1}$, and noise amplification from two noise RVs instead of one). We will address this shortcoming in Pass III below. The dual-echo likelihood function, denoted by $\mathcal{L}\ L_{2:1,c}(\Delta B) \triangleq pr(\Delta\Psi_{2:1,c}/\Delta B)$, is now given by Eq. (12).

$$\mathcal{L}_{2:1,c}(\Delta B) = \sum_r P(r_{2:1,c} = r)f_{\Omega_{2:1,c}}(\psi_{2:1,c} - 2\pi\Delta B TE_{2:1} - 2\pi r) \quad (12)$$

Noise and wrapping probabilities $f_{\Omega_{2:1,c}}$ and $P(r_{2:1,c})$ could be readily obtained in closed-form, similar to the derivations in Eqs. (7) and (9).

Note that, in the absence of phase-offset phase error, the ML solution for each coil also maximizes the product of the dual-echo likelihoods over all coils, $\Pi_c \mathcal{L}_{2:1,c}(\Delta B)$. This product assumes that the angle measurements over all the coils are conditionally independent. This assumption does not account for noise correlation across coils.

Nevertheless, dual-echo likelihoods still face here the same unimodal vs multimodal trade-off as single-echo likelihoods. We address this limitation with the use at least one additional echo (k=3) and determine the tissue frequency ΔB that most-likely explains angle buildups from echo pairs {1,2} and {0 1,3}. Equations (13) and (14) expresses this formally:

$$\hat{\Delta B}_I = \underset{\Delta B}{\mathrm{argmax}}\, \mathcal{L}_I(\Delta B) \quad (13)$$

$$\mathcal{L}_I(\Delta B) = \prod_{k=2,3} \prod_c \mathcal{L}_{k:1,c}(\Delta B) \quad (14)$$

In cases where the total number of echoes K>3, Eq. (14) becomes $\mathcal{L}_I(\Delta B) = \Pi_{k_1,k_2} \Pi_c \mathcal{L}_{k_1:k_2,c}(\Delta B)$, $k_1 \neq k_2$. We make the following comments about Eqs. (13) and (14):

Comment (i): We define $\mathcal{L}_I(\Delta B)$ as a "system likelihood." Referring to MR phase reconstructor 300 of MRI system 100, system likelihood $\mathcal{L}_I(\Delta B)$ is an example of estimation algorithm 343 and the maximum likelihood function of step 434 of method 400. Referring to step 430 of method 400, system tissue frequency $\widehat{\Delta B}_I$ corresponds to a reconstructed MR phase $\hat{\phi}_k = 2\pi \widehat{\Delta B}_I \mathrm{TE}_k$ corresponding to echo time $\mathrm{TE}_k$. Reconstructed MR phase $\hat{\phi}_k$ is an example of reconstructed MR phase 362.

$\mathcal{L}_I(\Delta B)$ is not subject to the noisy maximum vs. multiple maxima tradeoff of single-echo and dual-echo likelihoods, as in FIG. 9 for example. Specifically, the argument we prove here is that system likelihoods need not always possess multiple global maxima whenever underlying likelihoods (e.g., single-echo or dual-echo likelihoods) are multimodal. We prove this in FIG. 10 and FIG. 11 using multiple examples where system likelihood $\mathcal{L}_I(\Delta B)$ is multimodal but has a single sharp global maximum. This was achieved despite the underlying dual-echo likelihoods possessing multiple global maxima (FIG. 10) or both unimodal and multimodal maxima (FIG. 11).

Figure 10:
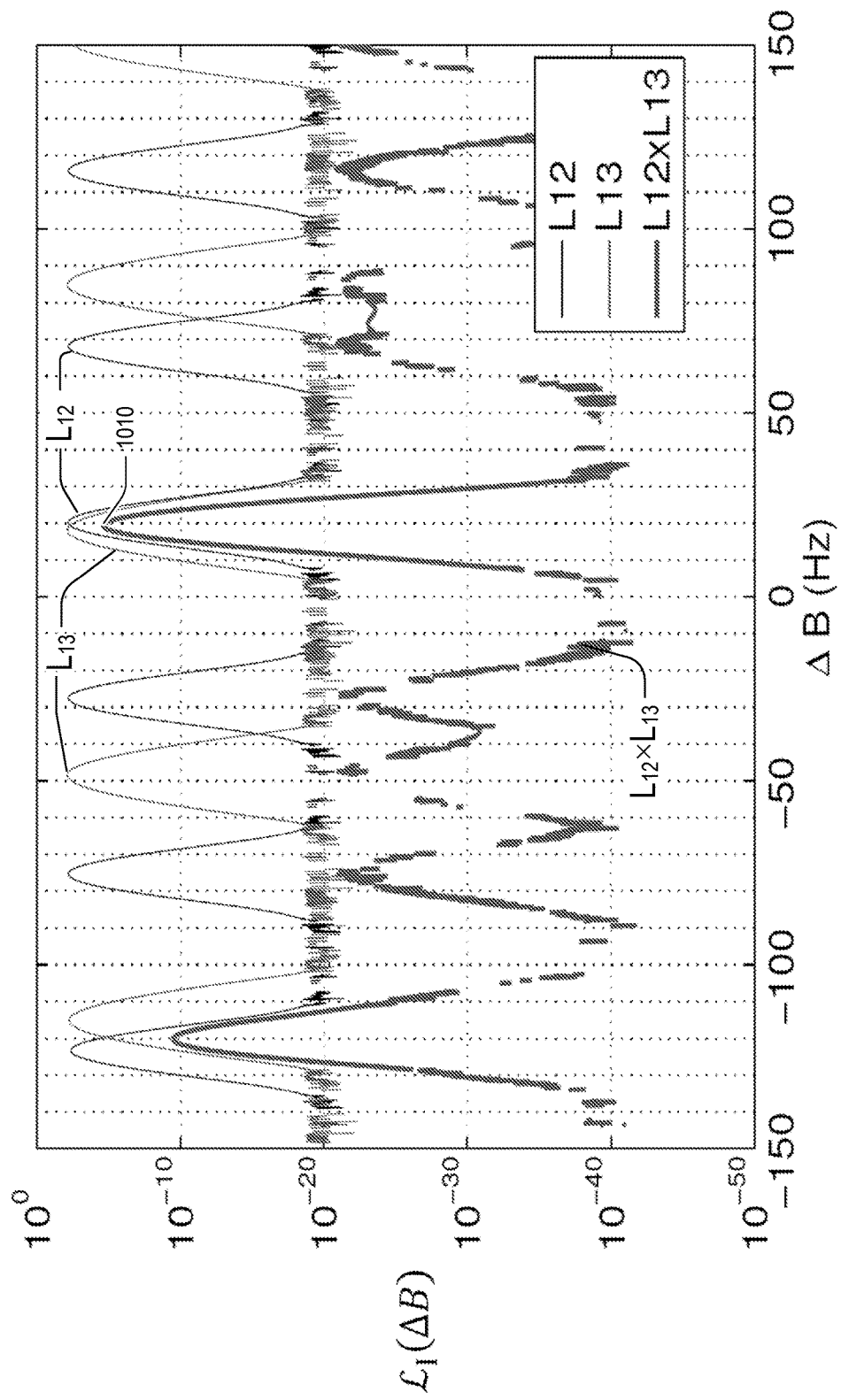
FIG. 10 illustrates first exemplary system likelihood functions obtained from individual dual-echo likelihoods.
Figure 11:
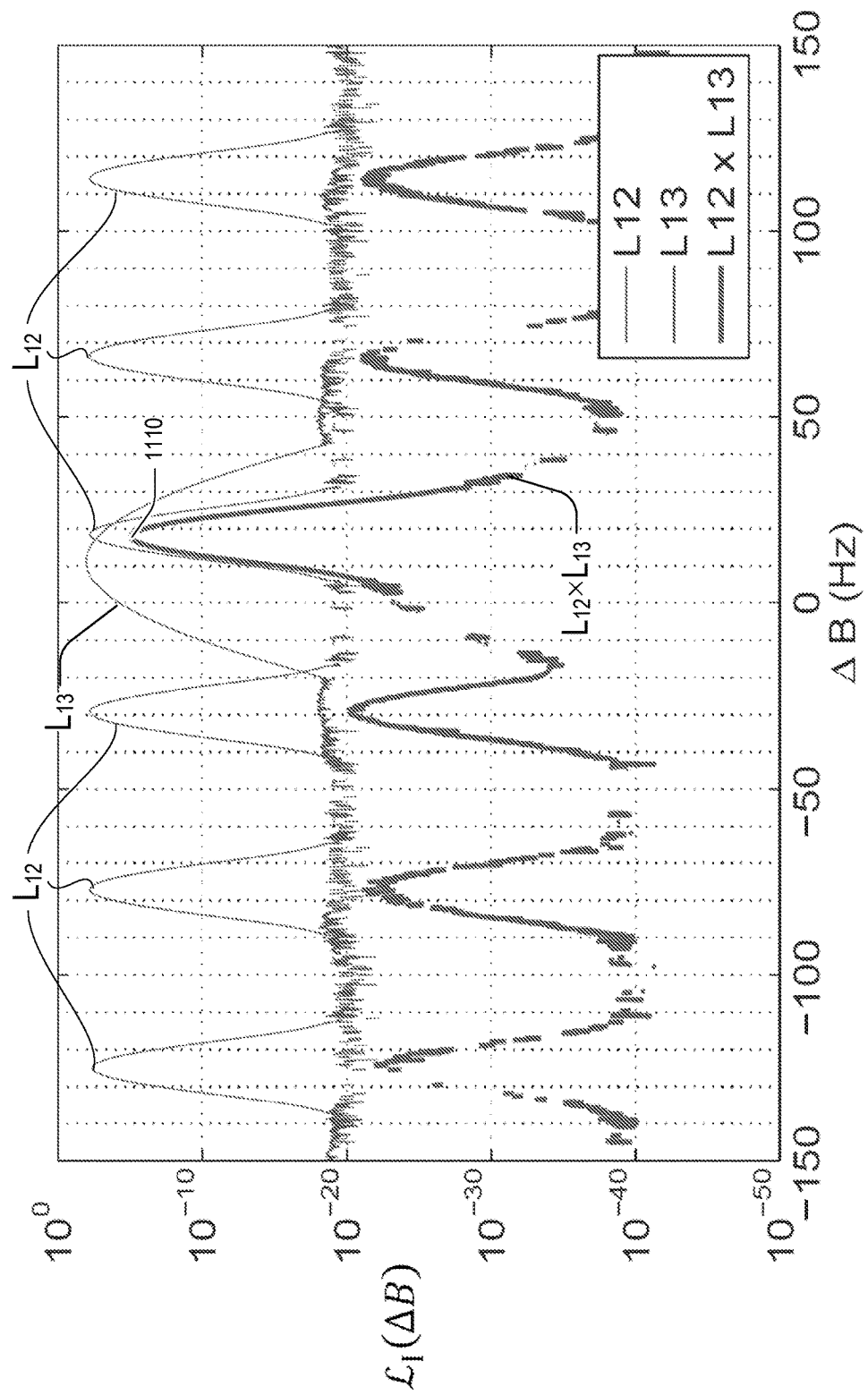
FIG. 11 illustrates second exemplary system likelihood functions obtained from individual dual-echo likelihoods.

In FIGS. 10 and 11, system likelihoods $L_{12} \times L_{13}$ have global maxima 1010 and 1110 at tissue frequencies that each correspond to a respective reconstructed tissue frequency $\widehat{\Delta B}_I$. Each of these reconstructed tissue frequencies correspond to a respective reconstructed MR phase $\hat{\phi}_k$, which are examples of reconstructed MR phases computed in step 430 of method 400.

The presence of a single sharp global maximum, in this case having a likelihood of more than ten orders greater than neighboring local maxima, indicates that system likelihood $\mathcal{L}_I(\Delta B)$ has lower phase error than the likelihood functions 802 and 804 of FIG. 8; for each of likelihood functions 802 and 804, local maxima are of the same order of magnitude.

FIGS. 10 and 11 illustrate example system likelihood functions obtained from individual dual-echo likelihoods. Note that the system likelihoods ($\mathcal{L}_{12} \times \mathcal{L}_{13}$), as in Eq. (13), are not subject to the same noise-phase wrapping tradeoffs as the dual-echo likelihoods ($\mathcal{L}_{12}$ and $\mathcal{L}_{13}$). That is, system likelihoods do not always possess multiple maxima whenever the function is multimodal.

Comment (ii): The quality of the solution obtained from Eq. (13) depends on the choice of system likelihoods. For example, in the ideal limit of infinite SNR, we can show that it is possible to achieve a system likelihood equal to a Dirac delta function, perfectly positioned at the true ΔB. Any deviation from this ideal system likelihood function inevitably yields loss of estimation performance.

Comment (iii): For a given ΔB, T2* and $\mathrm{SNR}_{0,c}$ in a voxel, it is obvious that there exists a large number of system likelihood functions (selected by $\mathrm{TE}_k$) that one could choose from. Each likelihood function has its own corresponding performance, which may be given by the asymptotic MVU bound. A careful design procedure would pick a $\mathcal{L}_I(\Delta B)$ that achieves the lowest MVU bound amongst all possible bounds. This is a key to the method of Example 1: the design of acquisition parameters ($\mathrm{TE}_k$) such as the corresponding MLE achieves the best MVU estimate. We formalize the optimizer in the ML-MAGPI Optimizer section below.

Although the 1D search of system likelihoods (Eqs. (13-14)) still possesses local maxima, the guaranteed global maximum can be obtained with "brute force" as the likelihoods are given by an analytical expression. Furthermore, it is important to emphasize that this step can be solved one voxel at a time, which substantially reduces complexity.

Comments (i) and (ii) above point to the fundamental key to our method: the design of acquisition parameters (echo times) such as the resulting system likelihood is as close as possible to the ideal system likelihood function. We develop this idea more fully in the ML-MAGPI Optimizer section below.

The estimation problem may be terminated at this step but. In one such example, method 400 is implemented without steps 440 and 450, and MR phase reconstructor 300 outputs reconstructed MR phase 362 as reconstructed phase 350. However, the performance at this stage is limited by the inherent noise amplification through the use of the product in Eq. (11). We address this issue in Pass II and Pass III described below.

Pass II: Estimate the channel-dependent phase offsets $\phi_{0,c}$.

Pass II is an example of step 440 of method 400 and may be implemented in MR phase reconstructor 300 as phase offset estimator 344. After obtaining an ML estimate of ΔB in Pass I, the remaining data in the original measurements (Eq. (2)) that is "unexplained" by the Pass I model (Eq. (11)) can be attributed to $\phi_{0,c}$ and errors in the ΔB estimate. The task in Pass II is to extract $\phi_{0,c}$ from these remainder terms: $\phi_{k,c}^{rem} = \angle(m_{k,c} e^{i\widehat{\Delta B}(1)})$. Remainder terms $\phi_{k,c}^{rem}$ are an example of remainder phase images of step 442 of method 400. To achieve this, we take advantage of the following distinct features of $\phi_{0,c}$: smooth variation over space and invariance with echo times. Using this knowledge, we can use various signal-separation techniques to extract $\phi_{0,c}$ from $\phi_{k,c}^{rem}$. We resort here to a simple spatio-temporal low-pass filter applied in the Fourier domain, as described in reference [12], to determine a most-likely channel-dependent phase offset $\hat{\phi}_{0,c} = \mathcal{LPF}\{\phi_{k,c}^{rem}\}$, where $\mathcal{LPF}$ denotes a low-pass filter. Referring to method 400, step 440 may determine channel-dependent phase offsets $\phi_{0,c}$ using phase offset estimator 344 of MR phase reconstructor 300. Channel-dependent phase offsets $\phi_{0,c}$ are examples of channel-dependent phase offsets 364.

Pass III: Find the most likely ΔB that explains the angle of the K echoes. Pass III is an example of step 450 of method 400 and may be implemented in MR phase reconstructor 300 as estimation algorithm 347. After obtaining the estimate of $\phi_{0,c}$ from Pass II, we can rewrite the single-echo likelihood functions in Eq. (6) without any channel-offset phase error, namely, Eq. (15) and Eq. (16) below. Equations (15) and (16) may be used by reconstructed-MR-phase refiner 348 to implement step 450 of method 400. In Eq. (16), $\psi'_{k,c}$ is an example of a phase-offset corrected MR phase (corresponding to a pulse echo $\mathrm{TE}_k$ and channel c) determined in part from MR measurements and referred to in step 452.

$$\mathcal{L}_{k,c}(\Delta B) \triangleq P(\Delta\Psi'_{k,c}=\psi'_{k,c}/\Delta B)=\Sigma_r P(r_{k,c}=r)f_{\Omega_{k,c}}(\psi'_{k,c}-2\pi\Delta B TE_k - 2\pi r) \quad (15)$$

$$\psi'_{k,c} = \angle(m_{k,c} e^{-i\phi_{0,c}}) \quad (16)$$

Thus, in Pass III, use MLE to determine the most likely tissue frequency that could explain the angles, as given by Eq. (16) We can determine this tissue frequency without resorting to phase differencing. Formally, we solve Eqs. (17) and (18), where K is the total number of echoes.

$$\widehat{\Delta B}_{III} = \arg\max_{\Delta B} \mathcal{L}_{III}(\Delta B) \quad (17)$$

$$\mathcal{L}_{III}(\Delta B) = \Pi_{k=1}^{K} \Pi_c \mathcal{L}_{k,c}(\Delta B) \quad (18)$$

In Eq. (18), $\mathcal{L}_{III}(\Delta B)$ is another system likelihood, given by the product of the K individual likelihoods (each corresponding to a respective echo $TE_k$) over all channels, and is plotted in FIG. 12. System likelihoods $\mathcal{L}_{III}(\Delta B)$ of Pass III have similar features as system likelihoods $\mathcal{L}_I(\Delta B)$ of Pass I: (i) the system likelihoods are not subject to the noise-wrapping trade-offs of individual likelihoods, and (ii) we advocate the design of $\mathcal{L}_{III}(\Delta B)$ (through selection of $TE_k$) to be as similar to a Dirac delta function as possible.

Figure 12:
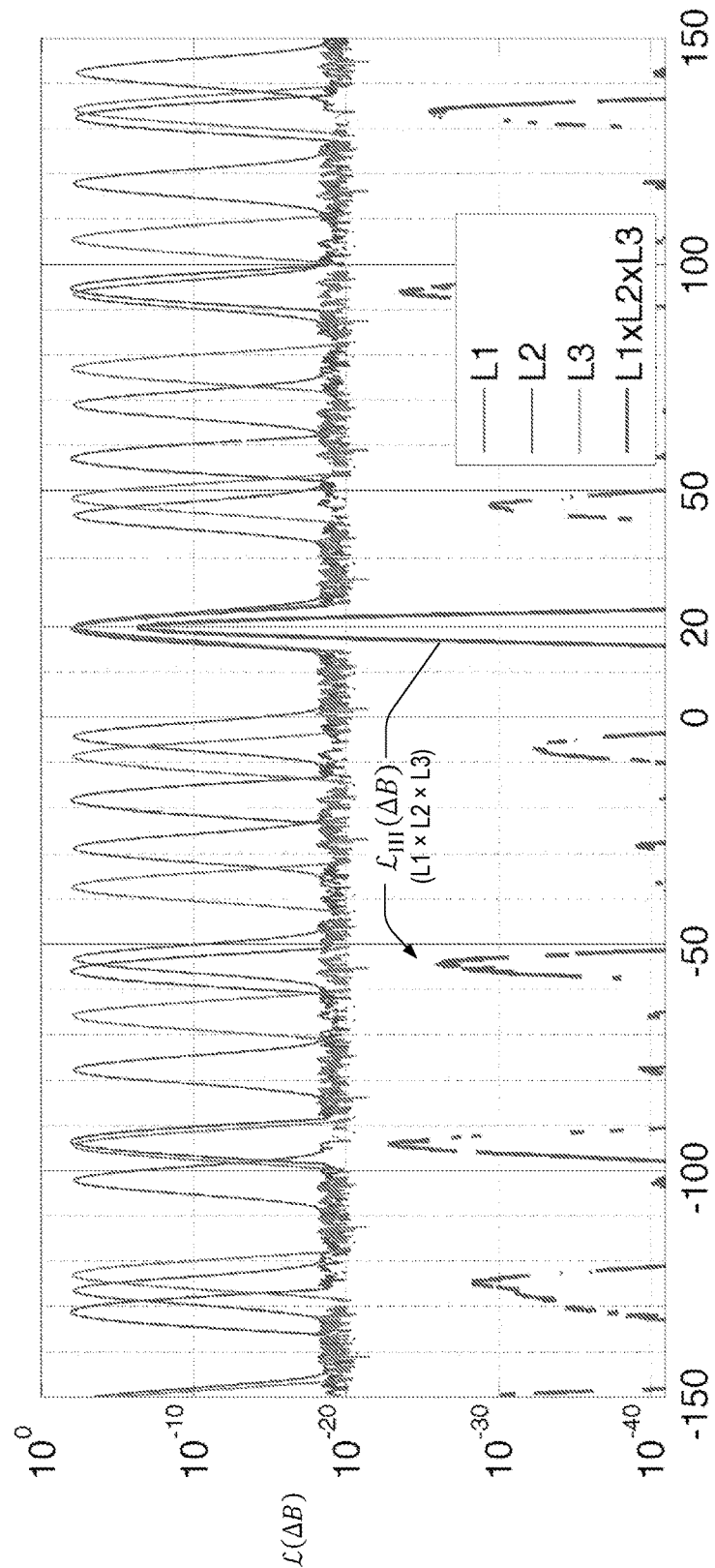
FIG. 12 illustrates an exemplary system likelihood function given by the product of individual likelihoods each corresponding to a single echo, over all channels.

In FIG. 12, $\mathcal{L}_{III}(\Delta B)$ has a global maximum at $\Delta B=20$ Hz, which corresponds to a refined reconstructed tissue frequency $\widehat{\Delta B}_{III}$ of Eq. (17). Referring to MR phase reconstructor 300, system likelihood $\mathcal{L}_{III}(\Delta B)$ may be implemented as at least a portion of estimation algorithm 347 and may be used in step 454 of method 400. Referring to step 450 of method 400, refined system tissue frequency $\widehat{\Delta B}_{III}$ corresponds to a refined reconstructed MR phase $\phi_k = 2\pi \widehat{\Delta B}_{III} TE_k$ corresponding to echo time $TE_k$. Refined reconstructed MR phase $\phi_k$ is an example of refined reconstructed MR phase 366. Equation (17) may be implemented in at least a portion of estimation algorithm 347.

We emphasize that the main goal of Pass I in our algorithm is to create a "rough unbiased estimate" of $\Delta B$, so that Pass II can remove it from the original data and create residue image $\phi_{k,c}^{rem}$. This residue image is then used in Pass II to separate random noise fluctuations from phase-offsets $\phi_{0,c}$. Once phase-offsets are computed, Pass III revisits the $\Delta B$ estimation step, this time without the need for echo referencing (or phase differences). As we will show in our results, there is no error propagation from Pass I to Pass III.

ML-MAGPI Optimizer

The ML-MAGPI optimizer discussed in the following is an example of pulse sequence optimizer 223.

The solutions to Eqs. (13) and (17) are not guaranteed to yield the "best" tissue frequency (and tissue phase) estimate for arbitrary choices of echo times. As mentioned in Pass I and Pass III, a careful optimization routine picks the echo times such that the resulting likelihoods, $\mathcal{L}_I(\Delta B)$ and $\mathcal{L}_{III}(\Delta B)$, are as similar to a Dirac delta functions as possible. Ideally, we would want to minimize both $\mathcal{D}(\mathcal{L}_I(\Delta B), \delta(\Delta B))$ and $\mathcal{D}(\mathcal{L}_{III}(\Delta B), \delta(\Delta B))$, for all possible values of $\Delta B$ and measurements. There are various ways to approach this challenging multi-objective optimization problem. In Example 1, we minimize the average $\mathcal{D}(\mathcal{L}_{III}(\Delta B), \delta(\Delta B))$ subject to upper bound constraints on the average $\mathcal{D}(\mathcal{L}_I(\Delta B), \delta(\Delta B))$. The motivation for this choice is that the $\Delta B$ estimate from Pass III is the final estimate produced in Example 1, and thus should be optimally chosen. The $\Delta B$ estimate from Pass I, however, needs to be constrained so that its errors to Pass II are only limited by unbiased random noise (and not biased by phase wrapping). Formally, the optimization problem is $$[TE_1^{opt}, TE_2^{opt}, \ldots, TE_K^{opt}] = \arg\min_{[TE_1, TE_2, \ldots, TE_K]} \mathbb{E}[\mathcal{D}(\mathcal{L}_{III}(\Delta B), \delta(\Delta B))]_{\Omega_k, r_k, \Delta B} \quad (19)$$

such that $\mathbb{E}[\mathcal{D}(\mathcal{L}_I(\Delta B), \delta(\Delta B))]_{\Omega_k, r_k, \Delta B} \leq \epsilon_I$ and $[TE_1, TE_2, \ldots, TE_K] \in \mathcal{C}_{TE}$, where constraint set $\mathcal{C}_{TE}$ is the set of allowable echo times, $\mathbb{E}$ is an expectation value, and $\epsilon_I$ equals, for example one Hertz. Constraint set $\mathcal{C}_{TE}$ takes into account constraints such as the minimum echo time spacing ($\Delta TE_{min}$), the minimum echo time ($TE_{min}$), and the maximum echo time ($TE_{max}$) achievable with the pulse sequence of choice.

We note the following:

(i) Distance measures. Many distance measures $\mathcal{D}(f(\Delta B), \delta(\Delta B))$ are known in the art. Herein, we use the Kullback-Leibler distance measure (also known as Kullback-Leibler divergence) as the statistical distance between the distributions (Refs. [23] and [24]). Kullback-Leibler distance is a statistical distance measure known as an f-divergence. Alternate distance measures may be used in Eq. (19), such as a statistical distance determined by one or more f-divergence measures, and more generally by one or more statistical distance measures, without departing from the scope hereof.

In Eq. (19), $\mathcal{L}_I(\Delta B)$ and $\mathcal{L}_{III}(\Delta B)$ are maximum likelihood functions. In an embodiment, an argument to distance measure $\mathcal{D}$ may be replaced with a different phase-error predictor.

In Eq. (19), the argument to the min( . . . ) operator is an example of a phase error predictor. A phase error predictor may include a statistical distance measure, such as the aforementioned Kullback-Leibler distance measure, other f-divergence measures, and more generally other statistical distance measures known in the art.

Minimization (or maximization) of a phase-error predictor may refer to minimizing (or maximizing) a figure of merit returned by the predictor. This is analogous to the minimization (or maximization) of an objective function in a mathematical optimization. A phase-error predictor may be at least partially minimized (or at least partially maximized) without departing from the scope hereof. Minimization (or more generally, reduction) of a phase error predictor corresponds to a minimization (or more generally, reduction) of predicted MR measurement phase error in measurements made with pulse sequence parameters, such as $[TE_1^{opt}, TE_2^{opt}, \ldots, TE_K^{opt}]$ of Eq. (19), determined by the minimization (or reduction).

In an embodiment, a phase error predictor may be determined at least in part by: (i) $(1-\mathcal{L}(\Delta B))$, (ii) a ratio of $\mathcal{L}(\Delta B_1)$ and $\mathcal{L}(\Delta B_2)$, $\Delta B_2 \neq \Delta B_1$, (iii) a difference between $\mathcal{L}(\Delta B_1)$ and $\mathcal{L}(\Delta B_2)$, $\Delta B_2 \neq \Delta B_1$, (iv) the width of a peak in $\mathcal{L}(\Delta B)$ centered at $\Delta B_1$, or a combination thereof, where $\mathcal{L}(\Delta B)$ is a likelihood function such as $\mathcal{L}_I(\Delta B)$ and $\mathcal{L}_{III}(\Delta B)$.

(ii) Design Specifications. We emphasize that it is the pulse sequence of choice that defines the optimization design specifications. These specifications include constraints on echo timings such as ($TE_{min}$, $TE_{max}$ and $\Delta TE_{min}$). Also, since $SNR_{0,c}$ and $T2^*$ are spatially-varying quantities, we only optimize the echoes over the minimum $SNR_{0,c}$ and $T2^*$ of interest, $SNR_{0,min}$ and $T2^*_{min}$, as expected with the pulse sequence of choice. Voxels with SNRs larger than $SNR_{0,min}$ are guaranteed to never do worse than this worst-case voxel.

(iii) Tissue Frequency Prior information. We assume in Eq. (19) a uniform distribution for $\Delta B$ within $\pm \Delta B_{max}$, which could be readily approximated based on the strength of the main magnetic field of MRI scanner 190 and the anatomy of interest.

(iii) Computation. In certain embodiments, the optimizer is run offline, once, and various design specifications (see above) corresponding to different sequences of interest may be tabulated and used at acquisition time. Because of the closed form of the probability distributions of noise and phase wrapping, we can use Monte Carlo methods to rapidly compute the expectation in Eq. (19). We solve the optimization problem using Genetic Optimization methods. Computation time of the optimization step may be less than five minutes on a personal computer, depending on the size of the constraint set $\mathcal{C}_{TE}$.

Equation (19) may be used in step 410 of method 400, for example, by pulse sequence optimizer 223 of MRI system 100. Equation (19) may be solved for measurement acquisition parameters other than echo times, such as those listed in Table 1. Similarly, step 410 may optimize these measurement parameters via techniques other than, or in addition to, maximum likelihood estimation. These techniques include MVU estimation, RMSE, consistency check optimization, and other optimization techniques known in the art.

For example, optimal pulse sequence parameters, such as pulse sequence parameters 125, may be determined using an asymptotic MVU bound. The ML estimates of Eq. (14) and Eq. (17) each have an associated MVU bound, which are denoted herein as $\sigma_I(\Delta B)$ and $\sigma_{III}(\Delta B)$, respectively. MVU bounds $\sigma_I(\Delta B)$ and $\sigma_{III}(\Delta B)$ are examples of phase-error predictors. Each of these MVU bounds is given by the inverse of their distribution's Fisher Information, $I^{-1}(\Delta B)$. In this work, we make use of the closed form of the likelihood functions to obtain an approximate numerical estimate of I ($\Delta B$). Ideally, we need to minimize both $\sigma_I(\Delta B)$ and $\sigma_{III}$ ($\Delta B$), for all possible values of $\Delta B$. However, this may not always be possible. Instead, we minimize the average $\sigma_{III}$ ($\Delta B$) subject to an upper bound constraint on the average $\sigma_I(\Delta B)$. Formally, this optimization problem may be written as Eq. (20):

$$[TE_1^{opt}, TE_2^{opt}, \ldots, TE_K^{opt}] = \arg\min_{[TE_1, TE_2, \ldots, TE_K]} \mathbb{E}[\sigma_{III}(\Delta B)]_{\Delta B} \quad (20)$$

In Eq. (20), $\mathbb{E}[\sigma_I(\Delta B)]_{\Delta B} \leq \epsilon_I$, and $[TE_1, TE_2, \ldots, TE_K] \in \mathcal{C}_{TE}$, and and $\epsilon_I$ equals, for example one Hertz.

In Eq. (20), the terms $\sigma_I(\Delta B)$ and $\sigma_{III}(\Delta B)$ include a component representing noise-related errors and a component representing phase wrapping errors, as shown in Eqs. (21) and (22).

$$\sigma_I(\Delta B) = \left(MSE_{III}^{noise} + \delta * \mathbb{E}[MSE_{wrap_I}(\Delta B)]_{\Omega_k, r_k, \Delta B}\right)^{\frac{1}{2}} \quad (21)$$

$$\sigma_{III}(\Delta B) = \left(MSE_{III}^{noise} + \delta * \mathbb{E}[MSE_{wrap_{III}}(\Delta B)]_{\Omega_k, r_k, \Delta B}\right)^{\frac{1}{2}} \quad (22)$$

In Eqs. (21) and (22), expressions for mean-square-error noise are $$MSE_I^{noise} = \frac{\Sigma_k((TE_k - \bar{t})2\pi\sigma_{k,c})^2}{(2\pi\bar{t})^2} \text{ and}$$

$$MSE_{III}^{noise} = \frac{1}{\Sigma_k \sigma_{k,c}^{-2}}, \text{ where } \bar{t} = \frac{1}{K}\Sigma_k^K TE_k,$$

$\bar{t} = \Sigma_k TE_k(TE_k - \bar{t})$, where Eq. (28) provides standard deviation $\sigma_{k,c}$.

In Eqs. (21) and (22), $\delta$ is an arbitrary weight. A value of $\delta = 10$ strongly penalizes wrapping errors and ensures removal of wrapping in optimization. The MSE from phase wrapping ($MSE_{wrap_I}(\Delta B)$ and $MSE_{wrap_{III}}(\Delta B)$) may be approximated in many ways. For example, by averaging over all measurements the product of (i) a computed likelihood of obtaining another wrong peak (at tissue frequency $\Delta B_{wrap}$) from the system likelihood and (ii) the MSE of the associated error: $(\Delta B - \Delta B_{wrap})^2$.

We make the following notes about the optimizer of Eq. (20):

(1) We assume $\Delta B$ to be uniformly distributed in the expectation values of Eq. (20). The range of this tissue frequency distribution can be easily determined based on the strength of the main magnetic field of MRI scanner 190 and the anatomy of interest.

(2) Both $\sigma_I(\Delta B)$ and $\sigma_{III}(\Delta B)$ are a function of $SNR_{0,c}$ and $T2^*$. Both of $SNR_{0,c}$ and $T2^*$ are spatially-varying quantities. In order to address this challenge, we only optimize echoes for the minimum expected $SNR_{0,c}$ and $T2^*$ of interest. The design would thus target the "worst-case imaging scenario." Since the optimizer is run offline, once, various imaging scenarios corresponding to different $SNR_{0,min}$, $T2^*_{min}$ and echo time constraint sets $\mathcal{C}_{TE}$ could be tabulated and used at acquisition time.

In an embodiment, at least a portion of pulse sequence parameters 125, are determined at least in part by a random number generator. For example, one or more echo times $TE_k$ may be determined by a constrained random number generator.

Methods

ML-MAGPI Phase Reconstruction

We applied our three-pass ML-MAGPI algorithm outlined above. The reconstruction method in either Pass I or Pass III follows these steps independently in each voxel:

1. The likelihood functions (Eq. (12) and Eq. (15)) are estimated at each echo time and channel. The SNR in each voxel, channel and echo time is approximated by computing the ratio of the magnitude signal to the noise standard deviation in the background region. This ratio approximates $snr_{k,c}$ in Eq. (10) which allows rapid computation of the noise probability distribution [9], phase noise standard deviation [25] and phase wrapping probability distribution [7].

2. The system likelihoods are computed in Pass I and Pass III, by taking the product of the likelihoods functions computed in the step above, according to [13] and [17], respectively.

3. The system likelihoods are maximized. Although the system likelihoods could possess local maxima, the global maximum can be obtained rapidly with "brute force" search methods since the likelihoods are given by a 1-dimensional analytical expression.

4. Given that the likelihoods are guaranteed to have a single global maximum in the optimization step (see Optimizer), the search method is guaranteed to return one single solution.

We performed these computations serially on a personal computer (Mac Pro, dual 3.1G Hz CPU, 8 cores each) using code written in MATLAB. Reconstructing a 256×256 $\Delta B$ map, after running all three passes, took around two minutes. These rapid computations can be further accelerated using the highly parallelizable nature of the voxel-per-voxel approach. Unless otherwise noted, all of the ML-MAGPI $\Delta B$ estimates presented below are those obtained at Pass III.

Prior Art Methods

We compared to the following methods from the literature throughout our experiments below:

i. Phase Difference (PD): This popular method uses a dual-echo approach to combine and estimate ΔB maps (Ref. 20).

ii. Single Echo+Reference: This method is based on a single-echo acquisition along with a separate reference scan (18). The combined phase is subsequently unwrapped and denoised, using standard techniques (Ref. 18).

iii. UMPIRE: This triple-echo MEGE method was shown in Ref. [12] to outperform phase unwrapping algorithms in estimating tissue phase with complex geometries. The UMPIRE echoes are chosen here according to the prescription in Ref. (12), whereby the smallest difference between two echo steps is able to unwrap a maximum tissue frequency buildup of ±125 Hz according to the constraints imposed by the utilized 3D sequence. In order to maintain the same spatial resolution across all methods, we did not employ any spatial denoising with UMPIRE.

iv. Adaptive Combine: This single-echo Siemens product sequence inverts the sensitivity profile of the coil array using SNR-optimal methods described in Ref. (17). This requires the use of a reference scan.

v. Homodyne-Processed Phase: This popular method (Ref. 3) first high-pass filters the complex data (to reduce the contributions from phase-offsets), then the result is coherently added. Clearly, the filtering results in loss of information from the underlying tissue phase of interest.

Simulations

We validated the performance of our proposed ML-MAGPI framework on a modified Shepp-Logan phantom using a 128×128 tissue frequency map, and a corresponding magnitude image with a homogeneous T2* of 40 ms. We simulated a GRE acquisition of this complex-domain object squares) image of the phantom at a short echo time. We computed the frequency map using the following 3D GRE-based methods:

i. 20× Averaged PD with TE1=3.52 ms and TE2=9.38 ms, 20 averages each, TR=20 ms. This method serves as the reference to which we compare our results.

ii. Single Echo+Reference at TE=40 ms, TR=45 ms, with TA=5½ min for both scans. We use the channel-dependent phase-offsets estimated from the 20× Averaged PD scan above as the reference scan.

iii. UMPIRE at TE={6.67, 21.67, 40} ms, TR=45 ms, TA=3 min 09 s.

iv. ML-MAGPI at echo times TE={16.01, 27.51, 34.87} ms, TR=40 ms, TA=2 min 45 s. These echoes were optimized for a $T2^*_{min}$ of 40 ms, $SNR_{0,min}$=28 dB, and $\Delta B_{max}$=125 Hz. The MEGE sequence constraints were $\Delta TE_{min}$=5.82 ms and $TE_{min}$=6.1 ms.

The following were the common pulse-sequence parameters used by all methods above: 3D GRE, FOV=220 (read out)×200 mm$^2$, Nx=256, Ny=232, slice thickness 0.9 mm, FA=15°, BW=240 Hz/pxl. The voxel size in this scan is thus 0.9×0.9×0.9 mm$^3$.

In vivo Study

The brain of healthy volunteers was imaged after approval was obtained from our Institutional Review Board (IRB) and informed consent was given by the subjects. All scans were done on a Siemens Aera 1.5 T with a 20-channel head coil. We acquired three types of scans: (Scan SR) standard-resolution mode, (Scan HR) high-resolution mode, and (Scan HT) standard-resolution mode with half the TR, i.e. half the acquisition time. For each scan type, we collected data using standard single echo GRE sequences, where the phase map was generated using both, the Adaptive Combine technique and the "Homodyne-Processed Phase" method. We also collected these three scans using our ML-MAGPI protocol. The echo times optimized by [19] used $T2^*_{min}$=40 ms, $SNR_{0,min}$=28 dB and $\Delta B_{max}$=125 Hz (as expected with a primary magnetic field strength of 1.5 T in the brain from an MRI scanner). Details of the scans are shown in Table 2.

TABLE 2

In-Vivo Scans

| Scan Type | Single-Echo | ML-MAGPI | parameters |
|---|---|---|---|
| Scan SR | TE = 40 ms, TR = 46 ms, TA = 3.5 min | TE = {26.56, 35.00, 40.91} ms, TR = 46 ms, TA = 3⅔ min | 3D GRE, FOV = 220(r.o.) × 200 mm$^2$, Nx = 256, Ny = 232, Δz = 2 mm, TR = 45 ms, FA = 15°, BW = 240 Hz/pxl, Voxel size = 0.9 × 0.9 × 2 mm$^3$, $\mathcal{C}_{TE}$: $TE_{min}$ = 6.1 ms, $\Delta TE_{min}$ = 5.82 ms. |
| Scan HT | TE = 20 ms, TR = 23 ms, TA = 1⅔ min | TE = {6.73, 14.63, 20.75} ms, TR = 24 ms, TA = 1⅔ min | Same as the SR scan, except with half the TR: TR = 23 ms. |
| Scan HR | TE = 40 ms, TR = 46 ms, TA = 6 min 07 s | TE = {16.18, 27.98, 35.57} ms, TR = 40 ms, TA = 5⅓ min | Same as the SR scan, except with Nx = 448, Ny = 406, voxel size: 0.49 × 0.49 × 2 mm$^3$, $\mathcal{C}_{TE}$: $TE_{min}$ = 7.52 ms, $\Delta TE_{min}$ = 7.00 ms. | using an array of 16-channel receiver coils (Ref. [23]) at different SNRs. We evaluated the performance of our proposed method in reconstructing the tissue frequency map, and compared to some of the literature methods above.

Phantom Study

Figure 13:
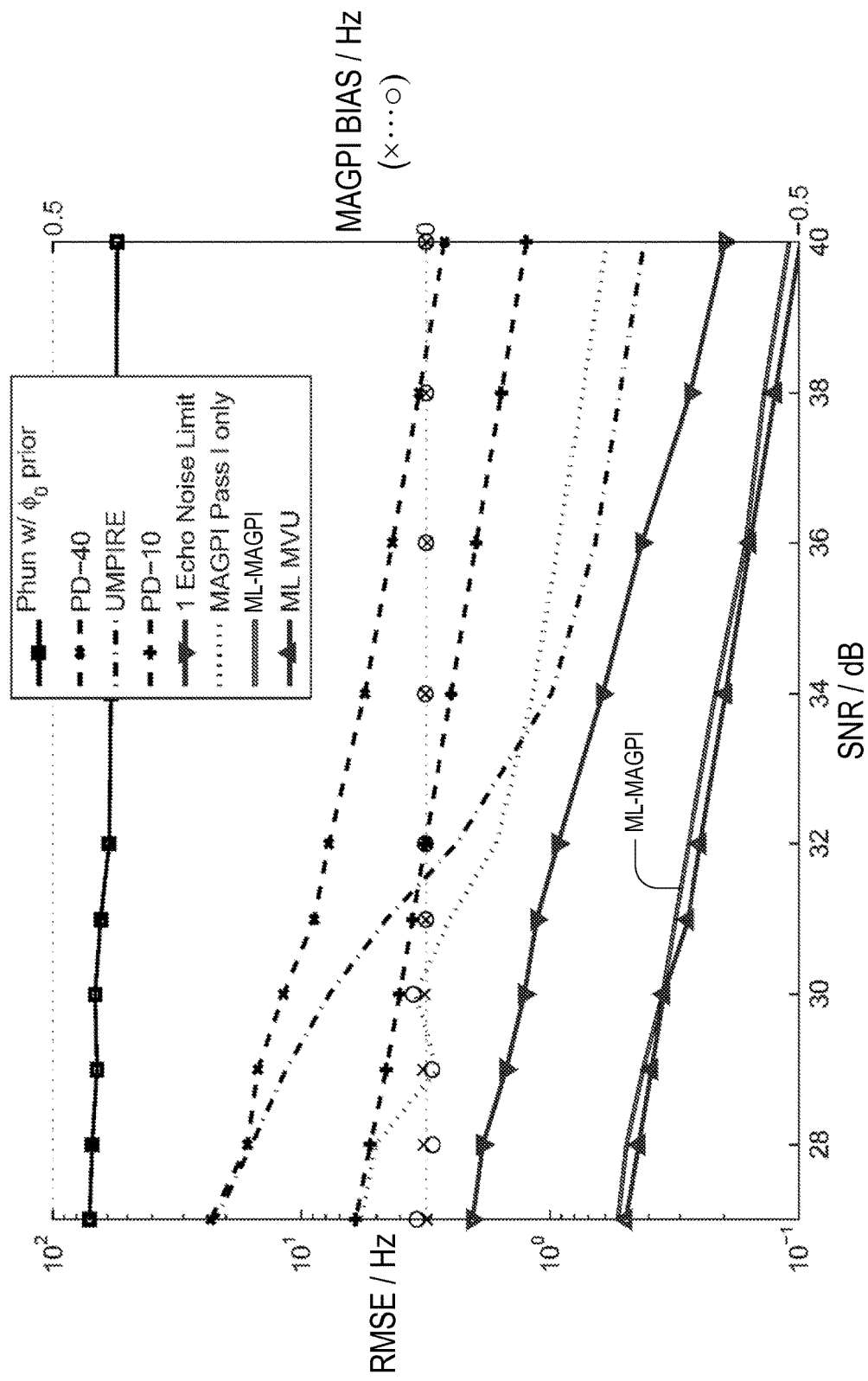
FIG. 13 shows exemplary root-mean-square error (RMSE) of reconstructed tissue frequency as a function of the underlying minimum magnitude-domain signal-to-noise ratio $SNR_{0,min}$ in channel c at TE=0 in an MR phase image, wherein the tissue frequency is reconstructed according to different methods.
Figure 18:
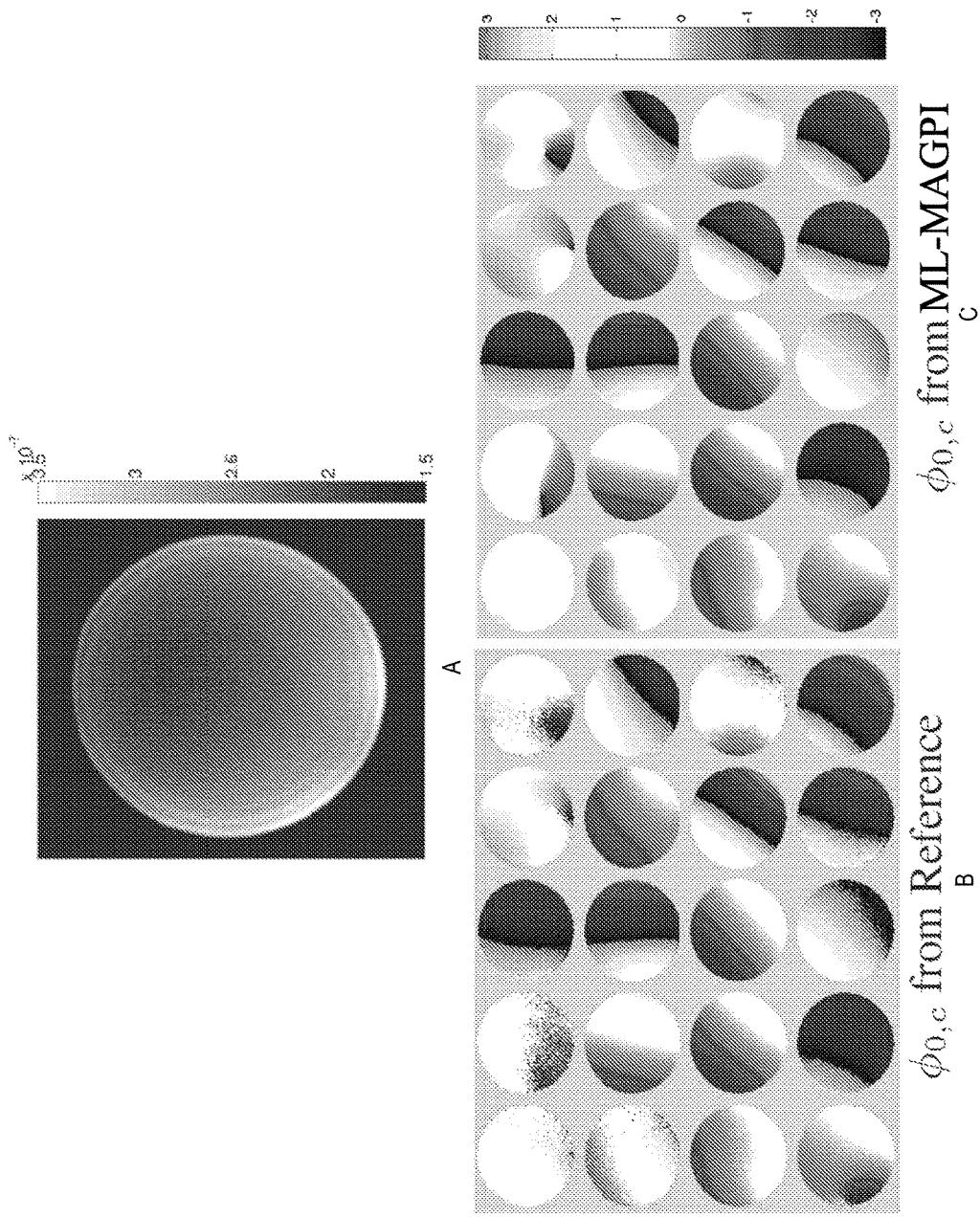
FIGS. 18A-C show exemplary magnitude image and channel-dependent phase offsets of the water phantom of FIGS. 17A and 17B.

We also validated the performance of ML-MAGPI in phantom studies. A water phantom was acquired at 1.5 T on a Siemens Aera scanner using a 20-channel head coil. FIG. 18a shows an example magnitude combined (sum-of- Results, Numerical Phantom We generated thousands of different realizations of ΔB maps, random noise and phase-offset patterns in our numerical phantom. FIG. 13 illustrates a result of Monte-Carlo simulations showing RMSE (log-scale on left) of various ΔB estimates averaged over random realizations of noise, ΔB and $\phi_{0,c}$. The bias in the ML-MAGPI ML estimates is shown on the right axis of the plot using the ○ (Pass I) and × (Pass III) markers. The MVU bound (black line with triangles) and the unbiased results show that ML-MAGPI is an efficient estimator.

We plot in FIG. 13 the RMSE of the reconstructed tissue frequency as a function of the underlying $SNR_{0,min}$ in the image (SNR at TE=0) for the following methods:

PD (dashed lines): two PD methods ((PD-40,x marker) and (PD-10, + marker)) use a 3.5 ms echo step which avoids phase wrapping for frequencies within ±125 Hz. The PD-40 method uses echoes at {36.5, 40} ms. The 40 ms echo is chosen for its utility as a magnitude contrast, while the PD-10 method uses echoes at {6.5, 10} ms.

Single Echo+Reference (solid line with squares) at TE=40 ms. Here, we assume perfect knowledge of the phase-offset maps. Thus, errors in this method are only due to wrapping and noise.

UMPIRE (dash-dotted line) at TE={6.67, 21.67, 40} ms.

ML-MAGPI (dotted line, pass I only) and ML-MAGPI (dark gray solid line), which used TE={16.01, 27.51, 34.87} ms for $SNR_{0,min}$<30 dB and TE={26.56, 35, 40.91} ms for $SNR_{0,min}$>30 dB. The first set of echoes was optimized for $SNR_{0,min}$=30 dB, and the second set for $SNR_{0,min}$=27 dB, both with $T2^*_{min}$=40 ms, and $\Delta B_{max}$=125 Hz.

One-Echo-Limit (solid black line with upside-down triangles): This method assumes (a) perfect knowledge of $\sigma_{0,c}$ and (b) ΔB values that induce no phase wrapping. Thus, the only errors with this method would be due to noise. This constitutes a lower bound on the RMSE obtained with single echo scans.

ML bound (solid black line with right-side up triangles): This is another theoretical lower-bound predicting the lowest RMSE achievable with ML-based methods with K=3 echoes. This bound was derived by numerically computing the Fisher Information.

FIG. 13 shows the RMSE of ML-MAGPI's Pass I only (dotted line) and note that it is always larger than the RMSE of Pass III due to the inherent noise amplification of echo referencing (phase difference) methods. FIG. 13 also plots, on the right axis, the bias in ML-MAGPI's ΔB estimate as a function of SNR for both Pass I (circles) and Pass III (x). This plot asserts that ML-MAGPI is an unbiased estimator of tissue frequency and phase. Finally, we note from this FIG. 13 that ML-MAGPI's RMSE in Pass III is very close to the MVU bound predicted by theory (line with right-side up triangles). This shows that our ML estimation algorithm is efficient. This observation also implies that the errors from Pass I do not propagate to Pass III. This is expected: recall that Pass II selects spatially smooth terms in the residue image from Pass I (channel offsets) and discards high spatial frequency terms. Since the errors in Pass I are only due to random noise fluctuations (no bias), Pass II will inhibit these errors from propagating to Pass III.

Figure 14:
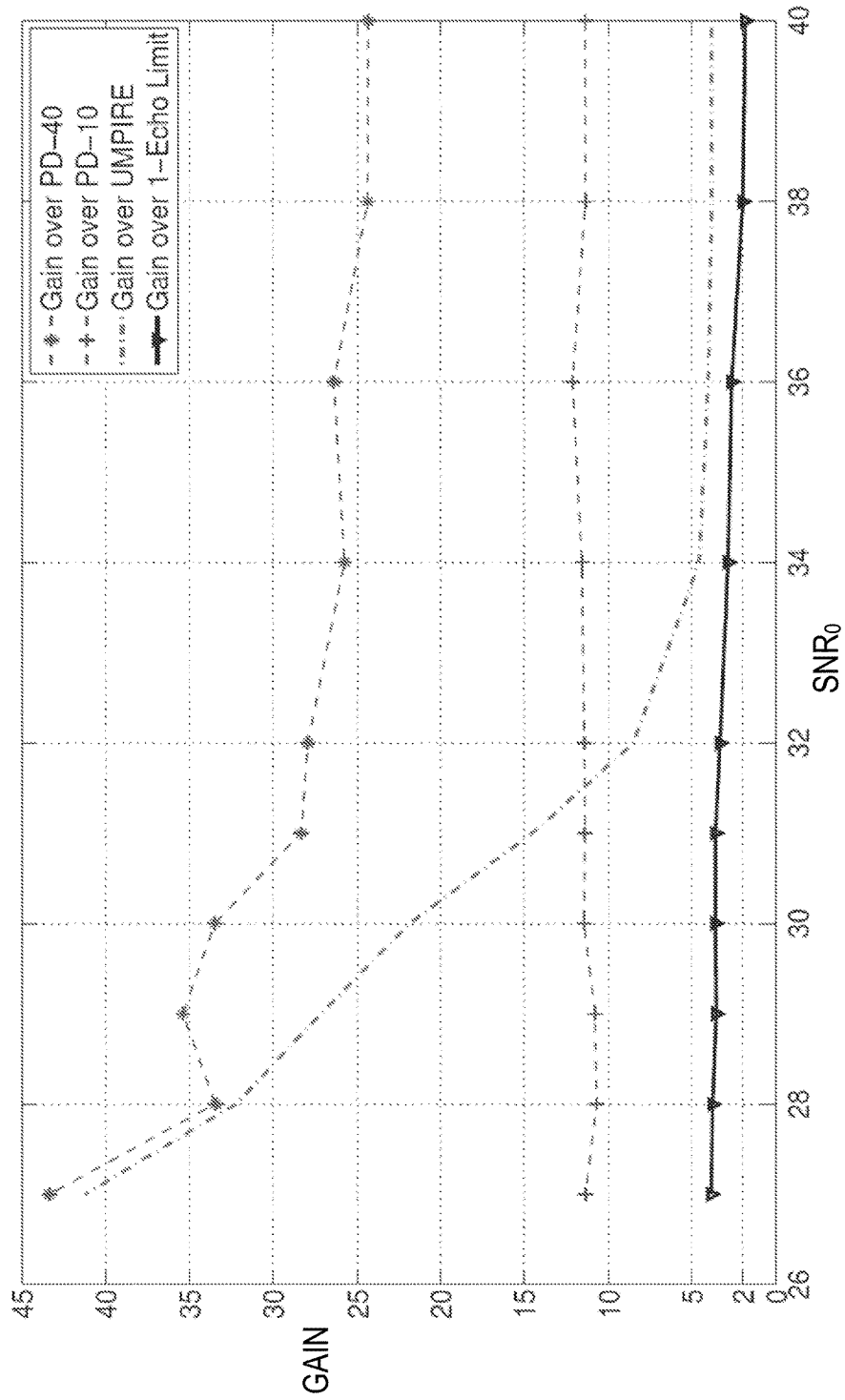
FIG. 14 shows reductions of RMSE of the Phase-Offset-Corrected Maximum AmbiGuity distance for Phase Imaging (ML-MAGPI) methods compared to other methods of FIG. 13, in an embodiment.

The performance gains (RMSE reductions) with ML-MAGPI, shown in FIG. 14, are particularly significant at low SNRs. ML-MAGPI achieves a gain of ~11x (at all SNRs) over PD-10. ML-MAGPI's gains over UMPIRE increases as SNR decreases, ranging from a factor of 3.83 at 40 dB to a factor of 41 at 27 dB. Furthermore, ML-MAGPI outperforms even the lower bound for ideal single echo methods by a factor of 1.81 at 40 dB up to 3.9 at 27 dB.

An example phantom and corresponding estimates obtained with PD-40, UMPIRE and ML-MAGPI at $SNR_{0,min}$=27 dB are shown in FIGS. 15A-15D, respectively, with the corresponding RMSE shown in the sub-captions.

We show example original tissue frequency ΔB in FIG. 15A, reconstructed ΔB in FIGS. 15B-D and corresponding phase-offsets in FIG. 16A. Example ΔB estimates obtained at $SNR_0$ of 27 dB (or SNR(TE=40 ms)=8.23) using: PD-40, RMSE=13.65 Hz (FIG. 15B), UMPIRE, RMSE=18.38 Hz (FIG. 15C), and ML-MAGPI, RMSE=0.61 Hz (FIG. 15D). The tissue frequency map of FIG. 15D is an example of a reconstructed tissue property 354 generated by MR phase reconstructor 300 via refined reconstructed phases 366, which may be determined in step 450 of method 400.

ML-MAGPI also generates an estimate of $\phi_{0,c}$ in FIG. 16B. Phase-offsets are shown as $\angle e^{i\phi_{0,c}}$ between $[-\pi, \pi]$. FIGS. 16A and 16B each include sixteen phase-offset maps corresponding to a channel of the MR measurement simulation.

An $SNR_{0,min}$ of 27 dB, or 22.38 unitless, corresponds to an SNR of 8.23 at TE=40 ms with our T2* of 40 ms. In such a low SNR regime, we see that PD-40 and UMPIRE are not robust, and exhibit noise-induced phase wrapping. ML-MAGPI clearly outperforms both of these methods and is able to correctly recover both low and high ΔB values. In this example, ML-MAGPI achieves RMSE reductions by a factor of 22.37 (over PD-40) and 30.13 (over UMPIRE). The resulting RMSE with ML-MAGPI of 0.61 Hz at such a low SNR is impressive. We also show in FIGS. 16A and 16B an example of the 16-channel phase-offsets used in the simulations and the corresponding estimate obtained using ML-MAGPI at an SNR of 27 dB, respectively.

Results, Real Phantom

Figure 17:
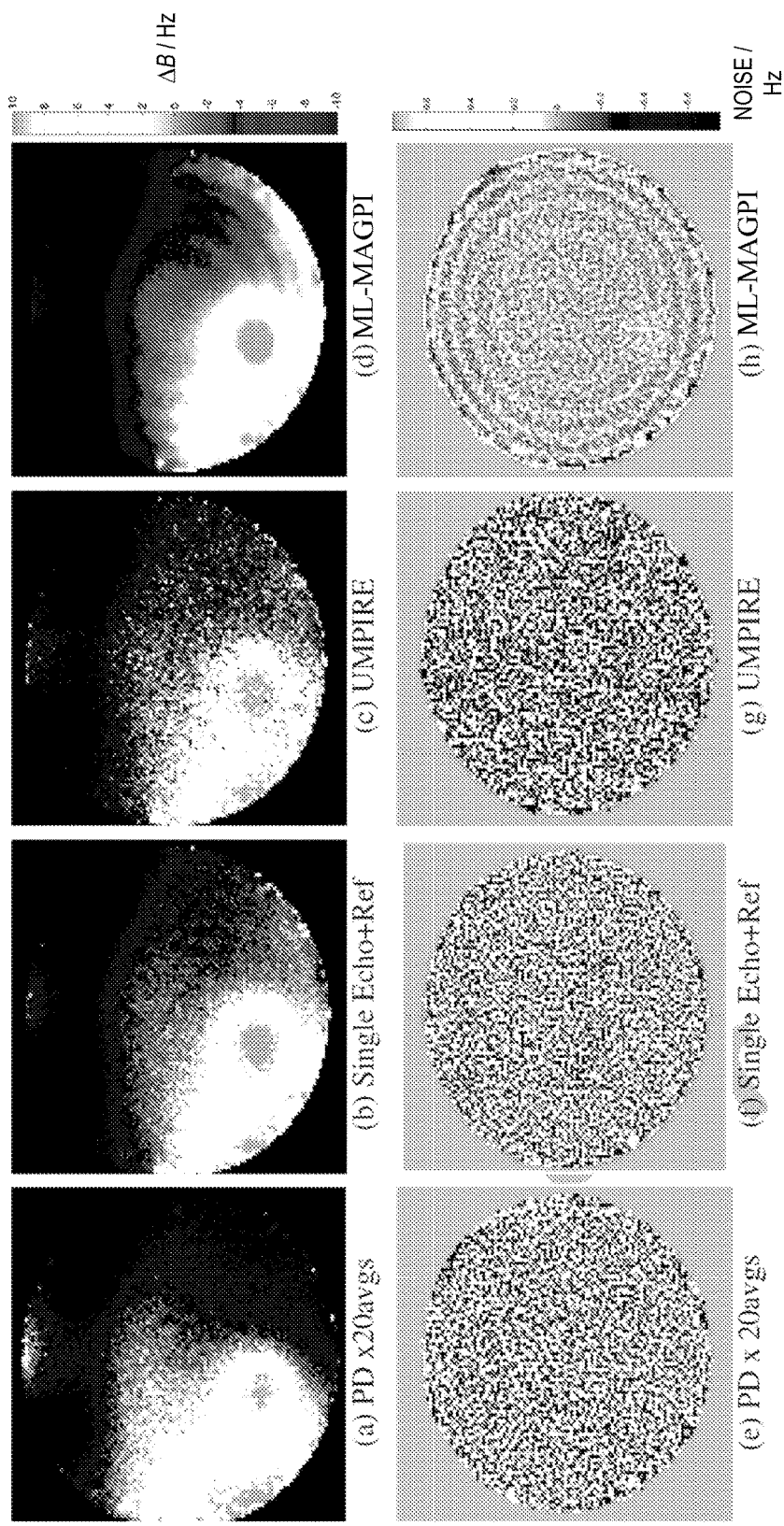
FIGS. 17A-H show exemplary estimated tissue frequency ΔB in a water phantom using various methods.

FIGS. 17A-H show estimated ΔB in a water phantom using PD-10 with 20 averages (a,e), a single echo method which uses PD-10 scan as a $\phi_{0,c}$ reference scan (b,f), UMPIRE (c,g) and ML-MAGPI (d,h). The tissue frequency map of FIG. 17D is an example of a reconstructed tissue property 354 generated by MR phase reconstructor 300 via refined reconstructed phases 366, which may be determined in step 450 of method 400.

The bottom row, FIGS. 17e-h is the remainder after applying background phase removal on images of top row and thus, is a measure of noise content in estimate. All units are in Hz. The noise standard deviation obtained with ML-MAGPI was less than PD-10 (with 20 averages), Single-Echo+Ref, and UMPIRE by factors of 3.95, 3.66, and 7.9 respectively.

The ring patterns detected with ML-MAGPI in FIG. 17H are also present in the magnitude image of FIG. 18a, which shows the magnitude image at an early echo of 3.5 ms reconstructed using standard Sum of Squares method. We elaborate on this observation in the Discussion section.

FIG. 18b shows the 20-channel phase-offsets as estimated using the 20× averaged PD-10 method. FIG. 18c shows the corresponding phase-offsets as estimated with ML-MAGPI.

FIGS. 19A-F show in-vivo frequency maps obtained by each of the Adaptive Combine (first column) and ML-MAGPI (second column) techniques, for Scans SR (row 1), HT (row 2) and HR (row 3). The tissue frequency maps of FIGS. 19(b), 19(d), and 19(f) are an examples of reconstructed tissue properties 354 generated by MR phase reconstructor 300 via refined reconstructed phases 366, which may be determined in step 450 of method 400.

The homodyne-combined frequency images are shown in FIGS. 20A-I. The first column shows results obtained with the single-echo methods, for each of the scan types (across rows). The second column is the result of applying the exact same homodyne filter, as used with the first column, on the ML-MAGPI frequency images of FIGS. 19df.

Discussion

We have presented a novel theory and corresponding method for combining MR phase images, acquired using a coil-array, in an ML-optimal sense. The resulting ML- MAGPI framework designs the acquisition process by engineering a system likelihood for optimal phase SNR in reconstruction.

All our closed-form derivations of probability distributions and likelihood functions were validated through rigorous numerical simulations. We emphasize two observations from the theoretical treatment. First, contrary to common prior art assumptions, the phase noise is inadequately represented by a Gaussian probability distribution (FIGS. 6 and 7), particularly at low SNRs. Second, our derivations show that the probability of obtaining a given wrapping integer is not always uniform over all possible wrapping values (Eq. (7) and FIG. 5). This is due to noise-induced phase wrapping effects at the boundary of the range of $\Delta B$ values.

We have validated the optimality of the ML-MAGPI framework using numerical phantoms (FIGS. 13-16). The results in FIG. 13 show that ML-MAGPI is able to accurately recover the tissue frequency estimate at all SNRs, while overcoming the trade-offs and limitations of other methods. For example, note that the single-echo phase unwrapping method (with no phase-offset phase error) fails to correctly unwrap the tissue phase (despite its assumed ideal reference scan) for our moderately complex phantom geometry.

This is consistent with results reported in Ref. [12]. PD-40 and UMPIRE are not robust, as their performance quickly degrades in the presence of noise. PD-10 outperforms PD-40, as expected, due to its shorter echo times, albeit without the desired magnitude contrast of longer echoes. The lower bound on the RMSE of single-echo methods (line with inverted triangles) shows the expected noise-only trend in the absence of phase errors from phase wrapping and phase-offsets.

The real phantom results are consistent with the numerical simulations. As can be seen from FIGS. 17a-17d, we note a similarity in the $\Delta B$ estimate amongst all methods, yet with a clear SNR improvement obtained with ML-MAGPI. In order to quantify this SNR gain, we removed any smooth background phase variations in the phantom, and displayed the result in FIGS. 17E-H. Since this is a water-only phantom, the result of such filtering process is mainly due to noise inherent in the $\Delta B$ estimate.

The decreased level of noise in ML-MAGPI's estimate (FIG. 17h) is clear. The reported reduction in noise standard deviation (or gain in phase SNR) with ML-MAGPI was a factor of 3.95 over the 20-time averaged PD-10, a factor of 3.661 over Single Echo+Reference, and a factor of 7.9 over UMPIRE. These gains are consistent with our predictions from simulations (FIG. 1.4b at $SNR_{0,min}$ of 32 dB in this water phantom) where the expected gains are: a factor of 12 over PD-10 (for 1 average, or 2.7× with 20 averages), a factor of 3.7 over ideal single-echo methods (such as the Single-Echo+Reference scan in a phantom which has no phase error from phase wrapping), and a factor of 8.1 over UMPIRE. We emphasize here that the acquisition time with ML-MAGPI was the shortest amongst all methods.

We point out the ring structure in the ML-MAGPI image (FIG. 17h). These rings, also visible in the phantom's windowed magnitude image (FIG. 18a), are due to truncation artifacts in 3D. These rings are not discernible in other phase estimation methods, due to being buried within large noise variations. ML-MAGPI is able to overcome these noise limits without spatial smoothing. FIGS. 18b and 18c show the phase-offset in the water phantom as estimated using the PD-10 ×20 averages scan and ML-MAGPI, respectively. Note the similarity between the two estimates.

Figure 19:
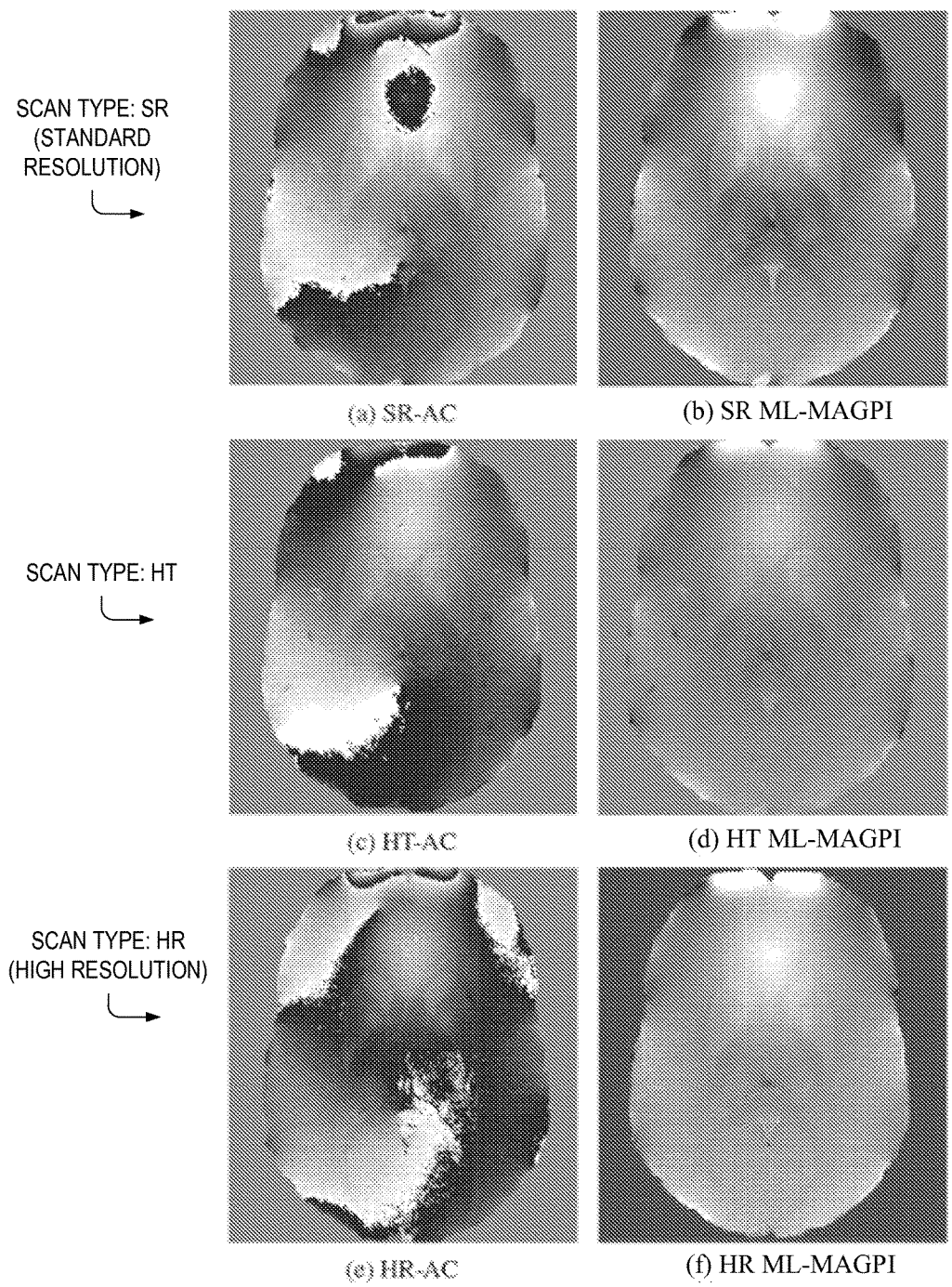
FIGS. 19A-F show exemplary in-vivo frequency maps obtained by an Adaptive Combine method and ML-MAGPI method.

Similar SNR gains are also seen with our in-vivo experiments. FIG. 19 shows that the Adaptive Combine method suffers from severe phase artifacts due to both, inaccurate phase-offset inversion and phase unwrapping errors. ML-MAGPI, however, was able to reconstruct the underlying $\Delta B$ without any artifacts, for all three scan types.

Specifically, FIGS. 19a-f show In-vivo $\Delta B$ maps at 1.5 T (primary magnetic field), at in-plane resolution of 0.49×0.49 mm2, obtained with (left column) traditional single echo methods with Adaptive Combine and (right column) ML-MAGPI. Rows 1-3 represent Scans SR (Standard Resolution), HT ("half time": same as HR with half the TR) and HR (half the voxel size of SR), respectively. Note the wrapping artifacts and phase-offset inversion errors obtained with Adaptive Combine. The ML-MAGPI $\Delta B$ estimates are obtained independently for each voxel (e.g., voxel 143), without any smoothing, phase unwrapping, or inter-voxel dependence of $\Delta B$ estimates. Such tissue frequency estimates are example output of method 400.]

ML-MAGPI's SNR advantage is best visualized in "homodyne" domain, as shown in FIGS. 20A-I. The first column of FIGS. 19A-I corresponds to multi-coil data from first column of FIGS. 18A-F now combined using Homodyne filtering, for each of Scans SR, HT and HR across rows. The second column of FIGS. 20A-I corresponds to ML-MAGPI $\Delta B$ estimates from second column of FIGS. 19A-F filtered using the same homodyne operator as the traditional method. The third column of FIGS. 20A-I is the same as second column, except we used a Bilateral filter instead of the traditional homodyne high pass filter.

Figure 20:
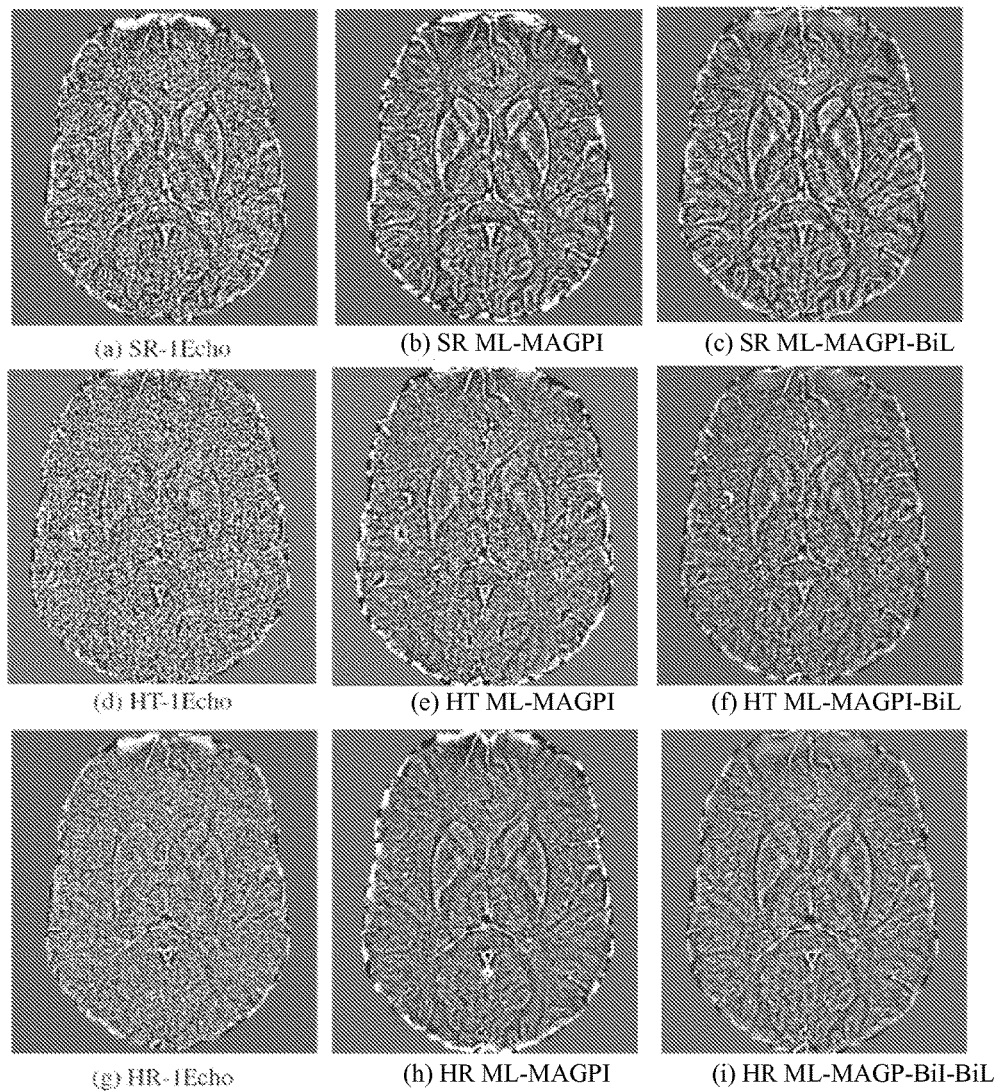
FIGS. 20A-I show exemplary homodyne-combined frequency images of the frequency maps of FIGS. 19A-F.

In Scan SR, the phase SNR gain with ML-MAGPI allows for improved resolution of fine cortical structures and basal ganglia. In Scans HT and HR, ML-MAGPI achieves clear SNR and contrast-to-noise ratio (CNR) gains over the non-diagnostic FIGS. 20d and 20g. Despite the challenging magnitude-domain SNR of Scans HT and HR, ML-MAGPI still allows for improved visualization of deep brain structures with fine delineation of basal ganglia and clear distinction of caudate head and lentiform nuclei from anterior and posterior limb of internal capsule (FIGS. 20e,f and 20h,i). ML-MAGPI+bilateral filter attains improved SNR and CNR gains, without blooming artifacts, compared to ML-MAGPI+homodyne filters (FIGS. 20f,i vs 20e,h). Phase images are scaled here between ±0.5 Hz for Scan SR and ±1 Hz for Scans HT and HR.

The traditional single echo method achieves poor phase SNR, especially in Scans HT and HR. Scan HT is particularly challenging, due to its reduced SNR (short TR) and reduced phase accumulation (short TE). The corresponding homodyne ML-MAGPI images (second column), obtained using the same homodyne filter, show substantially improved phase SNR over the traditional homodyne method for every scan type.

In Scan SR, the phase SNR gain with ML-MAGPI is evident with improved resolution of fine cortical structures and basal ganglia (FIG. 20a vs. 20b). The gain obtained with ML-MAGPI is even higher for Scans HT and HR, which have lower $SNR_{0,min}$ than Scan SR. This is expected from simulations where we showed that the gain of ML-MAGPI over single-echo methods increases as $SNR_{0,min}$ decreases. This gain is translated in Scans HT and HR into improved CNR and ability to identify deep brain structures such as basal ganglia in FIGS. 20e and 20h when compared to almost non-diagnostic FIGS. 20d and 20g, respectively. Note that the high-pass filters with ML-MAGPI are applied directly on the estimated $\Delta B$ maps, rather than in complex domain as is done with single-echo methods. This enables the use of specialized high-pass filters with ML-MAGPI that are better suited at preserving edges with reduced artifacts and noise amplification.

One such filter is the Bilateral filter (Ref. 26), shown in the third column of FIGS. 20a-20i. The bilateral filter achieves similar contrast and SNR gains obtained with homodyne ML-MAGPI, albeit with reduced artifacts (such as blooming and edge effects) especially around cortical regions. We draw attention in particular to FIG. 20f and note its improved phase SNR and comparable contrast compared to the single-echo SR scan of FIG. 20a despite requiring half the latter's acquisition time.

Figure 21:
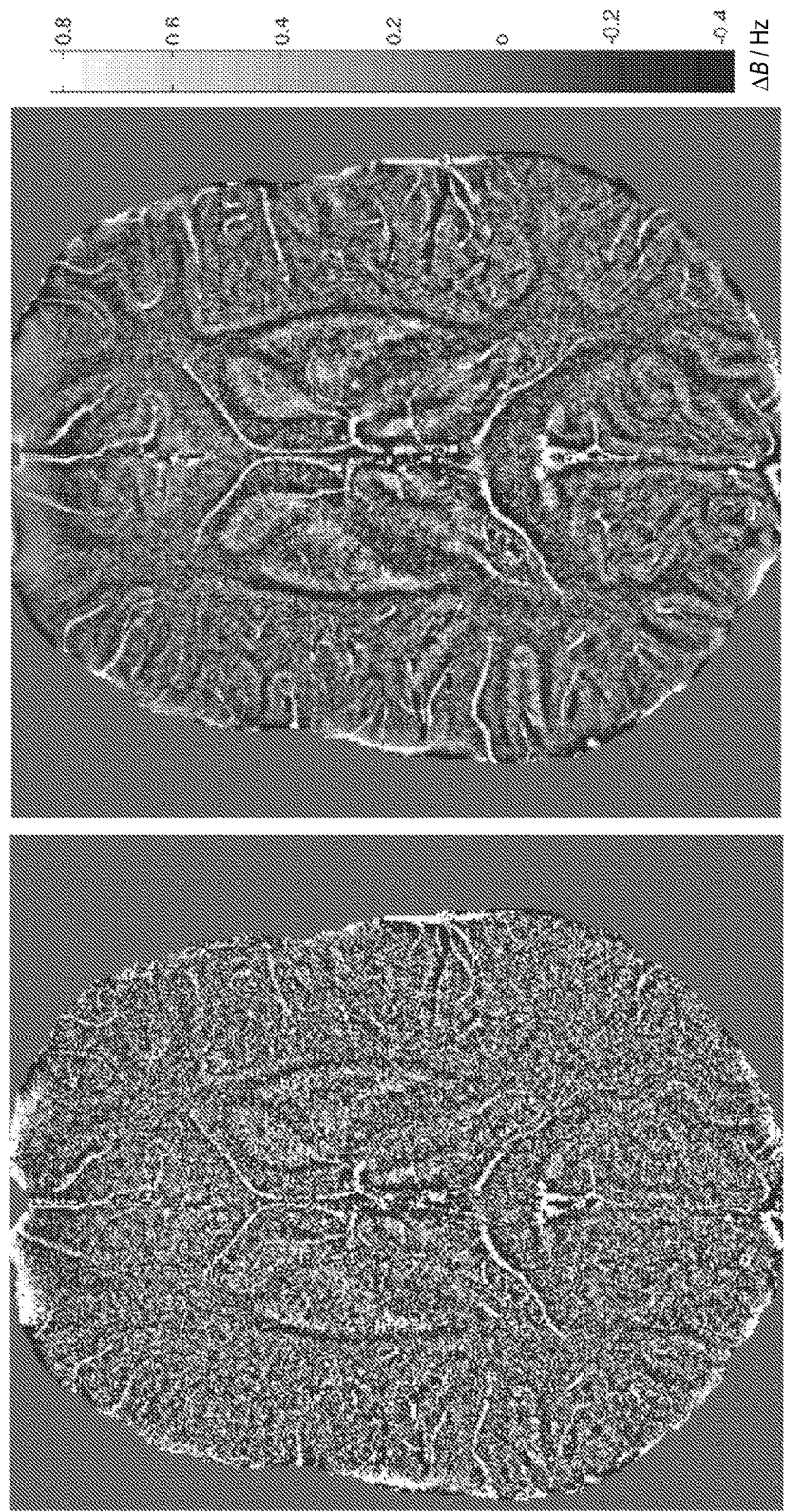
FIGS. 21A and 21B show exemplary high-pass filtered tissue frequency maps from a high-resolution (HR) in-vivo scan.

ML-MAGPI's phase SNR gains in Scan HR are highlighted in FIG. 21, where we show a ΔB estimate combined over a stack of four slices (8 mm slab), using both the traditional single-echo homodyne method (FIG. 21a) and ML-MAGPI+Bilateral filtering (FIG. 21b). The tissue frequency map of FIG. 21b is an example of a reconstructed tissue property 354 generated by MR phase reconstructor 300 via refined reconstructed phases 366, which may be determined in step 450 of method 400.

Using ML-MAGPI, we observe high resolution images at 1.5 Tesla resulting in diagnostic image quality with excellent SNR and CNR as compared to standard single echo methods where accentuated noise clearly impairs definition of fine structural details. The phase CNR and SNR achieved with ML-MAGPI significantly improves the image quality, with excellent white-gray matter differentiation and clear distinction of deep brain structures such as basal ganglia. We emphasize that the acquisition time with ML-MAGPI in this scan was 15% shorter than the traditional single-echo scan, further highlighting the impact of the choice of ML-MAGPI's echo times on the SNR of the phase image.

Finally, the ML-MAGPI framework is fundamentally different from the ML fieldmap estimation method previously presented in Ref. [8] by Funai et al. As shown above, our system likelihoods modulate the inherent phase errors, whereas the likelihood function in Ref. [8] is constrained by phase wrapping and phase-offsets. The following are some practical results of this important difference:

i. The Funai method uses a phase difference method in order to (a) minimize phase wrapping errors and (b) cancel channel-dependent phase offsets. As we have shown here, such an echo referencing approach suffers from inherent noise amplification (Pass I vs Pass III).

ii. The Funai method requires the use of at least one short echo time step size in order to avoid phase wrapping. That further amplifies noise and introduces error propagation onto the long echo steps. The ML-MAGPI framework, on the other hand, engineers phase wrapping as part of the likelihood function to achieve a significant phase SNR advantage.

iii. The work in Funai's paper requires the use of multiple GRE acquisitions in order to accommodate short echo step sizes. ML-MAGPI framework cuts the acquisition time substantially by incorporating purposefully wrapped long echo times into a single MEGE acquisition.

iv. Unlike the ML-MAGPI framework's voxel-per-voxel approach, the Funai method requires spatial regularization. This introduces bias, and increases computation cost, as noted by Funai et.al.

Conclusion

Example 1 discloses a ML-MAGPI framework that enables the design of phase-SNR optimal sequences. The overall advantages of this framework are the following: (1) ML-optimal combination of phase data from multiple receiver coils, without a reference scan; (2) ML-optimal estimation of the underlying tissue phase, without the need for spatial averaging, denoising or phase unwrapping; and (3) dynamic estimation of channel-dependent phase-offsets. The result is an achieved gain in the phase image SNR by up to an order of magnitude compared to existing methods. In particular, the gain over ideal single-echo methods, which are free of wrapping and phase-offset errors, is at least a factor of 3.7 at low SNRs. We have used such gains here to enable higher resolution, higher CNR, and more rapid phase imaging at 1.5 T.

Appendix A: Phase Wrap Probability Distribution

We derive here the probability distribution of the phase wrap integer $r_{k,c}$. We assume here that $\phi_{0,c}=0$, since the channel offsets are generally canceled out in Passes I and III. The analysis could be easily extended to non-zero channel offsets. From Eq. (2) we know that $r_{k,c}=0$ if the sum $(2\pi \cdot \Delta B \cdot TE_k + \Omega_{k,c})$ is always within $[-\pi, +\pi]$. Or, in general, we can express the probability distribution of the phase wrap integer $r_{k,c}$ as Eqs. (23)-(27).

$$P(r_{k,c} = r) = P(-\pi + 2\pi r \leq 2\pi \Delta B TE_k + \Omega_{k,c} \leq \pi + 2\pi r) \quad (23)$$

$$= P\left(-\frac{1}{2TE_k} + \frac{r}{TE_k} \leq \Delta B + \frac{\Omega_{k,c}}{2\pi TE_k} \leq \frac{1}{2TE_k} + \frac{r}{TE_k}\right) \quad (24)$$

$$= \int_{\frac{r}{TE_k} - \frac{1}{2TE_k}}^{\frac{r}{TE_k} + \frac{1}{2TE_k}} (P(\Delta B) * f_{\phi_{k,c}})(\zeta) \, d\zeta \quad (25)$$

$$= \frac{1}{2\Delta B_{max}} \int_{\frac{r}{TE_k} - \frac{1}{2TE_k}}^{\frac{r}{TE_k} + \frac{1}{2TE_k}} d\zeta \int_{\zeta - \Delta B_{max}}^{\zeta + \Delta B_{max}} dt f_{\phi_{k,c}}(t) \quad (26)$$

$$\approx \frac{1}{4\Delta B_{max}} \int_{\frac{r}{TE_k} - \frac{1}{2TE_k}}^{\frac{r}{TE_k} + \frac{1}{2TE_k}} d\zeta \left[ erf\left(\frac{\zeta + \Delta B_{max}}{\sqrt{2}\,\sigma_{k,c}}\right) - erf\left(\frac{\zeta - \Delta B_{max}}{\sqrt{2}\,\sigma_{k,c}}\right) \right] \quad (27)$$

Equation (25) uses the convolution theorem for the sum of two independent random variables. Eq. (26) assumes ΔB to be uniformly distributed between $+\Delta B_{max}$. This assumption makes sense in the absence of prior information about tissue frequency. In these equations, $f_{\phi_{k,c}}(\zeta)$ is the probability distribution of the phase noise ($\phi_{k,c}=\Omega_{k,c}/(2\pi TE_k)$, units in Hz) given by a scaled version of Eq. (9). In Eq. (27), we carry out the integral by approximating $f_{\phi_{k,c}}(\zeta)$ with a Gaussian with the same standard deviation $\sigma_{k,c}$. Finally, using known properties of integral of error functions the final form of the phase wrapping probability distribution in Ref. [7] follows.

We note here that $\sigma_{k,c}$ could also be derived in closed form, and is readily given by Eq. (28), as discussed Ref. [27].

$$\sigma_{k,c}^2 = \frac{1}{4\pi^3 TE_k^2} \exp\left(-\frac{1}{2} snr_{k,c}^2\right) \quad (28)$$

$$\left[\alpha_0 + \sum_{n=1}^{\infty} \frac{\alpha_n}{(2n-1)!!} snr_{k,c}^{2n} + \ldots \sqrt{\frac{2}{\pi}} \sum_{n=0}^{\infty} \frac{\beta_n}{(2n)!!} snr_{k,c}^{2n+1}\right]$$

In EQ. (2), $snr_{k,c}$ is given by Eq. (10), and $\alpha_n$ and $\beta_n$ are closed form polynomials rapidly decaying with n given by Eqs (31-33).

$$\alpha_n = \frac{2n-1}{2n}\alpha_{n-1} + \frac{2\pi}{(2n)^2}\left[1 - \frac{(2n-1)!!}{(2n)!!}\right]; n = 1, 2, \ldots \quad (29)$$

$$\beta_n = \frac{2n}{2n+1}\beta_{n-1} - \frac{2\pi}{(2n+1)^2}; n = 1, 2, \ldots \quad (30)$$

$$\alpha_0 = \frac{\pi^3}{3}, \beta_0 = -2\pi. \quad (31)$$

EXAMPLE 2

Multi-Echo Multi-Receiver MR Phase Reconstruction with Bipolar Acquisitions

Example 2 includes an example of method 400 and an example of instructions 340 of MR phase reconstructor 300. Example 2 also includes examples of the maximum likelihood function of step 434, step 440 of method 400, reconstructed MR phase 362, channel-dependent phase offsets 364, a filtering operation used by phase offset estimator 344, estimation algorithm 347, and refined reconstructed MR phase 366.

Bipolar acquisitions of echoes in one TR allow for shorter inter-echo spacing and higher SNR efficiency than monopolar acquisitions, but introduce an unknown spatially varying phase offset between even and odd echoes. The processing and analysis of the resulting phase data across echoes, already facing phase errors from phase wrapping, noise and channel-dependent phase offsets, is thus made even more challenging.

Prior art methods attempt to estimate this spatially varying even-odd echo offset, $\phi_{eo}(x, y)$, but (a) require additional reference scans, (b) neglect the offset along phase encode directions, (c) make simplifying assumptions about spatial linearity of $\phi_{eo}(x, y)$, and/or (d) do not consider the general problem of imaging with an array of receiver coils [29]. Example 2 discloses a strategy for reconstructing the underlying tissue frequency $\Delta B$ from data acquired with an array of receiver coils using bipolar echoes, without requiring a reference scan, and without making any assumptions about $\phi_{eo}(x, y)$.

The method shown in Example 2 separates tissue frequency, $\Delta B(x, y)$ (and a corresponding tissue phase $\phi_k(x, y)$) from the phase offsets of the receiver coils, $\phi_{0,c}(x, y)$, and the phase offset due to even-odd echoes, $\phi_{eo}(x, y)$.

Methods

Figure 22:
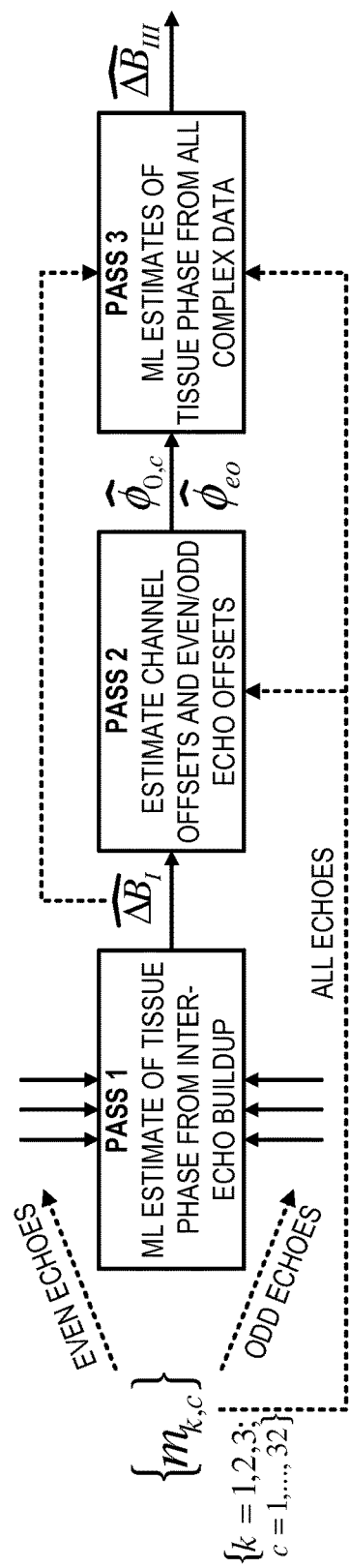
FIG. 22 is a block diagram of a three-pass implementation of ML-MAGPI using a maximum likelihood MR phase estimation method and bipolar acquisitions, in an embodiment.

The proposed phase reconstruction approach is based on a Maximum Likelihood (ML) framework (Example 1) and is described using the three-pass block diagram of FIG. 22. In the first pass, which is an example of step 430 of method 400 and may be implemented at estimation algorithm 343 of MR phase reconstructor 300, raw measurements from all channels $c=1,2,\ldots, NZ_c$ and echoes $k=1,2,\ldots, K$ are separated into two groups: the even echo group and the odd echo group. We then pose the following MLE problem: what is the most likely tissue frequency $\Delta B(x, y)$ that could explain the accumulated angle between even echoes only? The answer to this question does not require knowledge of $\phi_{eo}(x, y)$ nor $\phi_{0,c}(x, y)$: that is because we are only considering phase buildup within echoes of the same polarity. However, phase errors due to phase wrapping and noise are present: we have shown that this maximization problem will have multiple peaks (due to phase wrapping), each with potentially broad peaks (due to noise). We can pose a similar MLE problem for the group of odd echoes: this will yield another set of solutions that have MR phase measurement errors.

We can show that the phase errors from both even and odd echo groups could be removed by constraining the even and odd echo MLE problems to have a consistent solution. This is done formally in Eq. (32), where $\mathcal{L}_{k_1,k_2; c}(\Delta B)$ is the system likelihood of $\Delta B$ being the tissue frequency that could explain the measurements from echoes $k_1$ and $k_2$, and channel c. We have derived this likelihood function in closed form, thus the solution to Eq. (32) is computationally efficient.

$$\widehat{\Delta B}_I = \underset{\Delta B}{\mathrm{argmax}}\left(\prod_{k_1,k_2=1}^{K} \prod_c \mathcal{L}_{k_1,k_2;c}(\Delta B)\right), \quad (32)$$

$$\mathrm{mod}(k_1, 2) = \mathrm{mod}(k_2, 2)$$

$$(\phi_{0,c} + \phi^{mod(k,2)}) = \angle\left\{\sum_k \mathcal{LPF}\left\{m_{k,c}e^{-i2\pi\widehat{\Delta B}_I TE_k}\right\}\right\} \quad (33)$$

$$\widehat{\Delta B}_{III} = \underset{\Delta B}{\mathrm{argmax}}\left(\prod_{k=1}^{K}\prod_c \mathcal{L}'_{k,c}(\Delta B)\right) \quad (34)$$

In Eq. (34), $\mathcal{L}'_{k,c} = P(\psi'_{k,c}/\Delta B)$ and
$\psi'_{k,c} = \angle\left(m_{k,c}e^{-i(\phi_{0,c}+\phi^{mod(k,2)})}\right)$.

Referring to MR phase reconstructor 300, system likelihood $\mathcal{L}_{k_1,k_2; c}(\Delta B)$ may be included in estimation algorithm 343 and is an example of a maximum likelihood function of step 434 of method 400. Reconstructed tissue frequency $\widehat{\Delta B}_I$ corresponds to a reconstructed MR phase $\hat{\phi}_{I_k}=2\pi \widehat{\Delta B}_I TE_k$ for each echo $TE_k$. Reconstructed MR phase $\hat{\phi}_{I_k}$ is an example of reconstructed MR phase 362.

The second pass is an example of step 440 of method 400 and may be implemented in MR phase reconstructor 300 as phase offset estimator 344. The second pass estimates $\phi_{eo}(x, y)$. To that end, we first remove the estimate of the tissue frequency $\Delta B(x, y)$ obtained in Pass I, from the angle of the original complex measurements, $m_{k,c}(x, y)$, as shown on right side of Eq. (33). In Eq. (33), $\mathrm{mod}(k_1, 2)=\mathrm{mod}(k_2, 2)$. Eq. (33) may be implemented as at least part of phase offset estimator 344. Since the ML estimate is unbiased, any remaining phase error in the angle would be due to noise, $\phi_{eo}(x, y)$ and channel-dependent phase offsets $\phi_{0,c}(x, y)$. Channel-dependent phase offsets $\phi_{0,c}(x, y)$ are examples of channel-dependent phase offsets 364. A simple low pass filter operation on this resulting remainder, for every echo and every channel, would then recover a quantity proportional to $R_e = e^{i(\phi_e(x,y)+\phi_{0,c}(x,y))}$ for even echoes, $R_o = e^{i(\phi_o(x,y)+\phi_{0,c}(x,y))}$ for odd echoes. Dividing $R_e$ by $R_o$ and summing over all channels yields an estimate of $e^{i\phi_{eo}(x,y)}=e^{i(\phi_e(x,y)+\phi_{0,c}(x,y))}$.

In the third pass, we refine the tissue frequency estimate obtained in Pass I. The third pass is an example of step 450 of method 400 and may be implemented in MR phase reconstructor 300 as estimation algorithm 347. To refine the tissue frequency estimate obtained in Pass I, Pass III multiplies the original data $m_{k,c}(x, y)$ (such as phase measurements 158 obtained according to step 420 of method 400) by the conjugate of $R_e$ (for even echoes) and the conjugate of $R_o$ (for odd echoes), thereby removing both the channels' phase offset and the even-odd echo offset from all complex measurements. We can thus pose the following ML problem: what is the most likely tissue frequency $\Delta B(x, y)$ which can explain all measurements?

We formulate this problem in closed form in Eqn. (34). Similar to the first pass, the maximization is performed voxel-by-voxel, and thus could be rapidly performed using brute-force search methods. In terms of method 400, reconstructed tissue frequency $\widehat{\Delta B}_{III}$ corresponds to a refined reconstructed MR phase $\hat{\phi}_{III_k} = 2\pi \widehat{\Delta B}_{III} TE_k$ for each echo $TE_k$. Reconstructed MR phase $\hat{\phi}_{III_k}$ is an example of reconstructed MR phase 366. Equation (34) may be implemented as at least part of estimation algorithm 347.

We make this final important note: for arbitrary choices of echo times, the solutions to Eqs. (32) and (34) may not have a single and/or sharp maximum. To address this issue, we have made use of a previously developed method, MAGPI in [1,3], to optimize K (K>2) echoes at which these ML problems have the smallest MVU estimate possible. Details about the optimizer are beyond our scope here.

Acquisition

We collected two 3D MEGE scans on a 3 T Siemens Skyra with a 32-channel head coil. (Herein, "3 T" indicates that the MRI scanner's main magnetic field is 3 Tesla). The first scan used monopolar acquisitions (TR=41 ms), while the second scan used bipolar acquisitions (TR=34 ms), both with K=5 echoes. The following were common scan parameters: 3D FOV 220 (r.o.)×206 mm with forty-eight slices (thickness=2 mm), flow compensation along read-out, and matrix size 256×240. The minimum echo time spacing $\Delta TE_{min}$ achievable with monopolar readout was 5.86 ms whereas $\Delta TE_{min}$ of bipolar echoes was 4.31 ms. The monopolar echo times were TE=9.67, 16.64, 22.50, 28.36, 34.23 ms, whereas the bipolar echoes were: 7.44, 12.3, 16.75, 23.62, 29.37 ms. The echoes were chosen by the ML-MAGPI optimizer discussed above for optimal ML phase reconstruction.

Results

Figure 24:
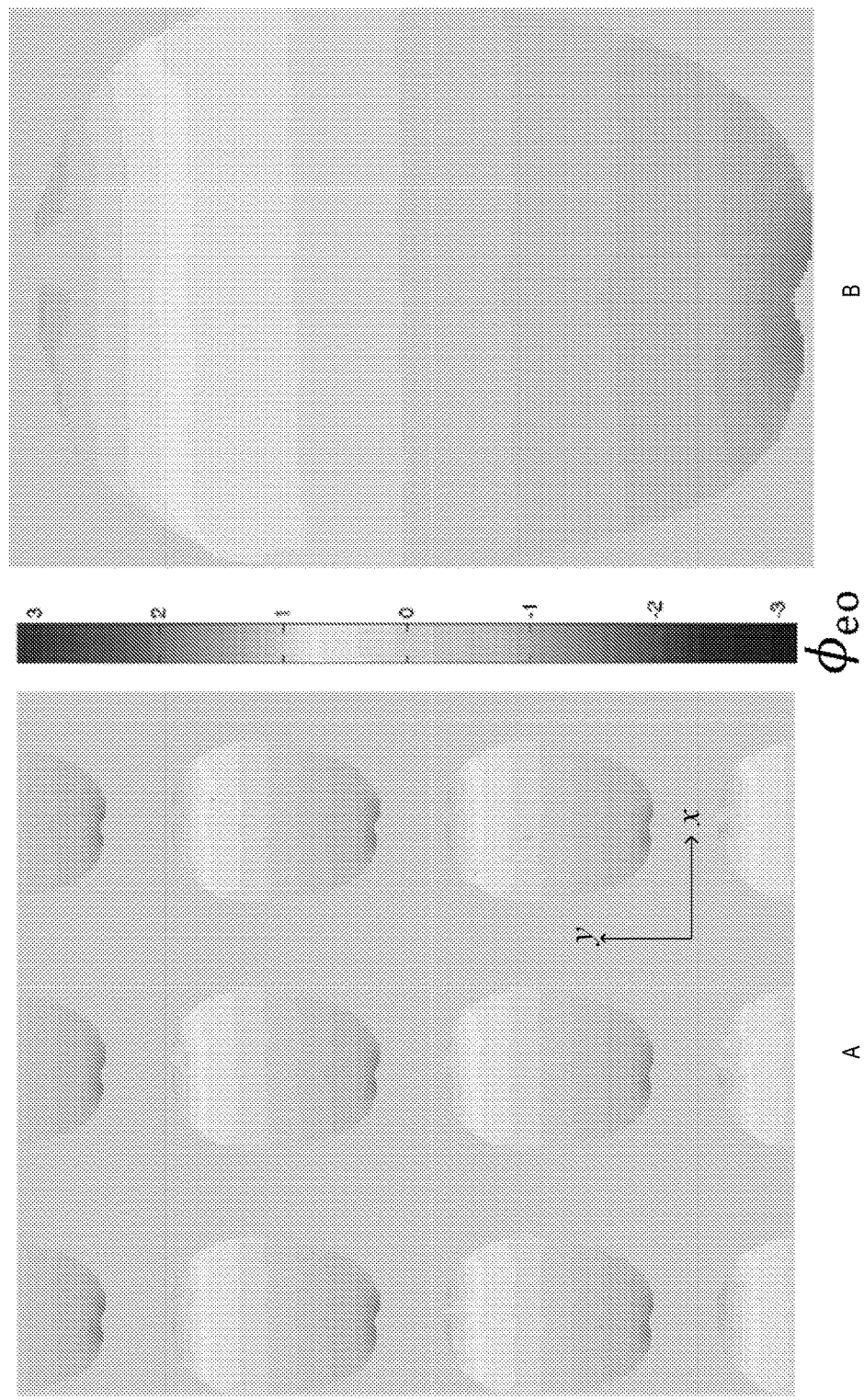
FIGS. 24A and 24B show exemplary estimates of even-odd echo bipolar phase offsets resulting from the method of FIG. 22.
Figure 25:
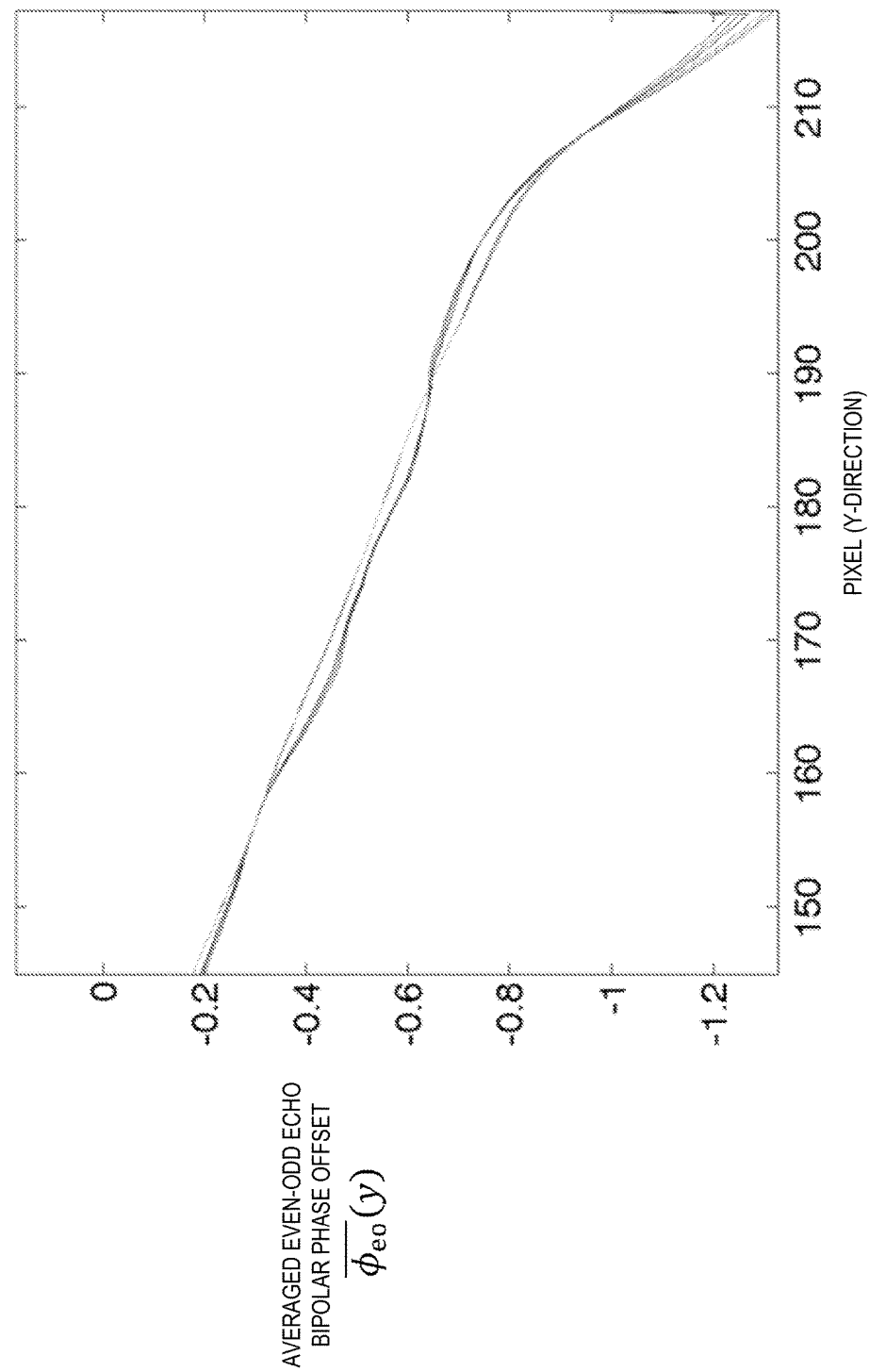
FIG. 25 shows exemplary vertical profiles of averaged even-odd echo bipolar phase offset at different horizontal locations.

FIGS. 23A and 23B show the tissue frequency $\Delta B$ (x, y) obtained with the monopolar and bipolar echoes, respectively. FIG. 24A shows example estimates of the even-odd echo bipolar phase offset $\phi_{eo}$(x, y) obtained before averaging Re/Ro over the thirty-two channels (see Pass II). FIG. 24B shows the resulting averaged even-odd echo bipolar phase offset $\overline{\phi_{eo}}$(x, y) after averaging over coils. FIG. 25 shows vertical profiles through $\overline{\phi_{eo}}$(x, y) at different horizontal locations showing the non-linear profile across the read-out lines.

Discussion

The following two observations indicate the accuracy of our phase estimations with the bipolar acquisition. First, we note the close similarity between the $\Delta B$ estimates obtained with the monopolar acquisition (FIG. 23A) and that obtained with bipolar acquisition (FIG. 23B). Second, the estimates of Re/Ro obtained at each channel are almost identical (FIG. 24A): this is expected since $\phi_{eo}$(x, y) does not change through the channels. This cross-channel consistency was not directly imposed in reconstruction, thereby highlighting the robustness of our framework. Finally, we note from FIGS. 23B and 24 that our method is able to recover arbitrary forms of $\phi_{eo}$(x, y), which display here a non-linear spatial behavior.

EXAMPLE 3

Performance Limits of Maximum Likelihood MR Phase Reconstructions with Primary Magnetic Field at 3 Tesla Example 3 illustrates how to maximize the quality of MR phase images reconstructed using ML-MAGPI framework. Example 3 includes an example of method 400 and an example of instructions 340 of MR phase reconstructor 300.

Example 3 includes examples of reconstructed MR phase 362, channel-dependent phase offsets 364, and refined reconstructed MR phase 366.

Combining phase data acquired from multiple receiver coils is a challenging problem, complicated by phase wrapping, noise and the unknown channel phase offsets [7,3,18]. We have introduced a novel ML framework that addresses the challenges of MR phase estimation using rigorous, and computationally efficient, mathematical treatment. The method described in Example 3 extracts the underlying object's phase image (i.e., tissue frequency $\Delta B$), from a single MEGE scan, without increasing acquisition time. We examine here the performance limits of this framework. Specifically, we show that (1) the minimum number of echoes needed in the MEGE scan depends on the underlying SNR and (2) the phase image quality reaches a plateau after around five to six echoes.

Methods

Figure 26:
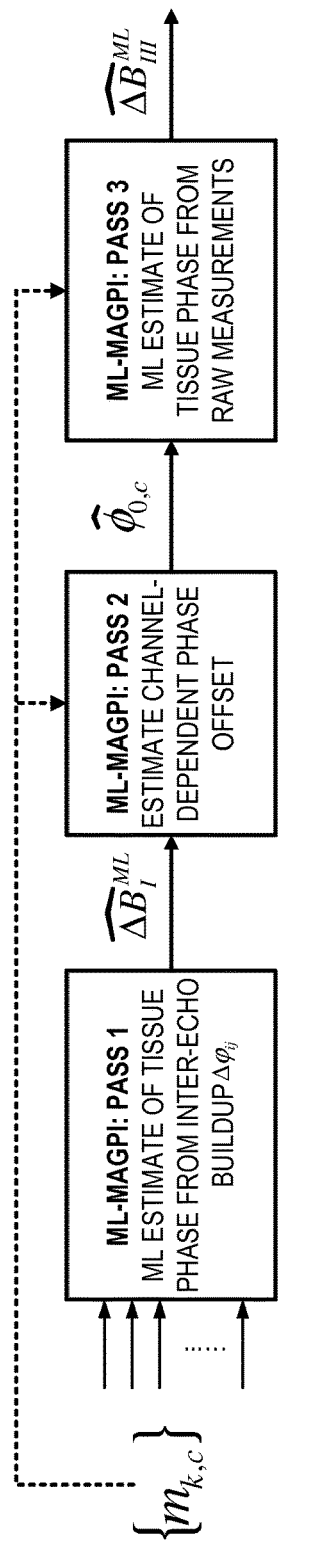
FIG. 26 is a block diagram of a three-pass implementation of an exemplary ML-MAGPI method using a maximum likelihood MR phase estimation method.

We briefly introduce our ML MAGPI framework using the three-pass block diagram shown in FIG. 26 and Equations (35)-(37). Example 1 includes a more thorough discussion of this framework.

$$\widehat{\Delta B}_I = \underset{\Delta B}{\operatorname{argmax}} \left( \prod_{k=1}^{K} \prod_c P(\Delta \phi_{k_1,k_2;c} / \Delta B) \right), \quad (35)$$

$$\phi_{0,c} = \angle \left\{ \sum_k \mathcal{LPF}\left\{ m_{k,c} e^{-i2\pi \widehat{\Delta B}_I TE_k} \right\} \right\} \quad (36)$$

$$\widehat{\Delta B}_{III} = \underset{\Delta B}{\operatorname{argmax}} \left( \prod_{k=1}^{K} \prod_c P(m_{k,c} / \Delta B) \right) \quad (37)$$

Pass I of FIG. 26 is an example of step 430 of method 400 and may be implemented in MR phase reconstructor 300 as estimation algorithm 343. In Pass I, raw measurement $m_{k,c}$ from a collection of echoes k=1,2, . . . , K and channels c=1, 2, . . . , $N_c$, are combined into a single tissue frequency image using MLE according to Eq. (35). This ML step essentially finds the most likely $\Delta B$ that could have given rise to the measured relative angle build-up $\Delta \phi_{i,j}$. The channel-dependent phase offset $\phi_{0,c}$ does not constitute a phase error in this step. Referring to step 430 of method 400, reconstructed tissue frequency $\widehat{\Delta B}_I$ may correspond to a reconstructed MR phase $\phi_k = 2\pi \widehat{\Delta B}_I TE_k$ corresponding to echo time TEk, and may be computed with reconstructed MR-phase estimator 342. Reconstructed MR phase $\phi_k$ is an example of reconstructed MR phase 362. Equation (35) may be implemented as at least part of estimation algorithm 343.

Pass II of FIG. 26 is an example of step 440 of method 400 and may be implemented in MR phase reconstructor 300 as phase offset estimator 344. In Pass II, channel-dependent phase offset $\phi_{0,c}$ is extracted here from the low-spatial frequencies of any remaining phase that is unexplained by the MLE solution of Pass I (Eq. (36)). Channel-dependent phase offsets $\phi_{0,c}$ is an example of channel-dependent phase offset 364.

Pass III of FIG. 26 is an example of step 450 of method 400 and may be implemented in MR phase reconstructor 300 as estimation algorithm 347. Based upon the estimate of $\phi_{0,c}$ from Pass II, Pass III refines the quality of the $\Delta B$ estimate determined in Pass I by asking the following more complete question: what is the most likely ΔB that can explain all measurements (Eq. 39)? Both ML problems of Eqs. (35) and (37) are written in closed form, and are solved numerically as a 1-D search problem, wherein each voxel (e.g., voxel 143) is considered independently. Referring to step 450 of method 400, refined system tissue frequency $\widehat{\Delta B}_{III}$ corresponds to a refined reconstructed MR phase $\phi_k = 2\pi \widehat{\Delta B}_I TE_k$ corresponding to echo time TEk. Refined reconstructed MR phase $\phi_k$ is an example of refined reconstructed MR phase 366. Equation (37) may be implemented as at least part of estimation algorithm 347.

We make this important note: for arbitrary choices of echo times, ML problems (1) and (3) may have multiple maxima (due to phase wrapping), each with potentially broad peaks (due to noise). We have quantified the implications of such likelihood function "attributes" by deriving the MVU bound (not shown here) as a function of the MEGE echo times, underlying SNR, T2* and maximum expected ΔB in the image. We make use of this metric to optimize K echoes so that the corresponding system MVU bound is minimized.

This optimization step is constrained by the echo times attainable with the pulse sequence of choice: these constraints may effectively limit the optimizer from driving the MVU bound arbitrarily small. The set of possible echo times is determined by the minimum echo time, the minimum echo time spacing ($TE_{min}$), and the maximum echo time (function of TR). In Example 3, we explore the impact of the number of echoes K on the achievable MVU bound and quality of MR phase images.

We make use of numerical phantoms and in vivo acquisitions to validate this predicted performance. The acquisition parameters are: 3D MEGE, 32-channel head coil, FOV 220(r.o.)×206 mm, FA=15°, voxel size of 0.86×0.86×2 mm³ with BW=240 Hz/pxl and $TE_{min}$=5.86 ms (Standard Resolution), and 0.4×0.4×2 mm³ with BW=280 Hz/pxl and $TE_{min}$=6.91 ms (High Resolution).

Results

Figure 27:
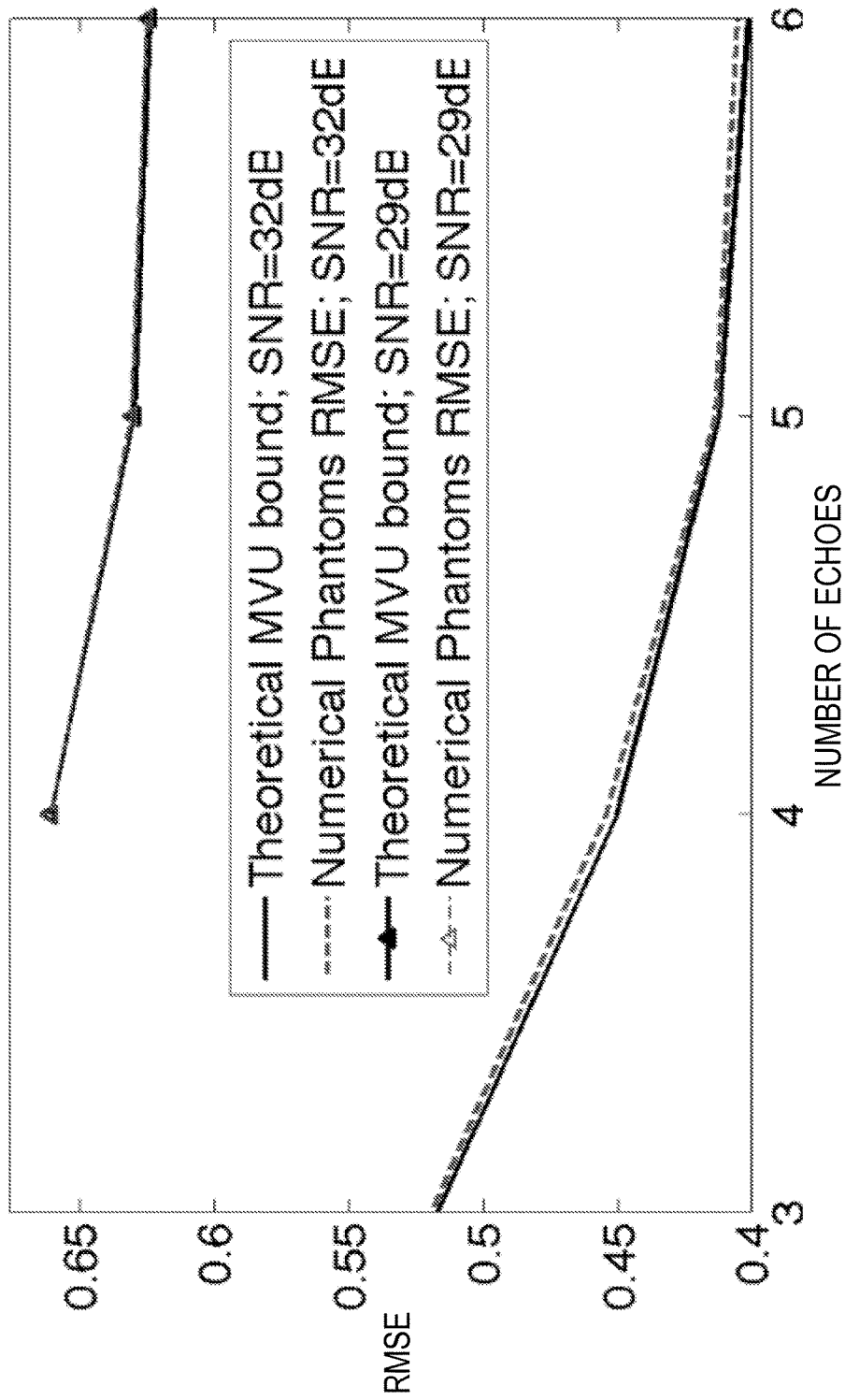
FIG. 27 shows theoretical Minimum Variance Unbiased (MVU) bounds on RMSE and simulated RMSE as a function of number of pulse echoes using the ML-MAGPI method of FIG. 26.
Figure 28:
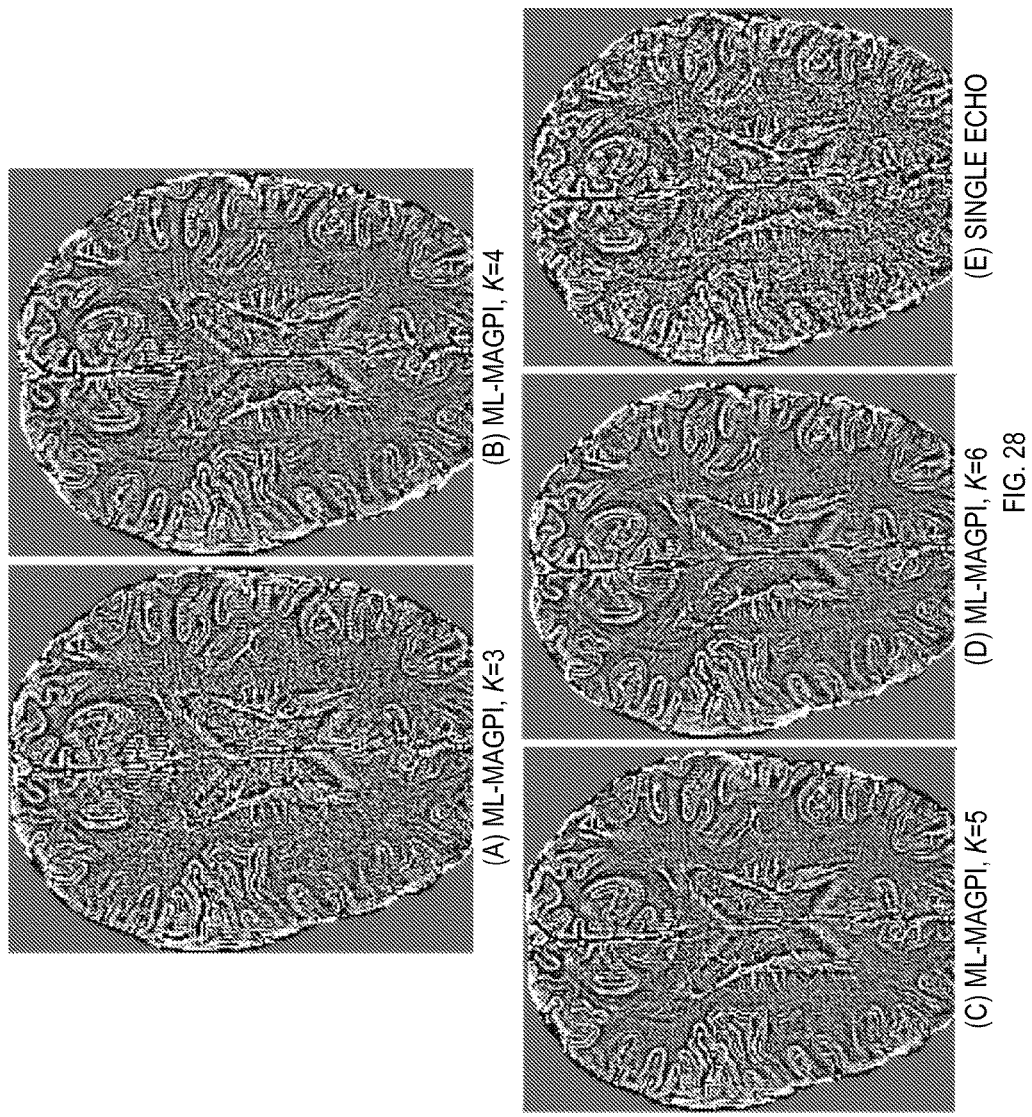
FIGS. 28A-E show exemplary tissue phase maps of a standard in vivo scan computed using the ML-MAGPI method of FIG. 26.
Figure 29:
FIG. 29 shows exemplary homodyne phase obtained with ML-MAGPI at a high resolution scan using five echoes.

FIG. 27 plots the smallest MVU bound predicted by theory (solid line without triangles) as a function of K for SNRs of 29 dB and 32 dB. The dashed line (without triangles) is the actual RMSE obtained with the ML-MAGPI method of Example 3 in a numerical phantom at the echo times prescribed by the optimizer (echoes not shown here). We note (a) the impressive agreement between theory and simulations and (b) the plateau in RMSE reached at around five echoes. We show, in FIGS. 28a-e, the phase map in homodyne domain (discussed in Ref. [26]), at the standard resolution in vivo scan. FIGS. 28a-d shows the phase map obtained with ML-MAGPI at three to six echoes, respectively, with TR=45 ms. FIG. 28e is a traditional single echo scan at TE=35 ms and TR=40 ms. FIG. 29 shows the homodyne phase obtained with ML-MAGPI at the high resolution scan using five echoes. The figure displays the phase over a stack of four slices.

Discussion

Our theory and simulations predict a decrease in phase RMSE as K increases, with a plateau reached around five to six echoes. The data in FIGS. 28A to 28D shows strong agreement with this predicted trend. Importantly, all of the ML-MAGPI phase estimates have superior phase SNR compared to the traditional method FIG. 28E, at roughly similar acquisition times. Another important point from FIG. 27 is that, at low SNRs, the minimum K required for the existence of an MVU bound is four echoes, compared to three echoes at high SNRs. Finally, we can show that the phase SNR gain obtained with ML-MAGPI is maximized at low SNRs: this enables us to see microstructures such as perforator veins and the laminar pattern of cerebral cortical layers in the high resolution FIG. 29.

EXAMPLE 4

A Framework for MR Phase Reconstruction from Multi-channel RF Coils

Example 4 illustrates a method for improving precision and robustness of MR phase images when acquired using an array of receiver coils (channels). Example 4 includes an example of method 400 and an example of instructions 340 of MR phase reconstructor 300. Example 4 includes examples of reconstructed MR phase 362, channel-dependent phase offsets 364, and refined reconstructed MR phase 366.

Combining phase images from multiple channels is a difficult problem hindered by challenges such as phase wrapping, noise and the unknown phase offset between each of the channels [7,18]. We present here a method which reconstructs the underlying object's phase image (i.e., tissue phase), as well as the channels' phase offsets, from a single MEGE scan, without requiring a reference scan [18].

Methods

Figure 30:
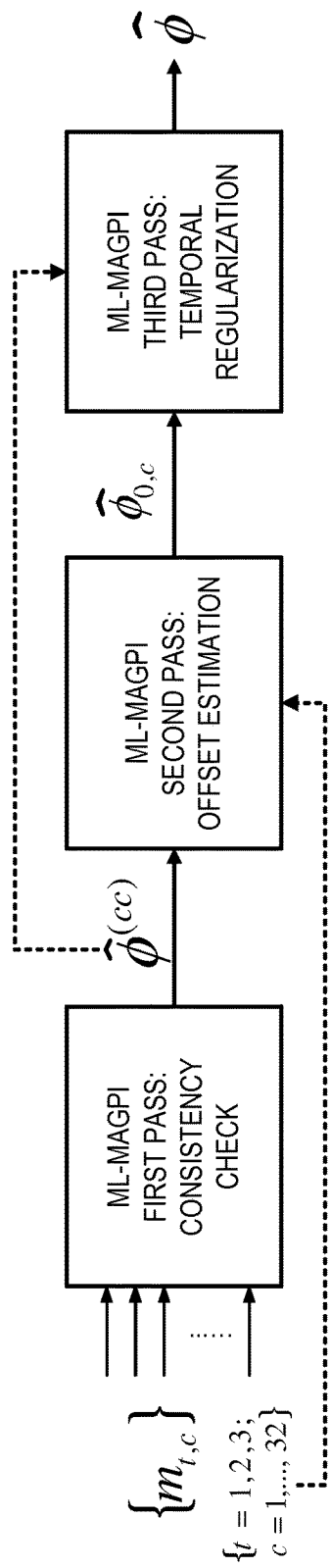
FIG. 30 is a block diagram of a three-pass implementation of an exemplary ML-MAGPI method using a maximum consistency MR phase estimation.

The proposed phase estimator is described using the block diagram in FIG. 30. In pass I of FIG. 30, raw measurements $m_{k,c}$ from all echoes k and all channels c are combined into a single phase image using consistency-check formalism. Specifically, in the formalism of Eq. (38), the reconstructed MR tissue frequency $\widehat{\Delta B}_I^{MC}$ in each voxel 143 of MRI system 100 is chosen such that, for all channels, the linear phase build-up between echo pairs ($TE_1, TE_2$) and ($TE_1, TE_3$) is maximally "consistent" (in an L2-sense). In Eq. (38) α may be any number.

Pass I of FIG. 30 is an example of step 430 of method 400 and may be implemented in MR phase reconstructor 300 as estimation algorithm 343. Referring to method 400, step 430 may determine a reconstructed MR tissue frequency $\widehat{\Delta B}_I^{MC}$, which corresponds to a reconstructed MR tissue phase $\hat{\phi}_{I,k}^{MC}$ for each echo time $TE_k$. Reconstructed MR phase $\hat{\phi}_{I,k}^{MC}$ is an example of reconstructed MR phase 362 and may be computed as at least part of estimation algorithm 343.

Since this minimization step is performed one voxel at a time (i.e., for each voxel independently), rapid brute force 1-D search methods could be used to find the appropriate solution. Note that this step estimates the linear component in the phase build-up that most accurately explains the data across echoes. Any remaining phase $\phi_k^{rem}$ is explained by factors such as noise, channel-dependent phase offset $\phi_{0,c}$ (Eq. (40)), and any non-linear phase component. Referring to method 400, step 440 may determine channel-dependent phase offsets $\phi_{0,c}$ of Eq. (40) using phase offset estimator 344 of MR phase reconstructor 300. Channel-dependent phase offsets $\phi_{0,c}$ are examples of channel-dependent phase offsets 364.

$$\widehat{\Delta B}_I^{MC} = \underset{\Delta B}{\arg\min} \sum_{k_1, k_2} \sum_c \left\| m_{k_1, c} e^{i 2\pi \Delta B (TE_{k_2} - TE_{k_1})} - m_{k_2, c} \right\|^\alpha \quad (38)$$

$$|m_{k,c}| e^{i\phi_{k,c}^{rem}} = m_{k,c} e^{-i 2\pi \widehat{\Delta B}_I^{MC} TE_k} \quad (39)$$

-continued $$\phi_{0,c} = LPF\left\{\sum_k m_{k,c} e^{-i2\pi \widehat{\Delta B}_I^{MC} TE_k}\right\} \quad (40)$$

$$\widehat{\Delta B}_{III}^{MC} = \underset{\Delta B}{\operatorname{argmin}} \sum_{k=1}^{K} \sum_c \|m_{k,c} e^{-i\phi_{0,c}} e^{-i2\pi \Delta B TE_k} - \|m_{k,c}\|\|^\beta \quad (41)$$

In pass II of FIG. 30, the estimator extracts phase offsets from $\phi_{k,c}^{rem}$ simply by assuming that the low-spatial frequencies of $\phi_{k,c}^{rem}$ are mostly attributed to $\phi_{0,c}$, as shown in Eq. (39) and Eq. (40). Pass II is an example of step 440 of method 400 and may be implemented in MR phase reconstructor 300 as phase offset estimator 344.

In pass III of FIG. 30, we "refine" the reconstructed MR phase estimate of the first pass by using temporal regularization, shown in Eq. (41), which yields a refined reconstructed MR phase estimate $\hat{\phi}_{III}^{MC}$. This is achieved by first removing the offset estimate obtained in pass II, and then finding the linear phase signal (across echo time) which minimizes the norm of any remaining phase signal. Pass III is an example of step 450 of method 400 and may be implemented in MR phase reconstructor 300 as estimation algorithm 347. Referring to method 400, step 450 may determine refined reconstructed MR phase $\hat{\phi}_{III}^{MC}$, which corresponds to echo time TE1 Refined reconstructed MR phase $\hat{\phi}_{III}^{MC}$ is an example of refined reconstructed MR phase 366 and may be computed as at least part of estimation algorithm 347. Referring to Eq. (41), exponent β may be any number.

Ignoring any non-linear phase variations across time, this remaining signal is solely attributable to noise. Similar to the first pass, this minimization is performed for each voxel independently, and thus could be rapidly performed using brute-force search methods.

We make an important observation here: the minimization metric of Eq. (38) of the first pass would normally have multiple solutions, due to phase errors from both phase wrapping and noise. Such phase errors in phase have been quantified in closed-form in our earlier work [7]. There, we showed that an optimal choice of three echo times results in minimum overlap between PAFs, and thus maximum information about the original phase's value.

In Example 4, we use the ML-MAGPI optimizer described in Example 1 and Ref. [7] to design echo times that guarantee no overall phase error from phase wrapping (despite using long echo time spacing), and minimal phase error from noise. We tune the ML-MAGPI optimizer according to the constraints of the sequence of interest (minimum echo time, minimum echo spacing, bandwidth, etc.). The resulting three echoes (8.13, 15.15, 24.53 ms) guarantee an RMSE of 1.8 Hz over a dynamic range of phase values between [−200,200] Hz. This implies that the search method in the third pass (Eq. (41)) needs only to explore a neighborhood defined by the expected error in the first phase estimate ($\hat{\phi}^{MC}\pm 1.8$ Hz). Finally, we note that reconstructing one voxel with our method requires ~1.3 ms on a personal computer with MATLAB.

We compare phase images reconstructed using the method shown in FIG. 30, and using a MEGE scan to Siemens product phase images reconstructed from a GRE acquisition on a 3T Skyra. The common parameters for both scans were the following: 3D FOV of 256×192 mm with 64 slices, flow compensation along read-out, matrix size 512× 384, yielding a voxel size of 0.5×0.5×2 $mm^3$, TR=31 ms, BW=330 Hz/pxl. The MEGE ML-MAGPI echoes were at 8.13, 15.15 and 24.53 ms. The GRE echo was at 25 ms. We emphasize that the ML-MAGPI MEGE scan takes as long as acquiring one GRE.

Results

Figure 31:
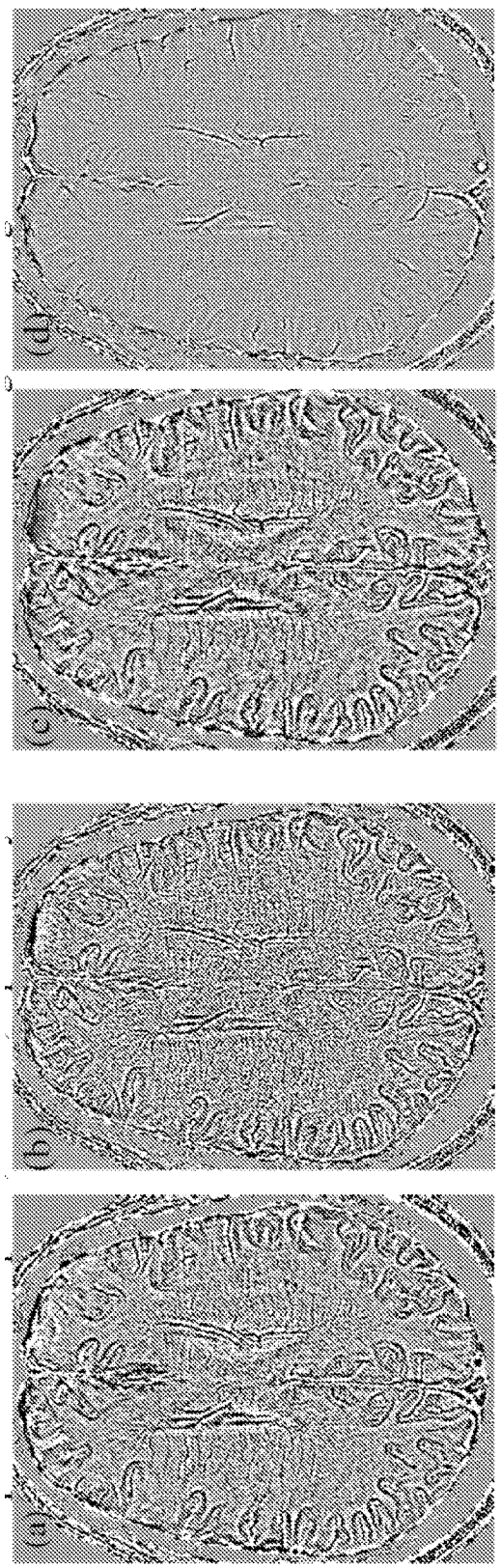
FIGS. 31A-D show exemplary high-pass filtered MR phase images acquired using the ML-MAGPI method of FIG. 30.

FIGS. 31a-d illustrate the resulting phase images shown with different levels of high-pass filtering (between ±0.5 Hz) to display tissue variations of interest. In FIGS. 31(a)-(b) images are high pass filtered using the "homodyne" filter [2] while in (c)-(d) images are high pass filtered using the bilateral filter [3]. In (a)-(c) the filters operate on the phase obtained with the ML-MAGPI estimator, while in (b)-(d) the filters operate on product images from the scanner. The commonly acquired phase (b) is noisier here due to our higher (more rapid) readout bandwidth. The channel offsets are not shown, due to space limitations.

Table 3 lists the CNR as computed around cortical and venous regions in various slices. Regions of interest were picked around cortical boundaries in a similar way as in Reference [3]. We list two CNRs for each ROI/method, each corresponding to the CNR obtained with homodyne [3] (FIG. 31a-b) and bilateral [26] (FIG. 31c-d) filters, respectively.

TABLE 3

Contrast-to-Noise ratio in different regions of interest & slices

|  | ROI-1 | | ROI-2 | | ROI-3 | |
| --- | --- | --- | --- | --- | --- | --- |
| ML-MAGPI (homodyne \| bilateral) | 2.77 | 3.75 | 3.74 | 2.67 | 2.62 | 2.64 |
| Dicoms (homodyne \| bilateral) | 0.37 | 0.51 | 1.54 | 1.06 | 1.24 | 0.91 |

|  | ROI-4 | | ROI-5 | | ROI-6 | | ROI-7 | |
| --- | --- | --- | --- | --- | --- | --- | --- | --- |
| ML-MAGPI (homodyne \| bilateral) | 3.26 | 2.72 | 2.73 | 2.60 | 1.10 | 1.25 | 3.84 | 2.37 |
| Dicoms (homodyne \| bilateral) | 2.01 | 1.45 | 0.60 | 0.63 | 0.2 | 0.15 | 1.37 | 0.79 |

Discussion

We note the gain in the quality and robustness of phase images as obtained with ML-MAGPI. In addition to a clear improvement in visual quality, particularly at small phase values, we also observe gains in CNR with factors as high as 8 in some ROIs. The average gain in CNR obtained with ML-MAGPI over all ROIs was around a factor of 4. We also note the performance of the commonly-used homodyne filter, which suffers from blooming artifacts in regions with large contrast variations (e.g., cortical regions around the boundary). The bilateral filter, applied directly in phase domain, resolves these artifact issues [3] at the expense of a reduction in CNR. This contrast reduction is particularly seen with the DICOM phase (FIG. 28D) where large noise (low CNR) reduces the bilateral filter's edge preservation capacity and "amplifies" its de-noising component. ML-MAGPI phase, however, is particularly well-suited to bilateral filtering where edge information is enhanced without artifacts and noise amplification.

EXAMPLE 5

Susceptibility Weighted Imaging from Improved Phase Estimation

Susceptibility-Weighted Imaging (SWI) uses the phase of the MR signal to add contrast information onto the underlying magnitude image. This example illustrates how to improve the contrast of SWI and reduce its artifacts.

Methods

At the core of our method is a joint phase acquisition/estimation method, similar to the method described in Example 4. For the sake of completeness, however, we summarize the method briefly using the block diagram of FIG. 32. In a first pass, MEGE measurements from three echoes and thirty-two receiver coils (channels) are combined into a single phase image using consistency-check formalism using Eq. (38). This first pass is an example of step 430 of method 400 and may be implemented in MR phase reconstructor 300 as estimation algorithm 343.

In the second pass, our estimator uses Eq. (39) and (40) to extract phase offsets from the remaining phase that does not satisfy the consistency check. The second pass is an example of step 440 of method 400 and may be implemented in MR phase reconstructor 300 as phase offset estimator 344. The third pass uses Eq. (41) to refine the phase estimate of the first pass by using temporal regularization. This is achieved by first removing the offset estimate obtained in pass two, and then finding the linear phase signal (across echo time) which minimizes the norm of the noise phase signal. The third pass is an example of step 450 of method 400 and may be implemented in MR phase reconstructor 300 as estimation algorithm 347.

Figure 32:
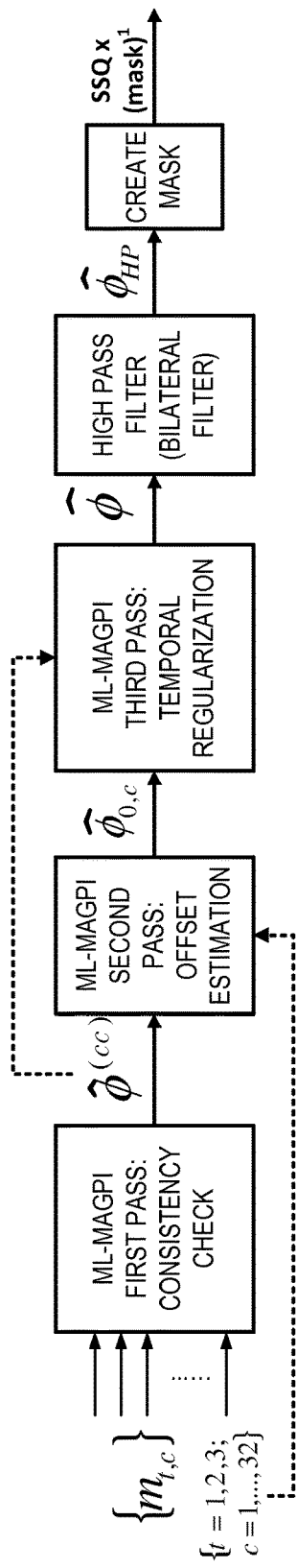
FIG. 32 is a block diagram of an exemplary ML-MAGPI method using temporal regularization.

The choice of the K=3 echo times is critical to the performance the method shown in FIG. 32, as the three echo times completely determine error contributions from phase wrapping and noise present in each of the passes. We use formulation presented in Example 1 where we showed that an optimal choice of K=3 echo times results in minimal phase error from phase wrapping (despite using long echo time spacing) and noise. We tune the ML-MAGPI optimizer according to the constraints of the sequence of interest (minimum echo time, minimum echo spacing, bandwidth, etc.) The resulting three echoes (6.36, 12.50 and 20.71 ms) guarantee an RMSE of 1.8 Hz over a dynamic range of phase values between [−200,200] Hz.

Once the phase estimate is obtained, we follow the standard SWI processing chain of Ref. [26] with the following modification: instead of high-pass filtering the phase using a homodyne filter in the complex domain, we use a bilateral filter [28] applied directly on the phase data. We emphasize that the phase processing method of FIG. 32, does not utilize spatial phase unwrapping, and is computationally efficient, as it is able to reconstruct the phase voxel-by-voxel (i.e., for each voxel independently) in around 1.3 ms/voxel (MATLAB on a personal computer).

Data Acquisition

We acquired data on Siemens 3T Skyra from a fifty-eight year-old male with history of left cerebral glioma (status post-surgical resection). We used two flow compensated 3D MEGE scans, each at a 1×1 mm in-plane resolution, and 2 mm slice thickness, TR=26 ms, BW=240 Hz/pxl. The first scan acquires one echo at 20.71 ms, while the second scan acquires three echoes as prescribed by ML-MAGPI above. Both scan times have the same duration.

Results

Figure 33:
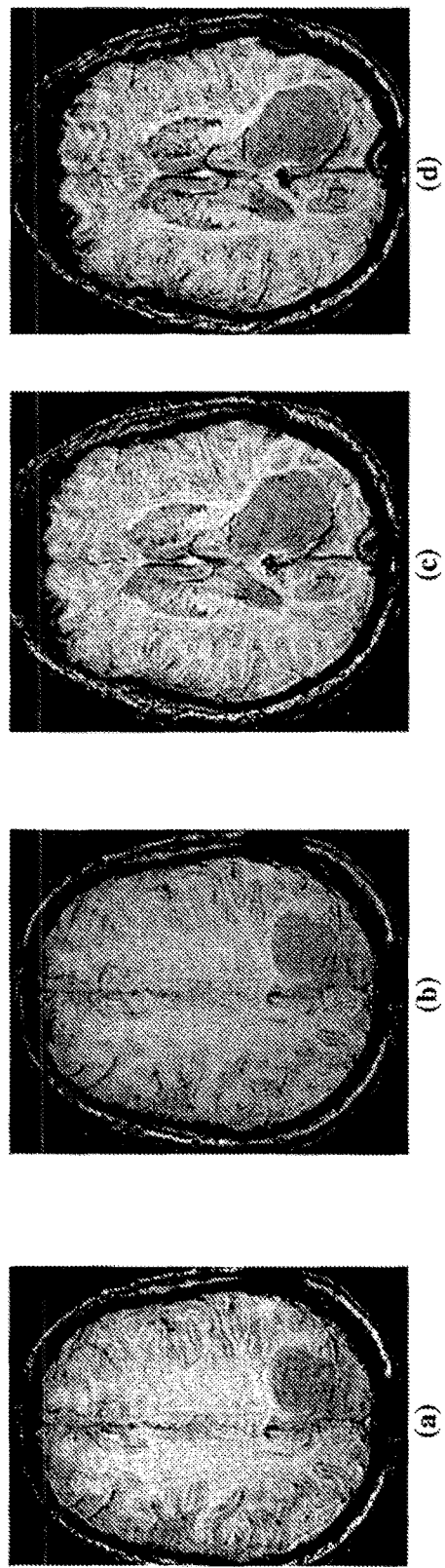
FIGS. 33A-D show exemplary susceptibility weighted imaging (SWI) images as obtained with the ML-MAGPI phase estimation/high-pass filtering process of FIG. 32.

FIGS. 33a and 33c show two SWI images in two slices, as reconstructed using our proposed ML-MAGPI method described in FIGS. 32. FIGS. 33b and 33d are the corresponding images as reconstructed by the Siemens SWI product. Note the thin but sharp hemosiderin staining along the resection bed in ML-MAGPI images. Also, the susceptibility artifact related to surgical hardware is significantly decreased on ML-MAGPI images. Finally note the sharpness of brain-calvarium interface at the orbito-frontal region where the susceptibility artifact is notoriously limiting.

Discussion

One important step in SWI is extracting high-pass information from the reconstructed phase image. The challenges associated with this step are (1) noise amplification (2) edge preservation and (3) phase wrapping. These factors are known to cause significant artifacts, particularly with more aggressive high pass filtering, such as blooming, ringing and edge elimination. These artifacts are compounded by the masking process in SWI, where a phase-mask (derived from the high-pass filter) repeatedly multiplies the magnitude image. It is therefore important for the high pass filter to operate on phase data with high CNR so as to only amplify/boost edge information, and reduce noise contributions. Our MEGE ML-MAGPI acquisition is able to improve the CNR of phase, as documented in Ref. [7], and hence enable us to use more aggressive high pass filters directly in phase domain. In fact, our method is able to achieve SWI contrast shown in FIGS. 33a and 33c using only one multiplication with the phase mask (instead of the traditional four multiplications). This results in reduced noise-amplification with our technique. Furthermore, the ability to estimate phase using earlier echoes in the MEGE scan, enables our method to reduce the artifacts of susceptibility-induced signal drop, noise amplification, and blooming artifacts.

EXAMPLE 6

MR Thermometry

MR Thermometry is the measurement of temperature using an MRI scanner. MR Thermometry enables noninvasive temperature monitoring of a subject, for example, a patient receiving localized thermal therapy (a.k.a. hyperthermia) for treatment of cancer. Extracting temperature from MR phase data is known in the art, as discussed in Ref. [4], for example. Example 6 compares temperature measurements of water and an agar gel made with conventional methods and those made with the ML-MAGPI method described in Example 1.

Figure 34:
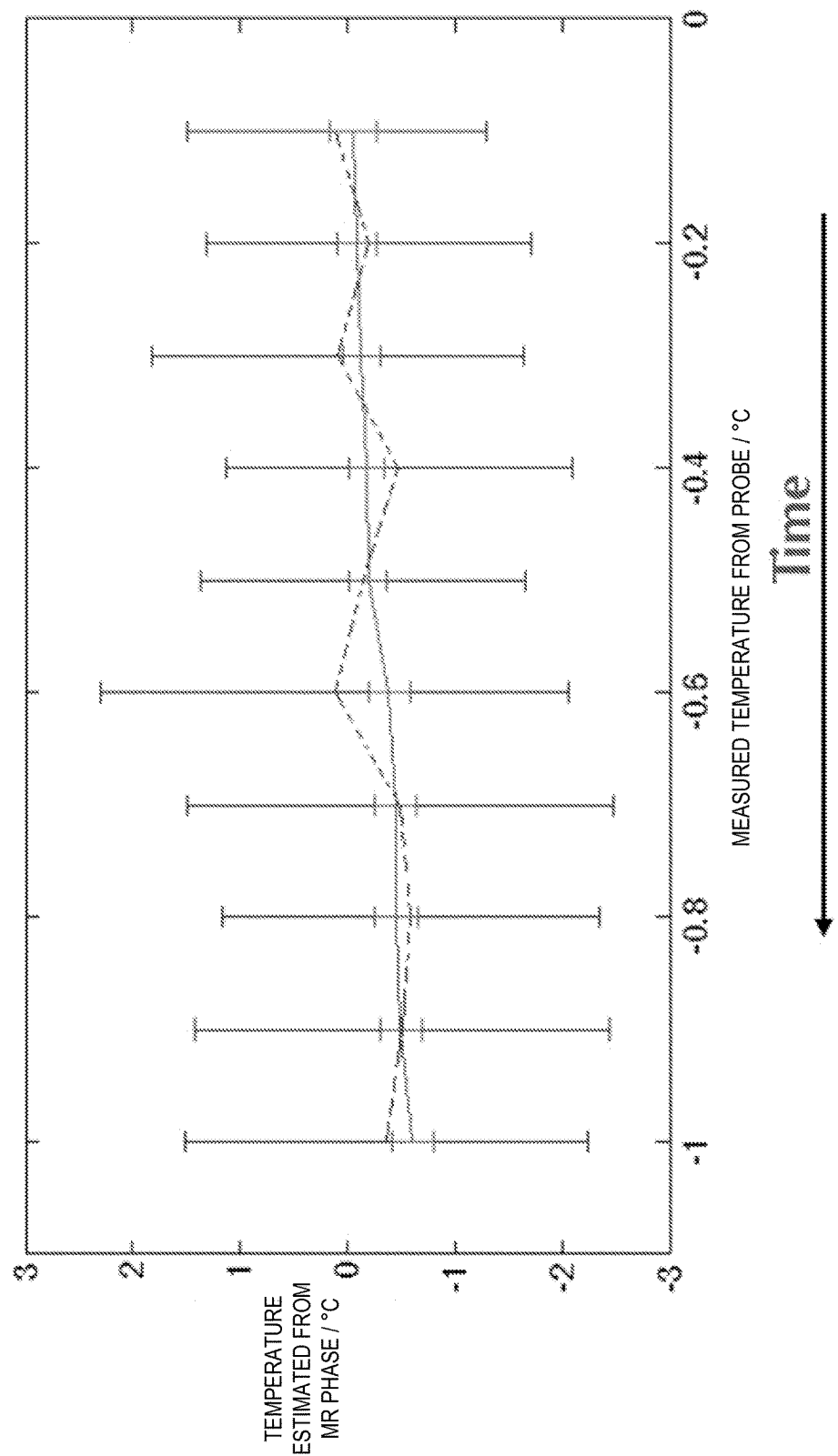
FIG. 34 shows representative MR thermometry measurements of ice water using (a) a traditional MR phase reconstruction method and (b) a ML-MAGPI method.
Figure 35:
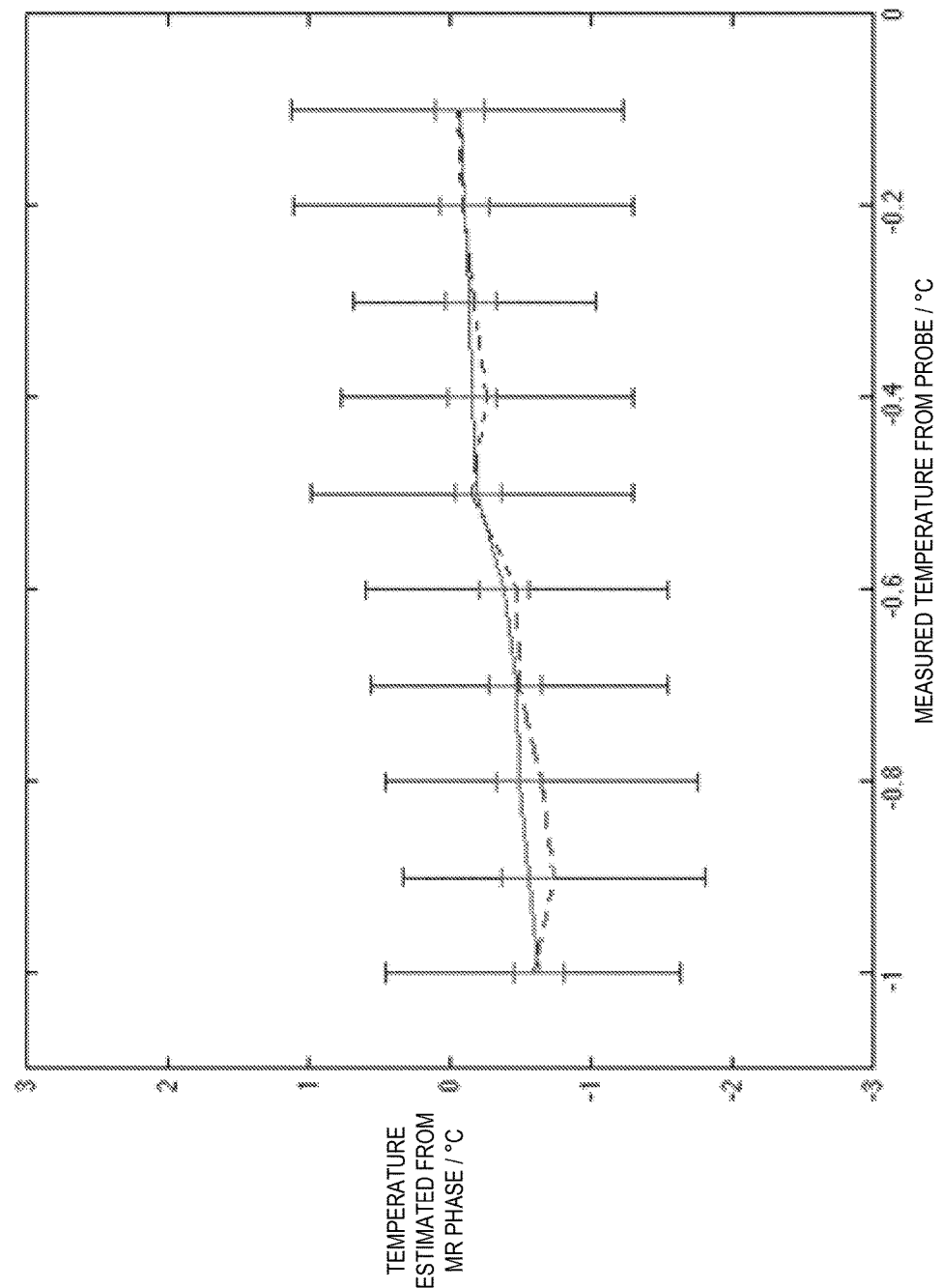
FIG. 35 shows representative MR thermometry measurements of ice water using (a) traditional MR phase reconstruction with ML-MAGPI-optimized pulses and (b) a ML-MAGPI method.
Figure 36:
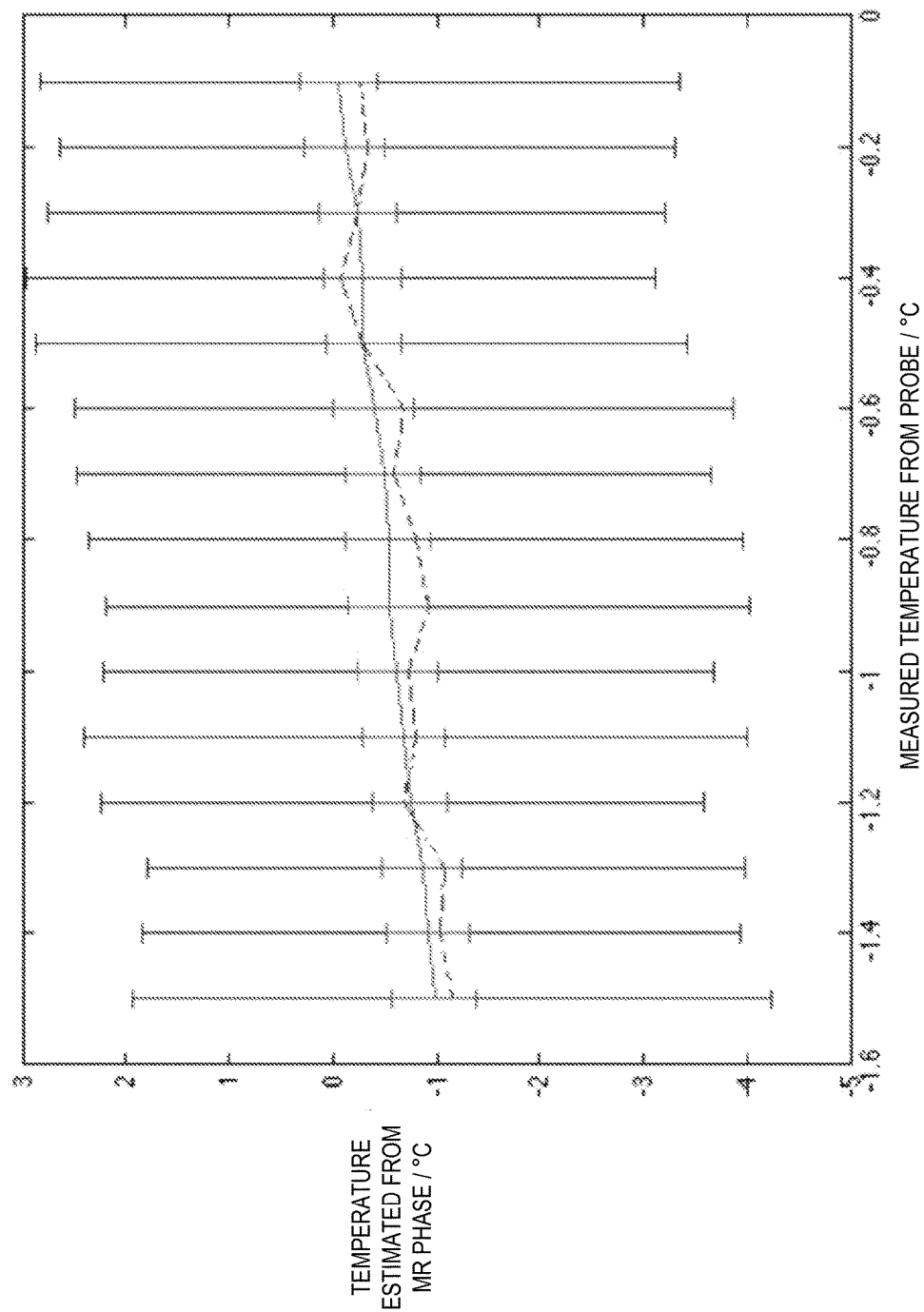
FIG. 36 shows representative MR thermometry measurements of agar gel using (a) the traditional MR phase reconstruction method of FIG. 34 and (b) a ML-MAGPI method.

MR thermometry temperature estimates presented in FIGS. 34-36 are examples of a reconstructed tissue property 354 (FIG. 3) and the tissue property of step 464 (FIG. 4), and may be deduced from a reconstructed MR phase using tissue property module 352. These temperature estimates are corrected for frequency drift caused by imperfections of the MRI scanner magnet. The temperature estimates predicted by the MAGI method disclosed herein employ ML estimators of Eqs. (17) and (18), and result from step 450 of method 400.

Measurement acquisition parameters associated with thermometry data of FIGS. 34-36 are as follows: FOV: 160×160 mm; resolution (x, y, z): 0.7×0.7×2.0 mm (voxel size), TR=50 ms, acquisition time: 10 seconds, TE for traditional method: 30 ms; TEs for ML-MAGPI: {6.71, 17.52, 23.23, 28.62, 35.51, 42.26} ms.

FIG. 34 shows representative MR thermometry measurements of hot water cooling in a beaker using (a) a traditional MR phase reconstruction method (dashed line, larger error bars) and (b) a ML-MAGPI method (solid line, smaller error bars). The abscissa is temperature (° C.) measured by a temperature probe. The error bars for each method represent ranges of temperature measurements at different voxels within the beaker of ice water. The average standard deviation of traditional measurements ($\bar{\sigma}$=1.75° C.) exceed those of the ML-MAGPI measurements ($\bar{\sigma}$=0.19° C.) by a more than a factor of nine.

FIG. 35 shows representative MR thermometry measurements of hot water cooling in a beaker using (a) the traditional MR phase reconstruction method of FIG. 34 (dashed line, larger error bars) and (b) a ML-MAGPI method (solid line, smaller error bars). In this case, both sets of MR thermometry measurements used the same pulse sequence: a sequence optimized by Eq. (19) to reduce measurement phase error, as in step 410 of method 400. The abscissa is temperature (° C.) measured by a temperature probe. The error bars for each method represent ranges of temperature measurements at different voxels within the beaker of ice water. The average standard deviation of traditional measurements ($\bar{\sigma}$=1.07° C.) exceed those of the ML-MAGPI measurements ($\bar{\sigma}$=0.19° C.) by a factor of 5.6. The decreased standard deviation traditional measurements ($\bar{\sigma}$=1.75° C. in FIG. 34, $\bar{\sigma}$=1.07° C. in FIG. 35) demonstrates that both pulse sequence optimization (method 400, step 410) and phase reconstruction (method 400, step 430) contribute to more precise MR thermometry measurements (method 400, step 464).

FIG. 36 shows representative MR thermometry measurements of an agar gel cooling in a beaker using (a) the traditional MR phase reconstruction method of FIG. 34 (dashed line, larger error bars) and (b) a ML-MAGPI method (solid line, smaller error bars) as discussed in reference to FIGS. 34 and 35. The abscissa is temperature (° C.) measured by a temperature probe. The error bars for each method represent ranges of temperature measurements at different voxels within the beaker of agar gel. The average standard deviation of traditional measurements ($\bar{\sigma}$=3.045° C.) exceed those of the ML-MAGPI measurements ($\bar{\sigma}$=0.38° C.) by a factor of eight.

Combinations of Features

Features described above as well as those claimed below may be combined in various ways without departing from the scope hereof. The following examples illustrate some possible, non-limiting combinations:

(A1) A method for magnetic resonance (MR) phase imaging of a subject may include steps of (i) for each channel of a multi-channel MRI scanner, acquiring MR measurements at a plurality of voxels of the subject using a pulse sequence that reduces MR measurement phase error; and (ii) for each voxel, determining reconstructed MR phase from the MR measurements of each channel to form an MR phase image of the subject.

(A2) In the method denoted as (A1) the pulse sequence may include parameters that are at least partially optimized with a phase-error predictor.

(A3) In the method denoted as (A2), the parameters may include at least one of (a) pulse sequence echo times, (b) velocity-encoding gradients, and (c) motion-encoding gradients.

(A4) In any of the methods denoted as (A1) through (A3), the step of determining reconstructed MR phase may be performed for each of the voxels independently.

(A5) Any of the methods denoted as (A1) through (A4), may further include determining, at each voxel, a tissue property based upon the reconstructed MR phase at the voxel.

(A6) In any of the methods denoted as (A5), the tissue property may be at least one of tissue magnetic susceptibility, blood flow in tissue, cerebrospinal fluid in tissue, tissue elasticity, tissue temperature, tissue conductivity, and tissue oxygenation.

(A7) Any of the methods denoted as (A1) through (A6) may further include, prior to the step of acquiring, at least partially optimizing the parameters using a phase-error predictor.

(A8) In any of the methods denoted as (A1) through (A7), the step of determining reconstructed MR phase may include applying, to the MR measurements, a phase-error predictor.

(A9) Any of the methods denoted as (A1) through (A8) may further include, for each channel, steps of (i) removing the reconstructed MR phase from the MR measurements to form a plurality of remainder phase images, and (ii) extracting a channel-dependent phase offset from the remainder phase images by utilizing channel-dependent phase offset properties that are independent of phase noise.

(A10) Any of the methods denoted as (A1) through (A9) may further include: (i) in the step of determining the reconstructed MR phase, determining the reconstructed MR phase from phase buildup between echoes of the pulse sequence, (ii) for a plurality of combinations of channels and echoes, determining a respective plurality of phase-offset-corrected MR phases from the MR measurements and respective channel-dependent phase offsets, and (iii) determining a refined reconstructed MR phase from the plurality of phase-offset-corrected MR phases.

(A11) In any of the methods denoted as (A10), the step of determining the refined reconstructed MR phase may include applying, to the plurality of phase-offset-corrected MR phases a phase-error predictor.

(A12) In any of the methods denoted as (A11) the parameters may include echoes of a pulse sequence, each echo being either an odd echo or an even echo based on its temporal position in the pulse sequence, and the step of determining the reconstructed MR phase may include determining the reconstructed MR phase from (i) phase buildup between odd echoes, (ii) phase buildup between even echoes, or (iii) phase buildup between odd echoes and phase buildup between even echoes.

(B1) An MRI system for forming an MR phase image of a subject may include a plurality of receiver channels for acquiring MR measurements, at least one magnet for generating a magnetic field at the subject, at least one transmitter for producing a radio frequency (RF) signal that excites nuclear magnetic resonances within a plurality of voxels of the subject; a processor, a non-volatile memory, and a pulse programmer for determining the RF signal according to the pulse sequence parameters. The non-volatile memory may include pulse sequence parameters that reduce MR measurement phase error, and machine-readable instructions that, when executed by the processor, (i) for each of the receiver channels, acquire the MR measurements at the voxels according to the pulse sequence parameters, and (ii) for each of the voxels, determine a reconstructed MR phase from the MR measurements of each of the receiver channels to form the MR phase image.

(B2) In the MRI system denoted as (B1), the pulse sequence parameters may include selected pulse sequence parameters that are at least partially optimized with a phase-error predictor.

(B3) In either of the MRI system denoted as (B1) and (B2), the selected pulse sequence parameters may include at least one of (a) pulse sequence echo times, (b) velocity-encoded gradients, and (c) motion gradients.

(B4) In any of the MRI system denoted as (B1) through (B3) the instructions may include instructions that, when executed by the processor, determine the reconstructed MR phase for each of the voxels independently.

(B5) In any of the MRI system denoted as (B1) through (B4) the instructions may further include instructions that when executed by the processor, determine, for each voxel, a tissue property of the voxel based upon the reconstructed MR phase at the voxel.

(B6) In any of the MRI system denoted as (B5), the tissue property being at least one of tissue magnetic susceptibility, blood flow in tissue, cerebrospinal fluid in tissue, tissue elasticity, and tissue temperature.

(B7) In any of the MRI system denoted as (B1) through (B6), the instructions may further include instructions that, when executed by the processor, determine the reconstructed MR phase by executing a phase-error predictor.

(B8) In any of the MRI system denoted as (B1) through (B7), the instructions may further include instructions that, when executed by the processor: (i) for each channel, remove the reconstructed MR phase from the MR measurements to form a plurality of remainder phase images; and (ii) for each channel, extract a channel-dependent phase offset from the remainder phase images by utilizing channel-dependent phase offset properties that are independent of phase noise.

(B9) In any of the MRI system denoted as (B8), the instructions may further include instructions that when executed by the processor: (i) reconstruct the reconstructed MR phase from phase buildup between echoes of a pulse sequence at least partly characterized by the pulse sequence parameters; (ii) for a plurality of combinations of channels and echoes, determine a respective plurality of phase-offset-corrected MR phases from the MR measurements and respective channel-dependent phase offset; and (iii) determine a refined reconstructed MR phase from the plurality of phase-offset-corrected MR phases.

(B10) In any of the MRI system denoted as (B9), the pulse sequence parameters may include echoes of a pulse sequence, each echo being either an odd echo or an even echo based on its temporal position in the sequence. The instructions may further include instructions that when executed by the processor, determine the reconstructed MR phase from (i) phase buildup between odd echoes, (ii) phase buildup between even echoes, or (iii) phase buildup between odd echoes and phase buildup between even echoes.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

REFERENCES

[1] Schweser F, Deistung A, Lehr B W, Reichenbach J R. Quantitative imaging of intrinsic magnetic tissue properties using MRI signal phase: An approach to in vivo brain iron metabolism? *NeuroImage.* 2011 February; 54(4): 2789-2807.

[2] Schweser F, Sommer K, Deistung A, Reichenbach J R. Quantitative susceptibility mapping for investigating subtle susceptibility variations in the human brain. *NeuroImage.* 2012 June 62(3):2083-100.

[3] Haacke E M, Reichenbach J R. *Susceptibility weighted imaging in MRI: basic concepts and clinical applications.* Wiley-Blackwell; 2011.

[4] Rieke V, Butts Pauly K. M R thermometry. *Journal of Magnetic Resonance Imaging.* 2008; 27(2):376-390.

[5] Lotz J, Meier C, Leppert A, Galanski M. Cardiovascular flow measurement with Phase-Contrast MR imaging: Basic facts and implementation. *Radiographics.* 2002; 22(3):651-671.

[6] Mariappan Y K, Rossman P J, Glaser K J, Manduca A, Ehman R L. Magnetic resonance elastography with a phased-array acoustic driver system. *Magnetic Resonance in Medicine.* 2009; 61(3):678-85.

[7] Dagher J, Reese T, Bilgin A. Highresolution, large dynamic range field map estimation. *Magnetic Resonance in Medicine.* 2014 January; 71(1):105-17.

[8] Funai A, Fessler J, Yeo D, Noll D. Regularized field map estimation in MRI. *IEEE Transactions on Medical Imaging.* 2008; 27(10):1484-1494.

[9] Jezzard P, Balaban R. Correction for Geometric Distortion in Echo Planar Images from B0 Field Variations. *Magnetic Resonance in Medicine.* 1995 July; 34(1):65-73.

[10] Nguyen H, Sutton B, Morrison Jr R, Do M. Joint Estimation and Correction of Geometric Distortions for EPI functional MRI using Harmonic Retrieval. *IEEE Transactions on Medical Imaging.* 2009; 28(3):423-434.

[11] Chen N, Wyrwicz A. Correction for EPI distortions using multi-echo gradient-echo imaging. *Magnetic Resonance in Medicine.* 1999; 41(6):1206-1213.

[12] Robinson S, Schödl H, Trattnig S. A method for unwrapping highly wrapped multi-echo phase images at very high field: UMPIRE. *Magnetic Resonance in Medicine.* 2014 July; 72(1):80-92.

[13] Aksit P, Derbyshire J, Prince J. Three-point method for fast and robust field mapping for EPI geometric distortion correction. 4th IEEE International Symposium on Biomedical Imaging. 2007; p. 141-144.

[14] Feng W, Neelavalli J, Haacke E M. Catalytic multiecho phase unwrapping scheme (CAMPUS) in multiecho gradient echo imaging: Removing phase wraps on a voxel-by-voxel basis. *Magnetic Resonance in Medicine.* 2013; 70(1):117-26.

[15] Huber K M, Roland J, Schoepfer J, Biber S, Martius S. Using MR thermometry for SAR verification in local pTX applications. In: International Society for *Magnetic Resonance in Medicine.* vol. 21; 2013.

[16] Roemer P B, Edelstein W A, Hayes C E, Souza S P, Mueller O M. The NMR phased array. *Magnetic Resonance in Medicine.* 1990 November; 16(2):192-225.

[17] Walsh D O, Gmitro A F, Marcellin M W. Adaptive reconstruction of phased array MR imagery. *Magnetic Resonance in Medicine.* 2000 May; 43(5):682-690.

[18] Robinson S, Grabner G, Witoszynskyj S, Trattnig S. Combining phase images from multi-channel RF coils using 3D phase offset maps derived from a dual-echo scan. *Magnetic Resonance in Medicine.* 2011 January; 65(6):1638-1648.

[19] Parker D L, Payne A, Todd N, Hadley J R. Phase reconstruction from multiple coil data using a virtual reference coil. *Magnetic Resonance in Medicine.* 2014 August; 72(2):563-9.

[20] Lu K, Liu T. Optimal phase difference reconstruction: comparison of two methods. *Magnetic Resonance Imaging.* 2008; 26(1):142-145.

[21] Hammond K E, Lupo J M, Xu D, Metcalf M, Kelley D A C, Pelletier D, et al. Development of a robust method for generating 7.0 T multichannel phase images of the brain with application to normal volunteers and patients with neurological diseases. NeuroImage. 2008 February; 39(4):1682-1692.

[22] Haacke M, Brown R, Thompson M, Venkatesan R.,*Magnetic resonance imaging: physical principles and sequence design.* Wiley-Liss; 1999.

[23] Kay S. Fundamentals of Statistical Signal Processing: Estimation Theory. Prentice Hall; 1993.

[24] Barrett H H, Myers K J. Foundations of Image Science. Wiley-Interscience; 2003.

[25] Guerquin-Kern M, Lejeune L, Pruessmann K P, Unser M. Realistic Analytical Phantoms for Parallel Magnetic Resonance Imaging. *IEEE Transactions on Medical Imaging.* 2012 March; 31(3):626-636.

[26] Haacke E M, Xu Y, Cheng Y C, Reichenbach J R, *Magnetic Resonance Imaging* 2004; 52:612-618.

[27] Hagmann W, Habermann J. On the phase error distribution of an open loop phase estimator. IEEE International Conference on Communications. 1988; 2:1031-1037.

[28] McPhee K C, Denk C, Al Rekabi Z, Rauscher A. Bilateral filtering of magnetic resonance phase images. *Magnetic Resonance Imaging.* 2011 September; 29(7):1023-1029.

[29] Yu H, Shimakawa A, McKenzie C A, Lu W, Reeder S B, Hinks R S, Brittain J H: Phase and amplitude correction for multi-echo water-fat separation with bipolar acquisitions. *Journal of Magnetic Resonance Imaging;* 2010 May; 31(5):1264-71.

What is claimed is:

1. A method for magnetic resonance (MR) phase imaging of a subject, comprising:
   for each channel of a multi-channel MRI scanner, acquiring MR measurements at a plurality of voxels of the subject using a pulse sequence that reduces MR measurement phase error; and
   for each voxel, determining reconstructed MR phase from the MR measurements of each channel to form an MR phase image of the subject.

2. The method of claim 1, the pulse sequence including parameters that are at least partially optimized with a phase-error predictor.

3. The method of claim 2, the parameters including at least one of (a) pulse sequence echo times, (b) velocity-encoding gradients, and (c) motion-encoding gradients.

4. The method of claim 2, further comprising, prior to the step of acquiring, at least partially optimizing the parameters using a phase-error predictor.

5. The method of claim 1, the step of determining reconstructed MR phase being performed for each of the voxels independently.

6. The method of claim 1, further comprising determining, at each voxel, a tissue property based upon the reconstructed MR phase at the voxel.

7. The method of claim 6, the tissue property being at least one of tissue magnetic susceptibility, blood flow in tissue, cerebrospinal fluid in tissue, tissue elasticity, tissue temperature, tissue conductivity, and tissue oxygenation.

8. The method of claim 1, the step of determining reconstructed MR phase comprising: applying, to the MR measurements, a phase-error predictor.

9. The method of claim 1, further comprising for each channel:
   removing the reconstructed MR phase from the MR measurements to form a plurality of remainder phase images; and
   extracting a channel-dependent phase offset from the remainder phase images by utilizing channel-dependent phase offset properties that are independent of phase noise.

10. The method of claim 9, further comprising:
    in the step of determining the reconstructed MR phase, determining the reconstructed MR phase from phase buildup between echoes of the pulse sequence;
    for a plurality of combinations of channels and echoes, determining a respective plurality of phase-offset-corrected MR phases from the MR measurements and respective channel-dependent phase offsets; and
    determining a refined reconstructed MR phase from the plurality of phase-offset-corrected MR phases.

11. The method of claim 10, the step of determining the refined reconstructed MR phase comprising:
    applying, to the plurality of phase-offset-corrected MR phases a phase-error predictor.

12. The method of claim 10, the parameters including echoes of a pulse sequence, each echo being either an odd echo or an even echo based on its temporal position in the pulse sequence, the step of determining the reconstructed MR phase comprising:
    determining the reconstructed MR phase from (i) phase buildup between odd echoes, (ii) phase buildup between even echoes, or (iii) phase buildup between odd echoes and phase buildup between even echoes.

13. A magnetic resonance imaging (MRI) system for forming an MR phase image of a subject, comprising:
    a plurality of receiver channels for acquiring MR measurements;
    at least one magnet for generating a magnetic field at the subject;
    at least one transmitter for producing a radio frequency (RF) signal that excites nuclear magnetic resonances within a plurality of voxels of the subject;
    a processor;
    a non-volatile memory including:
      pulse sequence parameters that reduce MR measurement phase error, and
      non-transitory machine-readable instructions that, when executed by the processor, (i) for each of the receiver channels, acquire the MR measurements at the voxels according to the pulse sequence parameters, and (ii) for each of the voxels, determine a reconstructed MR phase from the MR measurements of each of the receiver channels to form the MR phase image; and
    a pulse programmer for determining the RF signal according to the pulse sequence parameters.

14. The MRI system of claim 13, the pulse sequence parameters including selected pulse sequence parameters that are at least partially optimized with a phase-error predictor.

15. The MRI system of claim 13, the selected pulse sequence parameters including at least one of (a) pulse sequence echo times, (b) velocity-encoded gradients, and (c) motion gradients.

16. The MRI system of claim 13, the instructions comprising instructions that, when executed by the processor, determine the reconstructed MR phase for each of the voxels independently.

17. The MRI system of claim 13, the instructions further comprising instructions that when executed by the processor, determine, for each voxel, a tissue property of the voxel based upon the reconstructed MR phase at the voxel.

18. The MRI system of claim 17, the tissue property being at least one of tissue magnetic susceptibility, blood flow in tissue, cerebrospinal fluid in tissue, tissue elasticity, and tissue temperature.

19. The MRI system of claim 13, the instructions further comprising instructions that, when executed by the processor, determine the reconstructed MR phase by executing a phase-error predictor.

20. The MRI system of claim 13, the instructions further comprising instructions that, when executed by the processor: (i) for each channel, remove the reconstructed MR phase from the MR measurements to form a plurality of remainder phase images; and (ii) for each channel, extract a channel-dependent phase offset from the remainder phase images by utilizing channel-dependent phase offset properties that are independent of phase noise.

21. The MRI system of claim 20, the instructions further comprising instructions that when executed by the processor: (i) reconstruct the reconstructed MR phase from phase buildup between echoes of a pulse sequence at least partly characterized by the pulse sequence parameters; (ii) for a plurality of combinations of channels and echoes, determine a respective plurality of phase-offset-corrected MR phases from the MR measurements and respective channel-dependent phase offset; and (iii) determine a refined reconstructed MR phase from the plurality of phase-offset-corrected MR phases.

22. The MRI system of claim 21, the pulse sequence parameters including echoes of a pulse sequence, each echo being either an odd echo or an even echo based on its temporal position in the sequence, the instructions further comprising instructions that when executed by the processor, determine the reconstructed MR phase from (i) phase buildup between odd echoes, (ii) phase buildup between even echoes, or (iii) phase buildup between odd echoes and phase buildup between even echoes.

* * * * *

UNITED STATES PATENT AND TRADEMARK OFFICE
CERTIFICATE OF CORRECTION

PATENT NO. : 10,145,925 B2
APPLICATION NO. : 15/309337
DATED : December 4, 2018
INVENTOR(S) : Joseph Dagher It is certified that error appears in the above-identified patent and that said Letters Patent is hereby corrected as shown below:

In the Specification

Column 10, Line 56, "(PEPS)" should be --(PEP5)--.

Column 20, Eq. (19), "$[TE_1^{opt}, TE_2^{opt}, \ldots, TE_K^{opt}] = \text{argmin}_{[TE_1, TE_2, \ldots, TE_K]} \mathbb{E}[\mathcal{D}(\mathcal{L}_{///}(\Delta B), \delta(\Delta B))]_{\Omega_k, r_k, \Delta B}$" should be --$[TE_1^{opt}, TE_2^{opt}, \ldots, TE_K^{opt}] = \text{argmin}_{[TE_1, TE_2, \ldots, TE_K]} \mathbb{E}[\mathcal{D}(\mathcal{L}_{///}(\Delta B), \delta(\Delta B))]_{\Omega_k, r_k, \Delta B}$--.

Signed and Sealed this
Fifteenth Day of January, 2019

Andrei Iancu
*Director of the United States Patent and Trademark Office*